United States Patent
Susnow et al.

(10) Patent No.: US 10,021,407 B2
(45) Date of Patent: Jul. 10, 2018

(54) FIELD PROGRAMMABLE OBJECT ARRAY HAVING IMAGE PROCESSING CIRCUITRY

(71) Applicant: NYTELL SOFTWARE LLC, Wilmington, DE (US)

(72) Inventors: Dean Stuart Susnow, Portland, OR (US); Richard D. Reohr, Jr., Hillsboro, OR (US)

(73) Assignee: NYTELL SOFTWARE LLC, Wilmington, DE (US)

( * ) Notice: Subject to any disclaimer, the term of this patent is extended or adjusted under 35 U.S.C. 154(b) by 0 days.

(21) Appl. No.: 15/481,566

(22) Filed: Apr. 7, 2017

(65) Prior Publication Data

US 2017/0214929 A1    Jul. 27, 2017

Related U.S. Application Data

(63) Continuation of application No. 15/233,919, filed on Aug. 10, 2016, now Pat. No. 9,648,345, which is a continuation of application No. 12/492,033, filed on Jun. 25, 2009, now Pat. No. 9,419,620.

(60) Provisional application No. 61/082,779, filed on Jul. 22, 2008.

(51) Int. Cl.
| H04N 19/523 | (2014.01) |
| H04N 19/433 | (2014.01) |
| H04N 19/182 | (2014.01) |
| H04N 19/423 | (2014.01) |

(52) U.S. Cl.
CPC ......... *H04N 19/433* (2014.11); *H04N 19/182* (2014.11); *H04N 19/423* (2014.11); *H04N 19/523* (2014.11)

(58) Field of Classification Search
None
See application file for complete search history.

(56) References Cited

U.S. PATENT DOCUMENTS

| 6,266,373 B1 | 1/2001 | Bakhmutsky et al. |
| 6,239,810 B1 | 5/2001 | Van Hook et al. |
| 2004/0013197 A1 | 1/2004 | Park |
| 2004/0120401 A1 | 6/2004 | Linzer et al. |
| 2005/0265450 A1 | 12/2005 | Raveendran et al. |
| 2006/0018552 A1 | 1/2006 | Malayath et al. |

(Continued)

OTHER PUBLICATIONS

International Search Report for PCT/US2009/049626, dated Jan. 21, 2010, 3 pages.

(Continued)

*Primary Examiner* — William C Vaughn, Jr.
*Assistant Examiner* — Michael J Hess
(74) *Attorney, Agent, or Firm* — Amin, Turocy & Watson, LLP

(57) ABSTRACT

A field programmable object array integrated circuit has video data compression capability. The integrated circuit comprises an array of programmable objects and a video compression co-processor communicatively coupled to the array of objects. The video compression co-processor comprises a set of search engines and a subpixel engine. The subpixel engine can interpolate subpixels from integer pixels and shift the integer pixels by a predetermined number of subpixels. The search engines can perform a plurality of sum of absolute differences (SAD) computations between search window pixels and macroblock pixels to locate the best SAD value using either integer pixels and/or the interpolated subpixels.

20 Claims, 46 Drawing Sheets

(56) References Cited

U.S. PATENT DOCUMENTS

| | | |
|---|---|---|
| 2006/0259878 A1 | 11/2006 | Killian et al. |
| 2007/0038843 A1 | 2/2007 | Trivedi et al. |
| 2007/0223581 A1 | 9/2007 | Iguchi |
| 2007/0247189 A1 | 10/2007 | Phil et al. |

OTHER PUBLICATIONS

Riley, "How to use Field-Programmable Object Arrays (FPOAs) in Image Processing", EE Times Jun. 27, 2007, http://www.eetimes.com/General/PrintView/4015116. Last accessed May 3, 2012.
Non- Final Office Action for U.S. Appl. No. 12/492,033, dated May, 10, 2012, 39 pages.
Final Office Action for U.S. Appl. No. 12/492,033, dated Sep. 25, 2012, 45 pages.
Non- Final Office Action for U.S. Appl. No. 12/492,033, dated Nov. 5, 2013, 40 pages.
Final Office Action for U.S. Appl. No. 12/492,033, dated May 8, 2014, 54 pages.
Non-Final Office Action for U.S. Appl. No. 12/492,033, dated Mar. 3, 2015, 39 pages.
Final Office Action for U.S. Appl. No. 12/492,033, dated Jul. 30, 2015, 39 pages.
Notice of Allowance for U.S. Appl. No. 12/492,033, dated Apr. 7, 2016, 15 pages.
Notice of Allowance for U.S. Appl. No. 15/233,919, dated Jan. 9, 2017, 18 pages.
International Search Report for WO10011485, dated Jan. 21, 2010, 3 pages.

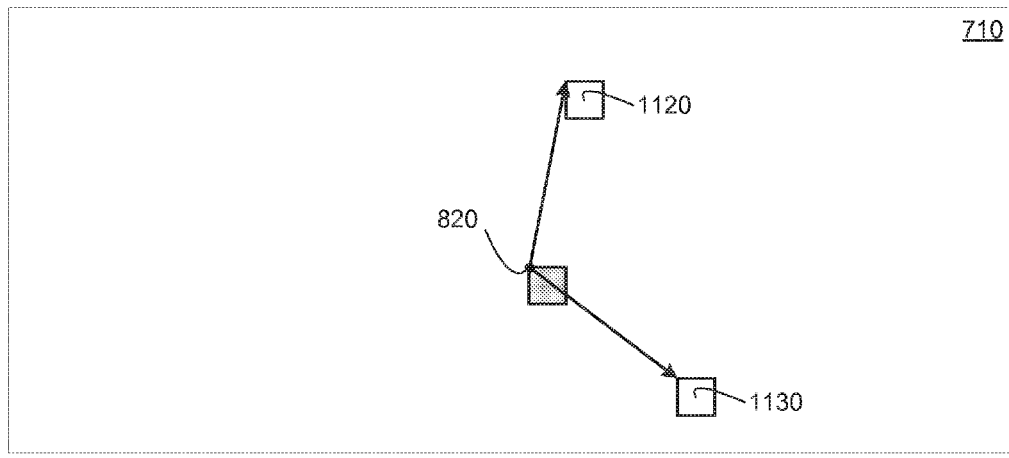
FIG. 11
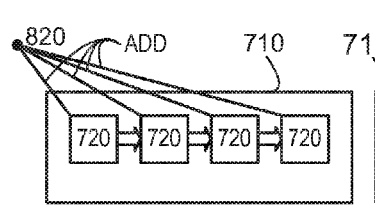 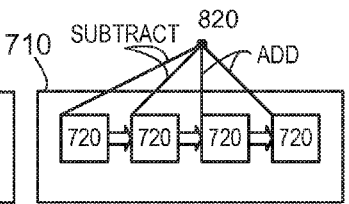 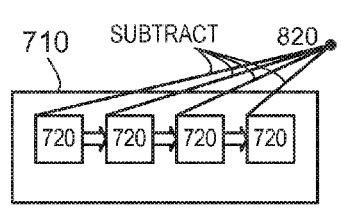
FIG. 12A     FIG. 12B     FIG. 12C
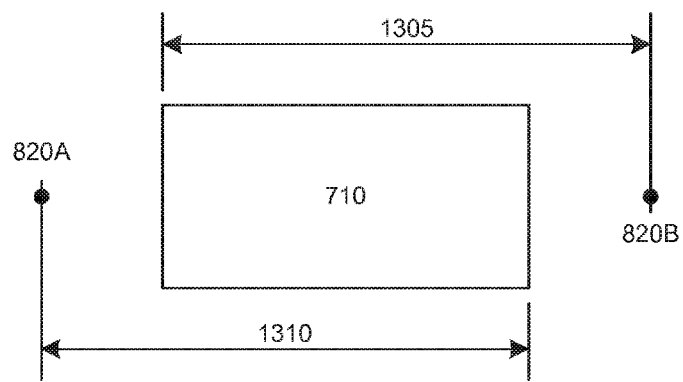
FIG. 13

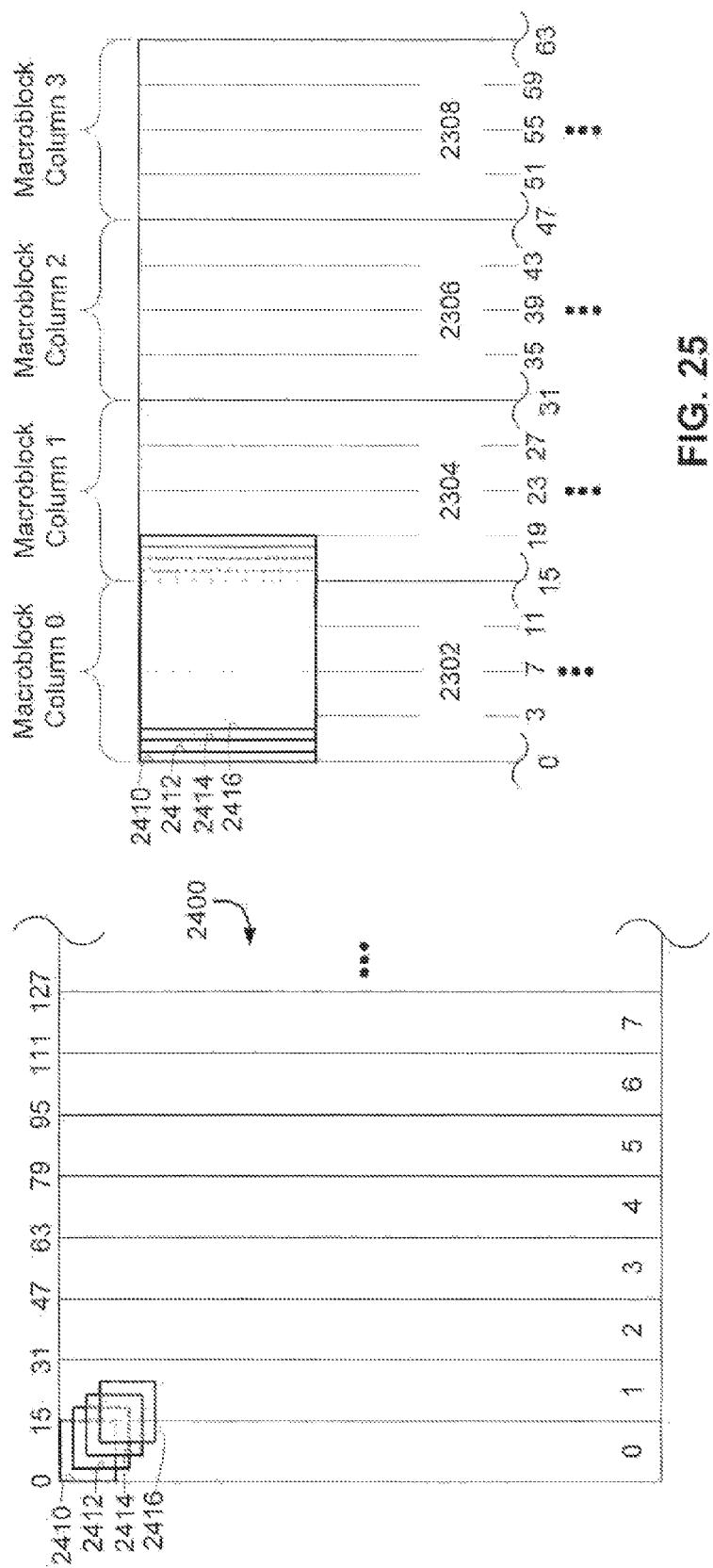

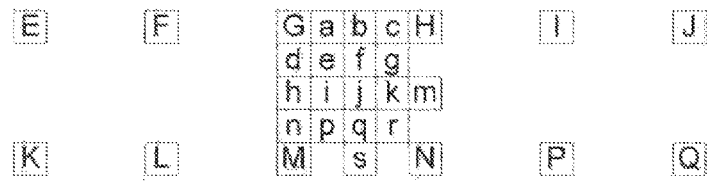
FIG. 39
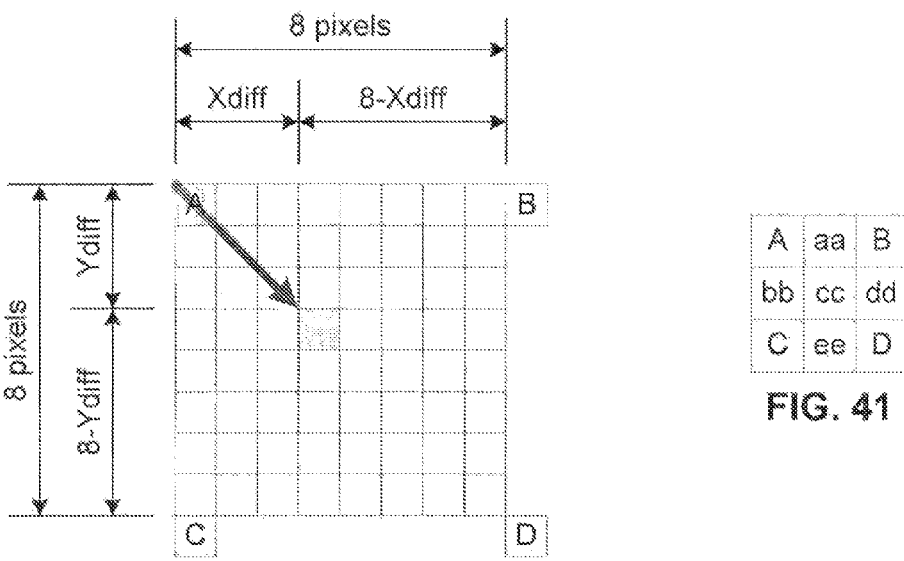
FIG. 40
FIG. 41

FIELD PROGRAMMABLE OBJECT ARRAY HAVING IMAGE PROCESSING CIRCUITRY

RELATED APPLICATIONS

This application is a continuation of, and claims priority to each of, U.S. patent application Ser. No. 15/233,919, filed on Aug. 10, 2016, and entitled "FIELD PROGRAMMABLE OBJECT ARRAY HAVING IMAGE PROCESSING CIRCUITRY," which is a continuation of U.S. patent application Ser. No. 12/492,033 (now U.S. Pat. No. 9,419,620), filed on Jun. 25, 2009, and entitled "FIELD PROGRAMMABLE OBJECT ARRAY HAVING IMAGE PROCESSING CIRCUITRY," each of which applications further claim the benefit of priority to U.S. Provisional Patent Application No. 61/082,779, filed on Jul. 22, 2008. The entireties of these patent applications are hereby incorporated by reference herein.

TECHNICAL FIELD

The field of the present disclosure relates generally to integrated circuit arrays of programmable elements and more particularly to such arrays having circuitry for video data compression.

BACKGROUND INFORMATION

Video coding standards, such as MPEG (Motion Picture Expert Group), including its variants MPEG-2 and MPEG-4, have been developed to facilitate the storage and the transmission of digital video data in compressed form. Demand for higher video quality will likely increase the amount of video data collected that ultimately needs to be stored and/or transmitted across a plethora of transmission channels, such as computer networks, satellite links, terrestrial wireless data links, television cable, and telephony lines (including DSL (digital subscriber line)). Thus, there is a demand for video data compression having a high compression rate with minimal data loss.

One such technique for video data compression is known as motion estimation. According to this technique, temporal redundancies in video data between neighboring video frames or fields are identified so that an encoder only needs to pass a motion vector to a decoder, instead of retransmitting redundant data. For example, a video camera may record a car moving relative to a stop sign as the video camera itself pans. Thus, not only is the car moving relative to the stop sign from one frame to the next, but the stop sign is also moving as a result of the panning. Motion estimation attempts to identify temporally redundant data by searching for a portion of the car or stop sign in another video frame (e.g., a previous video frame that may have already been sent to the decoder). The group of pixels being searched for (e.g., the portion of the car or stop sign in the frame currently being encoded) is known as a macroblock. The group of pixels being searched (e.g., a region of the previous video frame) is known as a search window. If the macroblock matches a group of pixels in the search window, a motion vector representing the direction and amount of motion from frame to frame is generated. For example, the motion vector may indicate that a portion of the stop sign moved up and to the left by a certain distance. By transmitting the motion vector instead of the group of pixels that resembled the macroblock, less storage space and bandwidth are needed.

However, searching for the temporally redundant data is computationally intensive, especially if the video data has a high definition resolution.

Field-programmable object arrays (FPOAs) have been developed to fill a gap between field-programmable gate arrays (FPGAs) and application-specific integrated circuits (ASICs). A typical FPOA comprises a number of programmable objects along with a programmable high-speed interconnection network. The objects in an FPOA, as compared to the relatively simple gates of an FPGA, can be more complex (sometimes considerably more complex), while the number of objects in a typical FPOA is usually less (sometimes much less) than the number of gates in an FPGA. Examples of object types include arithmetic logic units (ALUs), multiply/accumulate units (MACs), and memory banks such as register files (RFs). An FPOA's objects, which are typically designed in advance to have timing closure at high clock speeds, can be combined in intuitive ways to provide powerful processing capability, which is especially well suited to meet the performance and flexibility requirements of video data compression. However, video data compression techniques may still be costly to implement and have less than ideal operating performance even when implemented using the powerful processing capability of FPOAs.

SUMMARY OF THE DISCLOSURE

The unique architecture and features of FPOAs present challenges and opportunities for performing video data compression.

According to one embodiment, an integrated circuit comprises an array of programmable objects comprising functional core circuitry and communication circuitry and a video compression co-processor communicatively coupled to the array of programmable objects.

According to another embodiment, a reprogrammable integrated circuit has a core region surrounded by a periphery region and comprises an array of programmable objects located in the core region, periphery memory located in the periphery region, a data transfer engine located in the periphery region, and a video compression co-processor located in the periphery region. Each object comprises functional core circuitry and communication circuitry. The video compression co-processor is configured to receive search window pixel data from the periphery memory either via the communication circuitry within a set of the programmable objects or via the data transfer engine.

According to yet another embodiment, a video compression co-processor is integrated within a programmable integrated circuit comprising a configurable array of elements. The video compression co-processor comprises an interface to the configurable array of elements, at least one search engine, and a subpixel engine. Each search engine comprises a set of steering multiplexers, a set of compressor trees for calculating a sum of absolute differences between corresponding pairs of baseline pixels and search window pixels, and at least two pixel buses configured to transfer search window pixels to the set of compressor trees via the set of steering multiplexers. The subpixel engine is configured to interpolate a set of subpixels from a set of integer pixels, and is further configured to shift the set of integer pixels by a predetermined number of subpixels. Each search engine is configured to select search window pixels from either integer pixels or interpolated subpixels and to select baseline pixels from either integer pixels or interpolated subpixels.

According to still another embodiment, a sum-of-absolute-differences calculator is used with a motion estimation engine to support temporal video compression. The sum-of-absolute-differences calculator comprises a set of compressor trees for calculating a sum of absolute differences between corresponding pairs of baseline pixel data and reference pixel data, a set of multiplexers configured to deliver to the set of compressor trees the reference pixel data selected from a first set of reference pixel data and a second set of reference pixel data, and a plurality of pixel data buses configured to deliver the first set of reference pixel data and the second set of reference pixel data to the set of multiplexers.

As one skilled in the art will appreciate in view of the teachings herein, certain embodiments may be capable of achieving certain advantages, including by way of example and not limitation one or more of the following: (1) the ability to offload video data compression to dedicated circuitry, thereby preserving FPOA capability for other uses; (2) tight coupling between dedicated video data compression circuitry with an FPOA on the same chip; (3) the ability to use an FPOA to flexibly configure, reconfigure, provide video data to, receive results from, and otherwise utilize dedicated video compression circuitry; (4) providing low cost and high performance video data compression; (5) providing video data compression with reduced design complexity; (6) providing a sliced architecture that allows any number of slices to be used in parallel to achieve a desired performance; (7) providing the ability to weight search results based on distance; (8) providing the ability to concatenate search results to create a larger search window; (9) providing dual pixel buses to supply a continuous stream of search window data; (10) providing a search engine that processes data with high efficiency; (11) providing the ability to supply search window data using more than one data path; (12) providing the ability to search a current set of pixel data as pixel data for a subsequent search is supplied: (13) providing support for many different pixel formats; (14) providing the ability to pace the rate at which search results or shift results are delivered; (15) providing the ability to change on the fly the type of search or interpolation being performed at each operation; (16) providing the ability to detect data starvation and stall a search until pixel data is available; and (17) providing a simplified application interface. These and other advantages of various embodiments will be apparent upon reading the following.

BRIEF DESCRIPTION OF THE DRAWINGS

FIG. 11 is a diagram illustrating one example of calculating a Manhattan distance that may be used to compensate for small comparison values having large motion vectors.

FIGS. 12A, 12B, and 12C are diagrams illustrating examples of maintaining estimated motion vector distances as the macroblock moves through the search window.

FIG. 13 is a diagram illustrating one example of a maximum horizontal distance between an estimated motion vector and the farthest search window pixel.

FIG. 24 is a diagram illustrating a search window divided into a plurality of macroblock columns, according to one embodiment.

FIG. 25 is a diagram illustrating how a portion of the search window of FIG. 24 may be stored in an example memory buffer.

FIG. 39 is a diagram illustrating one example of interpolating half-sampled and quarter-sampled subpixels from integer pixels.

FIG. 40 is a diagram illustrating one example of interpolating one-eighth-sampled subpixels from integer pixels.

FIG. 41 is a diagram illustrating another example of interpolating half-sampled subpixels from integer pixels.

DETAILED DESCRIPTION

With reference to the above-listed drawings, this section describes particular embodiments and their detailed construction and operation. The embodiments described herein are set forth by way of illustration only. In light of the teachings herein, those skilled in the art will recognize that there may be equivalents to what is expressly or inherently taught herein. For example, variations can be made to the embodiments described herein and other embodiments are possible. It is not always practical to exhaustively catalog all possible embodiments and all possible variations of the described embodiments.

For the sake of clarity and conciseness, certain aspects of components or steps of certain embodiments are presented without undue detail where such detail would be apparent to those skilled in the art in light of the teachings herein and/or where such detail would obfuscate an understanding of more pertinent aspects of the embodiments.

Architectural Overview

Before describing detailed examples of video data compression using FPOAs, a representative FPOA architecture and associated concepts will first be described.

Figure 1:
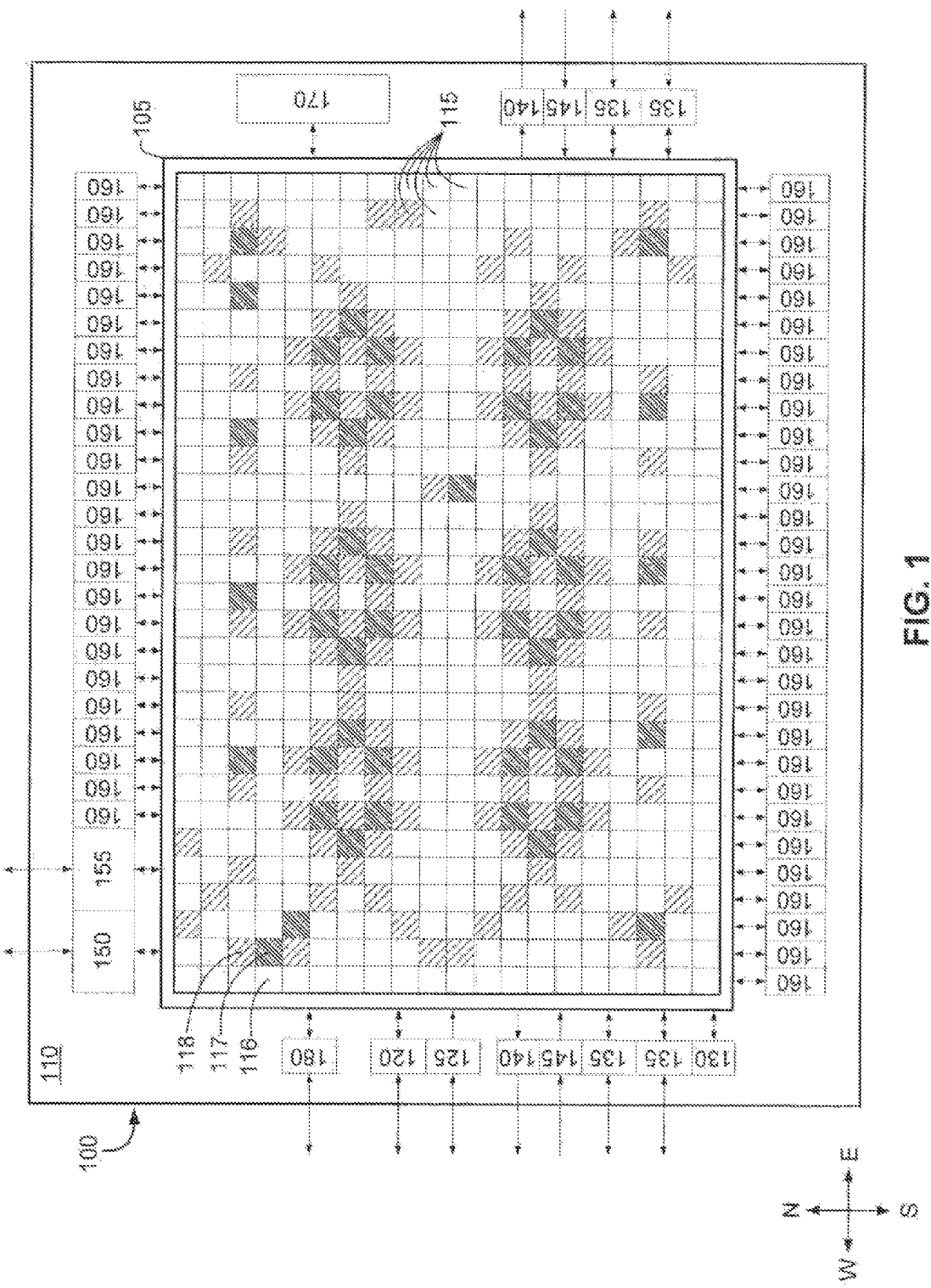
FIG. 1 is an simplified block diagram of one example of an FPOA.

FIG. 1 illustrates one example FPOA 100, which includes a plurality of objects divided between two regions: a core or array region 105 and a non-core or periphery region 110. The core region 105 includes a plurality of distinct programmable objects 115 that perform most of the computations or other operational functionality within the FPOA 100. The core region 105 may be a substantial part of the FPOA 100 in terms of area and functionality, as compared to the periphery region 110. The core region 105 may be centrally located within the periphery region 110, as illustrated in FIG. 1, or located elsewhere according to any other feasible physical layout. The periphery region 110 can comprise I/O (input/output) interfaces, memory, control and/or set-up circuitry, and/or other support circuitry, including motion estimation circuitry.

Within the core 105, the objects 115 may generally be of any type, designed by the FPOA maker to have any feasible size, architecture, capabilities, and features. Some specific examples of object types include arithmetic logic units (ALUs) 116, multiply accumulators (MACs) 117, and memory banks such as register files (RFs) 118. In brief, a typical ALU 116 may perform logical and/or mathematical functions and may provide general purpose truth functions for control, a typical MAC 117 may perform multiplication operations and include an accumulator for results, and a typical RF 118 contains memory that can be utilized as, for example, RAM (random access memory), a FIFO (first-in first-out) structure, or as a sequential read object. For example, one version of an ALU 116 may have a 16-bit data word length, one version of a MAC 117 may operate on 16-bit multiplicands and have a 40-bit accumulator, and one version of a RF may have 0.16 KB (kilobytes) of memory organized as 64 20-bit words. For purposes of the motion estimation techniques described herein, the internal construction and operational capabilities of the objects 115 are arbitrary.

The size of an FPOA and the number of objects 115 is also arbitrary for purposes of the motion estimation techniques described herein (within realistic constraints for semiconductor manufacturing). The example FPOA 100, as illustrated in FIG. 1, includes six hundred objects 115 organized into a thirty-by-twenty array. A mix of four hundred twenty-five ALUs 116, forty-nine MACs 117, and one hundred twenty-six RFs 118 (as shown in FIG. 1) is suitable for video processing applications. However, other FPOAs may have more or less objects 115 (e.g., twenty-by-thirty, thirty-by-thirty, etc.), and may include a different mix of objects 115, including objects 115 other than ALUs, MACs, and RFs. For example, a mix of two hundred ninety-nine ALUs, two hundred fifty-two MACs, and one forty-nine RFs may be better suited for math intensive applications, such as Finite Input Response (FIR) filters and Fast Fourier Transform (FFT) operations.

The objects 115 can communicate with each other and/or the periphery region 110 using various methods. Two possible forms of communication mechanisms include (1) nearest neighbor communication and (2) party line communication. A nearest neighbor communication mechanism allows a core object 115 to communicate with one or more of its immediate neighbors. A party line communication mechanism allows an object 115 to communicate with other objects 115 at possibly greater distances and with objects in the periphery region 110. Examples of such communication mechanisms will be described in more detail with respect to FIGS. 2, 3, and 4.

An FPOA can include—typically in its periphery or non-core region—various interfaces used for initialization and control of the array and/or other parts of the device. For example, the FPOA 100 includes a Joint Test Action Group (JTAG) controller 120, which can provide access to a set of registers for controlling the FPOA 100, a PROM (programmable read-only memory) controller 125, which can oversee the FPOA 100's loading and initialization process, and a debug controller 130, which gives an application running on the FPOA 100 greater control of the overall operation of the FPOA 100.

An FPOA can also include—also typically in its periphery or non-core region—a number of interfaces for communicating with external devices. For example, the FPOA 100 includes four sets of general purpose input/output (GPIO) objects or interfaces 135 (located on the east and west side of the FPOA 100, as illustrated in FIG. 1), each of which can provide and/or interface to bidirectional I/O lines or pins, allowing data transfer between the FPOA 100 and external devices. As another example, four high speed interfaces can also be provided on the east and west side of the FPOA 100: two transmit (TX) interfaces 140 and two receive (RX) interfaces 145. The TX and RX interfaces 140 and 145 may operate according to a protocol, such as, for example, parallel tow-voltage differential signaling (LVDS). As yet another example, a peripheral component interconnect express (PCI-e) interface 150 can be provided to support point-to-point serial links. A greater or lesser number of I/O interfaces can be provided in different versions of FPOAs. In addition, other types of I/O interfaces may be provided, such as XAUI (10 Gigabit Ethernet Attachment Unit Interface).

An FPOA may also include memory and/or memory interfaces in its non-core region. By way of example, the FPOA 100 comprises XRAM (external RAM) interfaces 155 and IRAM (internal RAM) 160 in its periphery region 110. The XRAM interfaces 155 can provide access to external memory, which may be potentially large in capacity (e.g., 4 GB (gigabytes or approximately $10^9$ 8-bit bytes) of data may be read/written over a 64-bit or 72-bit interface via a DDR-2 SDRAM protocol). The IRAM 160 may be a bank of on-chip memory (e.g., single port 4K by 36-bit SRAM), which can be preloaded during initialization. While the FPOA 100 includes fifty-four IRAMs, additional or fewer IRAMs may be provided. In summary, the FPOA 100 has three groups of memory: (1) the RFs 118 (assuming such objects are included in the core 105); (2) the XRAM 155; and (3) the IRAM 160.

An FPOA can also include—also typically in its periphery or non-core region—any number of support circuits or specialized engines. By way of example, the FPOA 100 comprises a video compression co-processor 170 for performing motion estimation functions, such as performing SAD calculations, interpolating subpixels, and searching for similarities between frames (e.g., by comparing integer pixels and/or subpixels). Additional details of the video compression co-processor 170 will be discussed with reference to FIGS. 6 through 55. As another example, the FPOA 100 includes a DMA engine 180 for transferring data between the JTAG controller 120, the PROM controller 125, the PCI-e interface 150, the XRAM interface 155, the IRAMs 160, the video compression co-processor 170, and the array of objects 115. Additional details of the DMA engine 180 will be discussed with reference to FIG. 5.

Interconnect Framework

Figure 2:
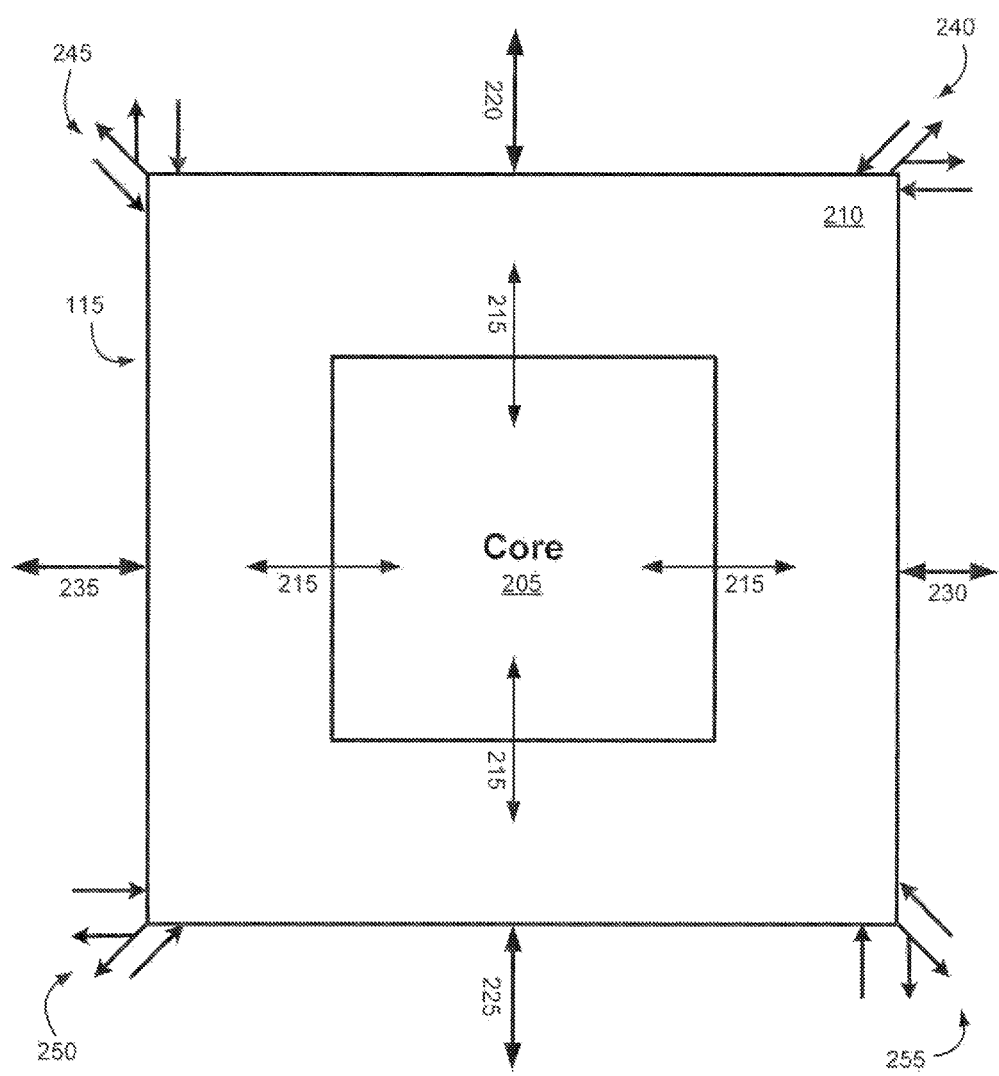
FIG. 2 is a block diagram of one example of an FPOA object.

As shown in FIG. 2, an object 115 can be abstracted into an internal functional object core 205 and a communications infrastructure 210. The object core 205 contains the internal functional circuitry specific to that type of object (e.g., ALU, MAC, RF, or other). The communication infrastructure 210 contains the inter-object communication circuitry (which can also enable communication with the non-core region of the FPOA), such as, for example, party line communication channels 220, 225, 230, and 235 and/or nearest neighbor communication channels 240, 245, 250, and 255—which will be described in more detail with respect to FIGS. 3 and 4. The core 205 and the communication infrastructure 210 can be communicatively coupled to one another via one or more interconnections 215. The communication infrastructure 210 may be the same or similar for diverse objects, with the possible exception of its interfaces to the interconnections 215, which typically are unique to the particular object core 205.

Figure 3:
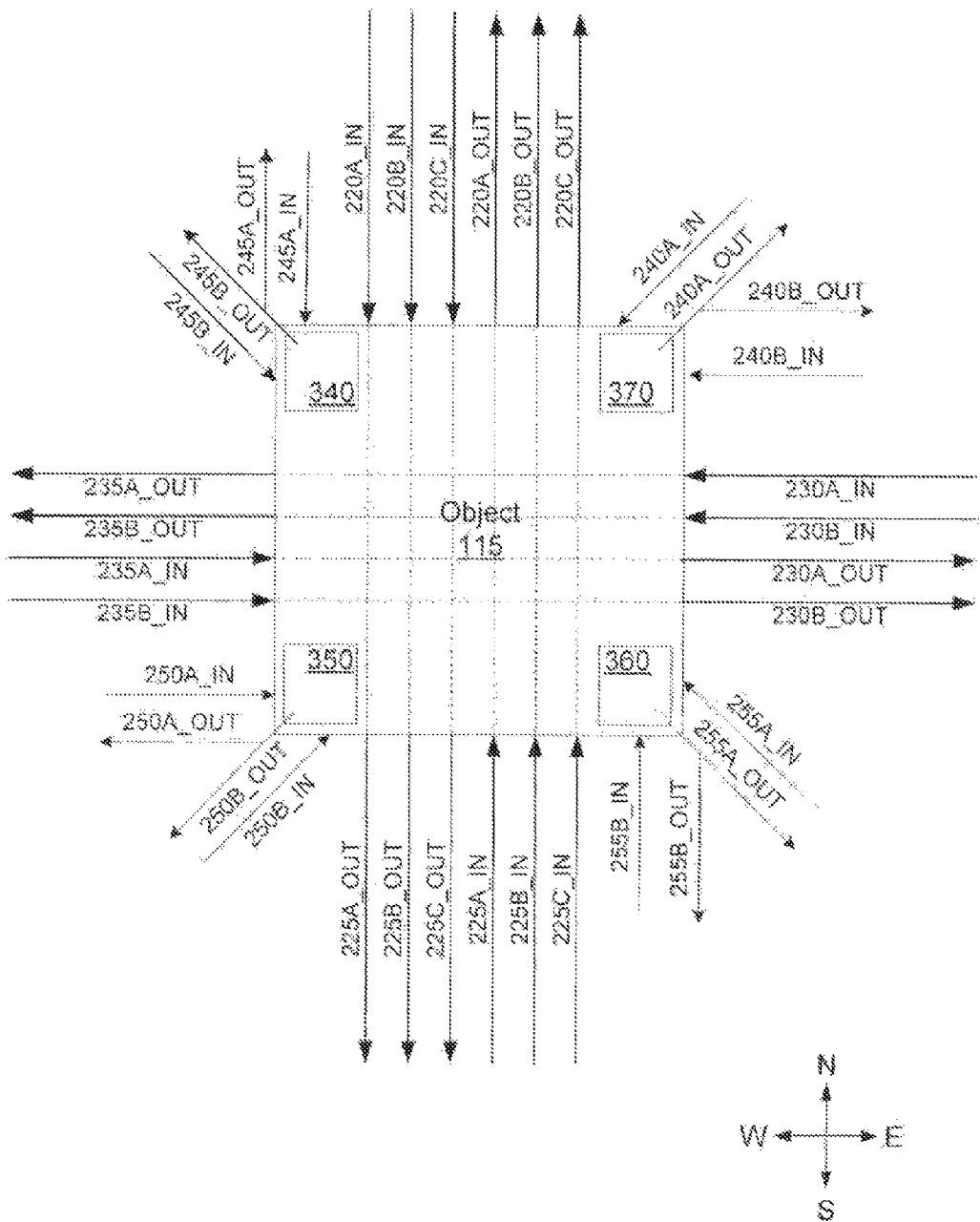
FIG. 3 is a block diagram illustrating examples of communication channels for an object in an FPOA.

FIG. 3 is a block diagram illustrating in greater detail the communication channels for one of the objects 115. As shown in FIG. 3, the object 115 includes a number (e.g., eight) of nearest neighbor communication channels 240A, 240B, 245A, 245B, 250A, 250B, 255A, and 255B. In addition, the object 115 includes a number (e.g., ten) of party line communication channels 220A_IN/225A_OUT, 220B_IN/225B_OUT, 220C_IN/225C_OUT, 225A_IN/220A_OUT, 225B_IN/220B_OUT, 225C_IN/220C_OUT, 230A_IN/235A_OUT, 230B_IN/235B_OUT, 235A_IN/230A_OUT, and 235B_IN/230B_OUT. Of course, an object may have fewer or additional communication channels of either type. The object 115 is able to communicate with any of its eight nearest neighbors (i.e., objects to the north, northeast, east, southeast, south, southwest, west, and northwest) via any of the eight nearest neighbor communication channels 240-255. The object 115 may also communicate with any of its eight nearest neighbors, any other object in the array, or any of the objects in the periphery region 110 using one or more of the party line communication channels 220-235. Both the nearest neighbor communication channels 240-255 and the party line communication channels 220-235 provide data using a bus. The bus may be, for example, 21 bits wide, having a 16-bit data bus, a 4-bit control bus, and a 1-bit valid indication. Of course, the nearest neighbor communication channels and the party line communication channels may provide data using additional or fewer bits.

The object 115 includes two party line communication channels heading east (235A_IN/230A_OUT and 235B_IN/230B_OUT), two party line communication channels heading west (230A_IN/235A_OUT and 230B_IN/235B_OUT), three party line communication channels heading north (225A_IN/220A_OUT, 225B_IN/220B_OUT, and 225C_IN/220C_OUT), and three party line communication channels heading south (220A_IN/225A_OUT, 220B_IN/225B_OUT, and 220C_IN/225C_OUT). In general, other directional allocations of a given number of party line communications are possible. Party line communications are typically constrained such that data can travel on a party line communication channels through only a certain number of objects per clock cycle (i.e., the data can move a fixed number hops per clock cycle). For example, the limit may be four hops in one clock cycle before the data needs to land in an Internal register of an object and be re-launched on the next clock cycle. If the clock operates at slower speed, the data may move further in one clock cycle. Of course, other embodiments may be designed to move data further than four hops at full speed.

The example object 115 also includes four nearest neighbor registers 340, 350, 360, and 370, each of which may provide data to two adjacent objects via the appropriate pair of nearest neighbor communication channels 240-255. For example, an object directly to the east of object 115 may pull data from register 370 via the nearest neighbor communication channel 240B_OUT. Likewise, an object to the northeast of object 115 may pull data from register 370 via the nearest neighbor communication channel 240A_OUT. In a similar vein, the object 115 may pull data from the nearest neighbor registers of each of its eight adjacent neighbors. For example, the object 115 may pull data from the southwest nearest neighbor register of an object that is northeast of the object 115 via the nearest neighbor communication channel 240A_IN. Likewise, the object 115 may pull data from the southwest (or northwest) nearest neighbor register of an object that is east of the object 115 via the nearest neighbor communication channel 240B_IN.

Figure 4:
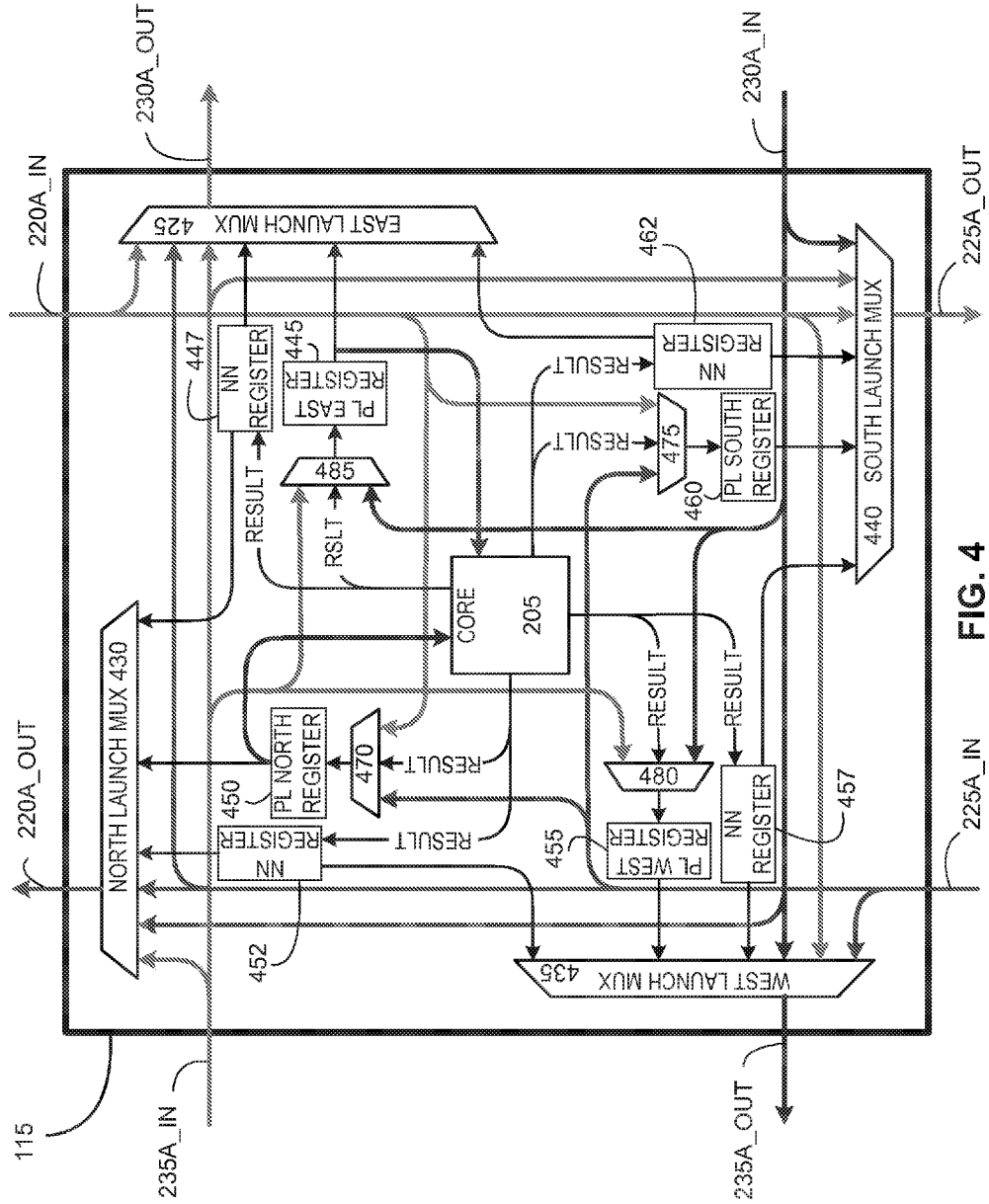
FIG. 4 is a high-level logic diagram illustrating registers and multiplexers used to facilitate party line communication, according to one example of an FPOA object.

FIG. 4 is a high level logic block diagram illustrating one example of an implementation of the party line communication channels in the example object 115. FIG. 4 illustrates various registers and multiplexers utilized in this example implementation. The ten party line communication channels 220-235 described with respect to FIG. 3 can be divided into three groups: (1) a first group of channels heading north, south, east, and west; (2) a second group of channels heading north, south, east, and west; and (3) a third group of channels heading north and south. FIG. 4 illustrates both the first and second group of party line communication channels (i.e., one heading south 220A_IN/225A_OUT, north 225A_IN/220A_OUT, east 235A_IN/230A_OUT, and west 230A_IN/235A_OUT). The third group of party line communication channels would be represented by a schematic diagram similar to that illustrated in FIG. 4, but without the party line communication channels heading east and west.

In one example implementation, the party line communication channels are implemented as unidirectional segmented buses. Such a bus is segmented in the sense that it passes through some logic circuitry (e.g., one of the launch multiplexers 425, 430, 435, or 440) and/or a register (e.g., one of the party line registers 445, 450, 455, or 460) along the way from one bus segment to the next bus segment.

With respect to the example implementation illustrated in FIG. 4, the party line communication channels within the object 115 may be configured in several ways. For example, the object 115 may be configured to selectively "pass" a value received from a previous object (i.e., an object from the north) on the party line communication channel 220A_IN to a next segment (i.e., the party line communication channel 225A_OUT) via the south launch multiplexer 440. The object 115 may also be configured to "turn" the value from the previous object to a different party line communication channel. For example, data on the party line communication channel 220A_IN may turn onto party line communication channel 230A_OUT via the east launch multiplexer 425. Likewise, data on the party line communication channel 220A_IN may turn onto party line communication channel 235A_OUT via the west launch multiplexer 435.

The object 115 may also be configured to "land" data from a previous object on a bus into one of its party line registers 445, 450, 455, or 460. For example, a value on the party line communication channel 220A_IN may be stored in the north party line register 450 via the north party line multiplexer 470 and/or stored in the south party line register 460 via the south party line multiplexer 475. As shown, the north party line register 450 may also store values from the core 205 and/or from the party line communication channel 225A_IN via the north party line multiplexer 470. Likewise, the south party line register 460 may also store values from the core 205 and/or from the party line communication channel 225A_IN and/or from the partly line communication channel 220A_IN via the south party line multiplexer 475.

The object 115 may "launch" values to another object via various party line communication channels and the launching multiplexers 425, 430, 435, and 440. For example, the south launching multiplexer 440 can launch data from the south party line register 460, nearest neighbor registers 457 and 462, or the party line communication channels 220A_IN, 235A_IN, and 230A_IN. Likewise, the north launching multiplexer 430 can launch data from the north party line register 450, nearest neighbor registers 447 and 452, or the party line communication channels 225A_IN, 235A_IN, and 230A_IN.

Each multiplexer 425, 430, 435, 440, 470, 475, 480, and 485 has a selector (e.g., a select input) to control which of the input signals (e.g., 225A_IN, 235A_IN, etc.) will be used as the output signal (e.g., 220A_OUT) at any given time. Thus, the party line communication channels are controlled by the selectors of the multiplexers. The selector can be set to a static position when the object is initialized or it can be controlled dynamically during runtime. Although not specifically described, the operation of the party line communication channels heading east and west (i.e., 235A_IN/230A_OUT and 230A_IN/235A_OUT) operate in a similar manner. A more detailed discussion of an unidirectional segmented bus architecture is provided in commonly owned U.S. Pat. No. 6,816,562, issued Nov. 9, 2004, entitled "Silicon Object Array With Unidirectional Segmented Bus Architecture," which is incorporated herein by reference in its entirety.

DMA Engine

Figure 5:
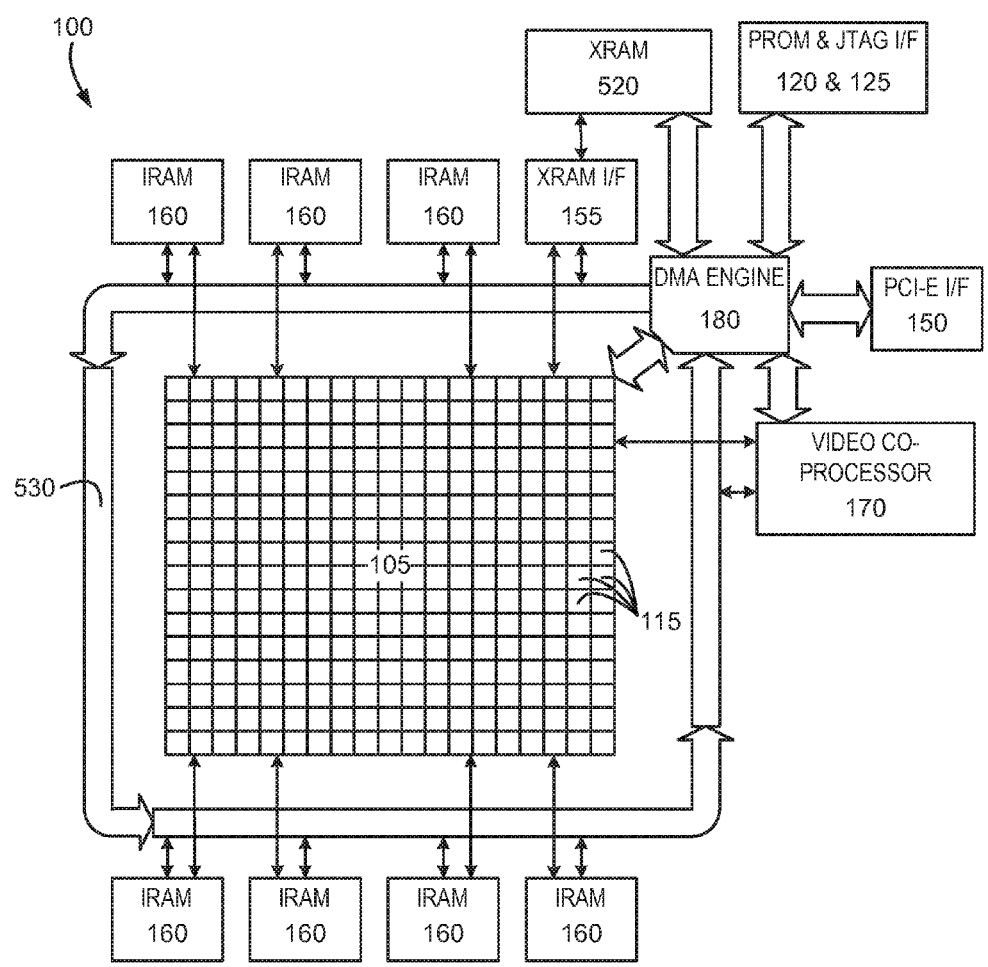
FIG. 5 is a block diagram illustrating one example of a direct memory access (DMA) engine in an FPOA.

FIG. 5 illustrates one example of a DMA engine 180 interacting with various objects and periphery subsystems in and around the FPOA 100. The DMA engine 180 helps free routing resources by moving data between objects. Thus, the DMA engine 180 allows objects 115 and/or periphery subsystems that would otherwise be responsible for moving data to perform other tasks and removes the burden of transferring data between. In particular, the DMA engine 180 frees the video compression co-processor 170 from the typically demanding task of transferring large amounts of video data.

The DMA engine 180 can facilitate the transfer of data between any two of the components or subsystems which it controls, including, for example, IRAMs 160, external memory 520, PROM (via PROM interface 120), the JTAG interface 125, the PCI-e interface 150 (and devices connected thereto, including external memory of another FPOA), the video compression co-processor 170, and the object array 105. The DMA engine 180 can also facilitate the transfer of data between two different addresses in the same subsystem. DMA-managed data transfers are in addition to direct data transfers between the array 105 of objects 115 and (1) the IRAMs 160, (2) the video compression co-processor 170, and (3) the external memory 520 (via the XRAM interface 155).

The DMA engine 180 specifically supports data transfers between the video compression co-processor 170 and other objects, such as (1) the IRAMs 160, (2) devices available in the PCI-e address space (via the PCI-e interface 150), (3) PROM (via PROM interface 120), (4) the JTAG interface 125, and (5) XRAM 520.

According to one embodiment, the DMA engine 180 comprises three functional components: (1) a DMA controller; (2) a data mover; and (3) a periphery bus controller. The DMA controller interfaces with an application running on the object array 105 and manages all pending DMA data transfers. The DMA controller selects specific transfers based on bandwidth allocation and pending requests and segments the specific data transfers into data transfer transactions. The data mover performs the data transfer transactions. According to one embodiment, the data mover transfers data in 64-byte chunks. The periphery bus controller allows DMA data transfers over a periphery bus 530 to operate independently of the DMA controller. For example, the periphery bus controller allows data to be transferred directly from one IRAM 160 to another IRAM 160. Thus, the periphery bus controller provides higher DMA data transfer throughput. The periphery bus 530 may be, for example, two 73-bit wide buses circling the object array 105 (e.g., one bus flowing in a counterclockwise direction while the other bus flows in a clockwise direction). From the periphery bus controller's viewpoint, the two buses operate as a single bus with a command issued on only one interface each transaction time. Devices sitting on the bus observe both buses.

The description of FIGS. 1 through 5 has provided an overview of a few examples of FPOA architectures and associated concepts. Other examples are possible. Other examples and additional details regarding FPOAs may be found in the following commonly owned United States patent applications, which are incorporated by reference herein in their entireties: application Ser. No. 11/042,547, filed Jan. 25, 2005, entitled "Integrated Circuit Layout Having Rectilinear Structure of Objects" (published as no. 2006/0080632 on Apr. 13, 2006); application Ser. No. 11/567,146, filed Dec. 5, 2006, entitled "Field Programmable Semiconductor Object Array Integrated Circuit" (published as no. 2007/0247189 on Oct. 25, 2007); and application Ser. No. 12/023,825, filed Jan. 31, 2008, entitled "Built-In Self-Testing (BIST) of Field Programmable Object Arrays," Moreover, additional discussion of FPOA concepts may be found in the "Arrix Family FPOA Architecture Guide" dated May 18, 2007 and the "Arrix Family Data Sheet & Design Guide" dated May 22, 2007, both of which are published by MathStar, Inc., Hillsboro, Oreg. In light of the teachings herein, those skilled in the art will be aware of equivalent architectures, implementations, variations, etc. for FPOAs.

Video Compression Co-Processor

Motion estimation enables compression of video data by identifying similarities between video frames with the goal of reducing the transmission and/or storage of temporally redundant data. For example, after identifying a block of pixels already available at a decoder that closely match a block of pixels being encoded, an encoder can simply pass a motion vector to the decoder rather than retransmitting and/or storing redundant data. Similarities between video frames can be identified using integer pixel data (e.g., data that has been sampled) and/or subpixel data (e.g., data that is interpolated from integer pixels). For example, a combination of integer pixel value comparisons and distance minimization may be used to identify the general location within a search window (e.g., search windows 700A and 700B in FIGS. 7A and 7B) that is most likely to contain similar video data. After identifying the general location, another search may be performed in the general location using subpixels (which may be interpolated from integer pixels). Again, a combination of subpixel value comparisons and distance minimization may be used to identify a set of search window pixels (e.g., on quarter subpixel granularity) that most closely match a set of baseline pixels.

Objects 115 (e.g., ALUs 116, MACs 117, and RFs 118) are capable of being programmed to perform motion estimation. However, providing a video compression co-processor 170 that performs many of the computational intensive functions (e.g., performing the SAD calculations, interpolating subpixels, and searching for similarities between integer pixels or subpixels) helps reduce design complexity and design cost, increase overall video data compression performance, and free objects 115 to perform other functions.

Figure 6:
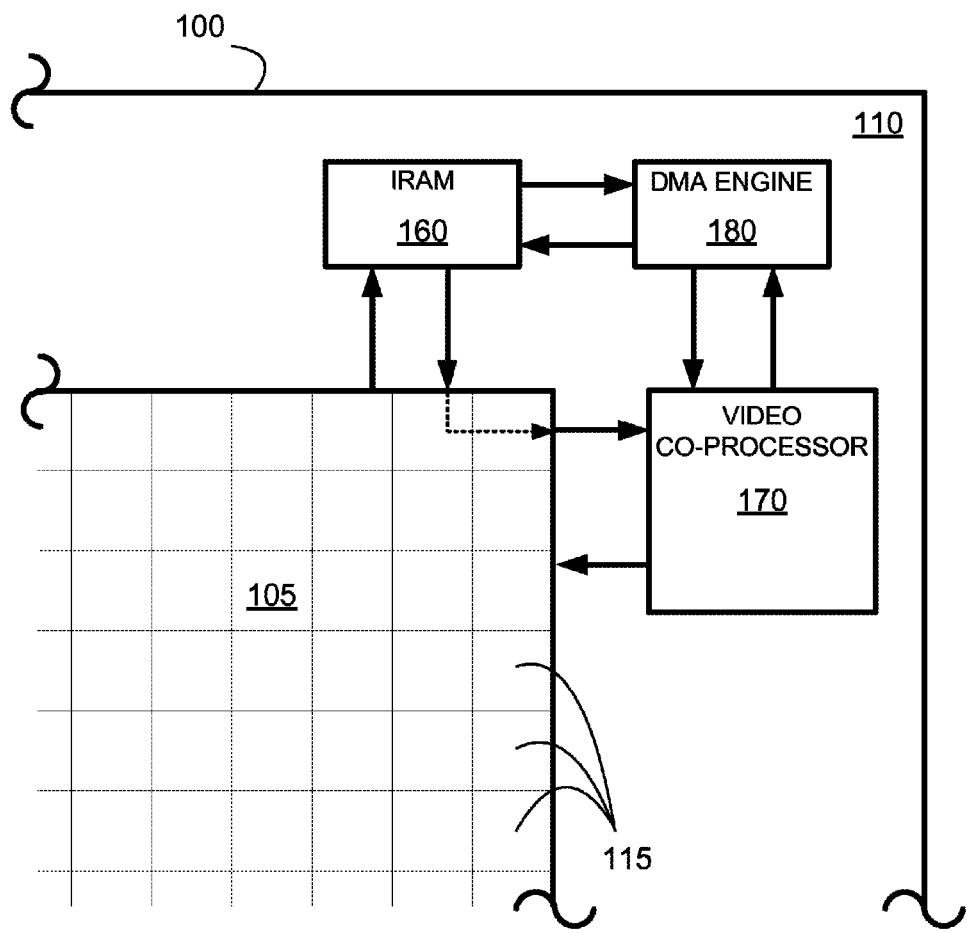
FIG. 6 is a block diagram illustrating a video compression co-processor located within a periphery region of a FPOA, according to one embodiment.

FIG. 6 illustrates one example of a video compression co-processor 170 located within the periphery region 110 of the FPOA 100. The array 105 of objects 115 is configured to communicate with one or more IRAMs 160 and the video compression co-processor 170 via party line communication channels within a set of objects 115. The video compression co-processor 170 is also configured to communicate with one or more IRAMs 160 via the DMA engine 180. Thus, the video compression co-processor 170 receives a stream of data using a number of possible paths. For example, the video compression co-processor 170 is configured to receive search window data pixel data (e.g., the group of pixels being searched) stored in a set of IRAMs 160 via the array 105 of objects 115 or via the DMA engine 180. By way of another example, the video compression co-processor 170 may receive data, such as macroblock data (e.g., the group of pixels being searched for) or configuration data, directly from the array 105 of objects 115. In addition, the video compression co-processor 170 may transmit data, such as a set of shifted subpixels pixels, integer pixel and subpixel SAD values, and distance values, directly to the array 105 of objects 115.

Figure 7A:
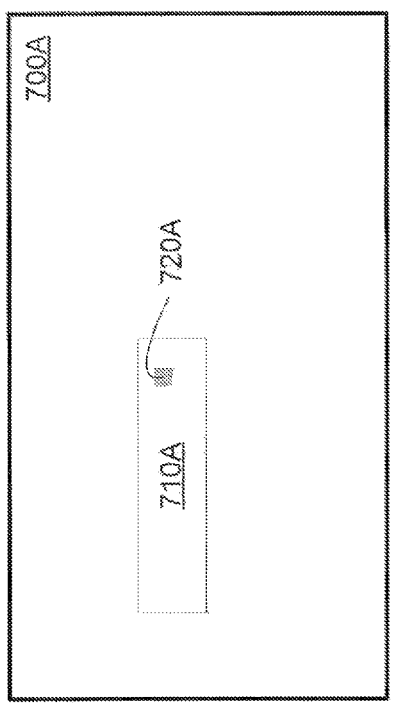
FIG. 7A is a diagram illustrating one example of a search window within a reference frame having a 720i/p resolution.
Figure 7B:
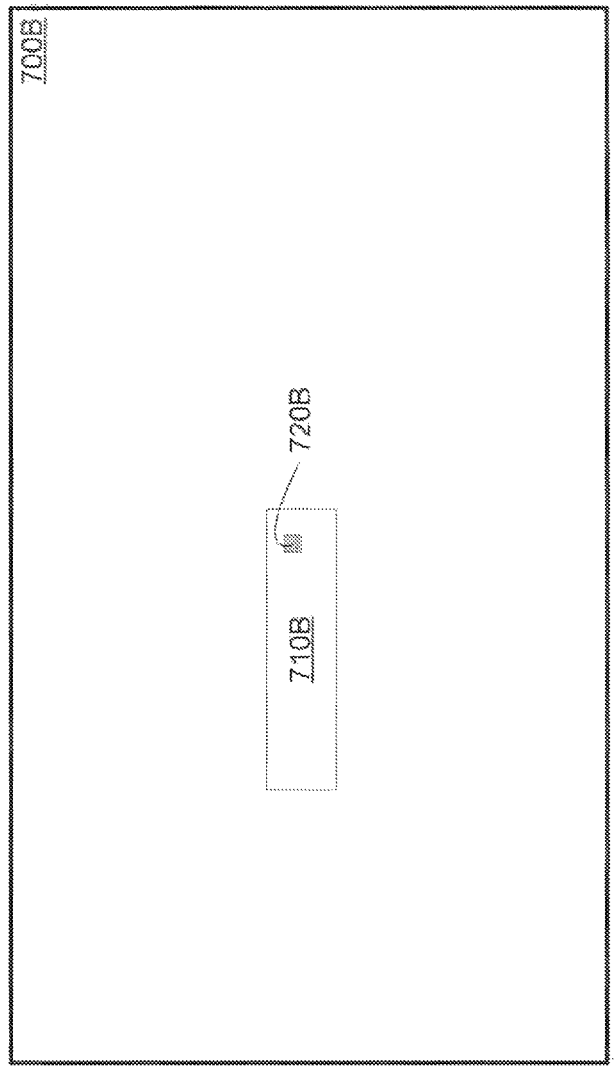
FIG. 7B is a diagram illustrating one example of a search window within a reference frame having a 1080i/p resolution.

Before describing additional details of the video compression co-processor 170, a brief motion estimation primer as it relates to the video compression co-processor 170 will be provided. One goal of motion estimation is to identify a set of integer pixels within a previous or future video frame which best matches the contents of a current macroblock. According to one embodiment, the video compression co-processor 170 processes thirty video frames per second. As shown in FIGS. 7A and 7B, the portion of a video frame 700A or 700B being searched (e.g., search window 710A or 710B) is typically smaller than the total area of the video frame 700A or 700B. For example, FIG. 7A illustrates a 720i/p (high definition) video frame 700A having 1280 horizontal pixels by 720 vertical pixels, a search window 710A having 512 horizontal pixels and 64 vertical pixels, and a macroblock 720A having 16 horizontal pixels and 16 vertical pixels. By way of another example, FIG. 7B illustrates a 1080i/p (high definition) video frame 700B having 1920 horizontal pixels and 1080 vertical pixels, a search window 710B having 512 horizontal pixels and 64 vertical pixels, and a macroblock 720B having 16 horizontal pixels by 16 vertical pixels. According to one embodiment, the video compression co-processor 170 uses a search window having 512 horizontal pixels and 64 vertical pixels. However, the width of the search window may be larger or smaller depending on various factors such as the size of the external storage element.

Figure 8:
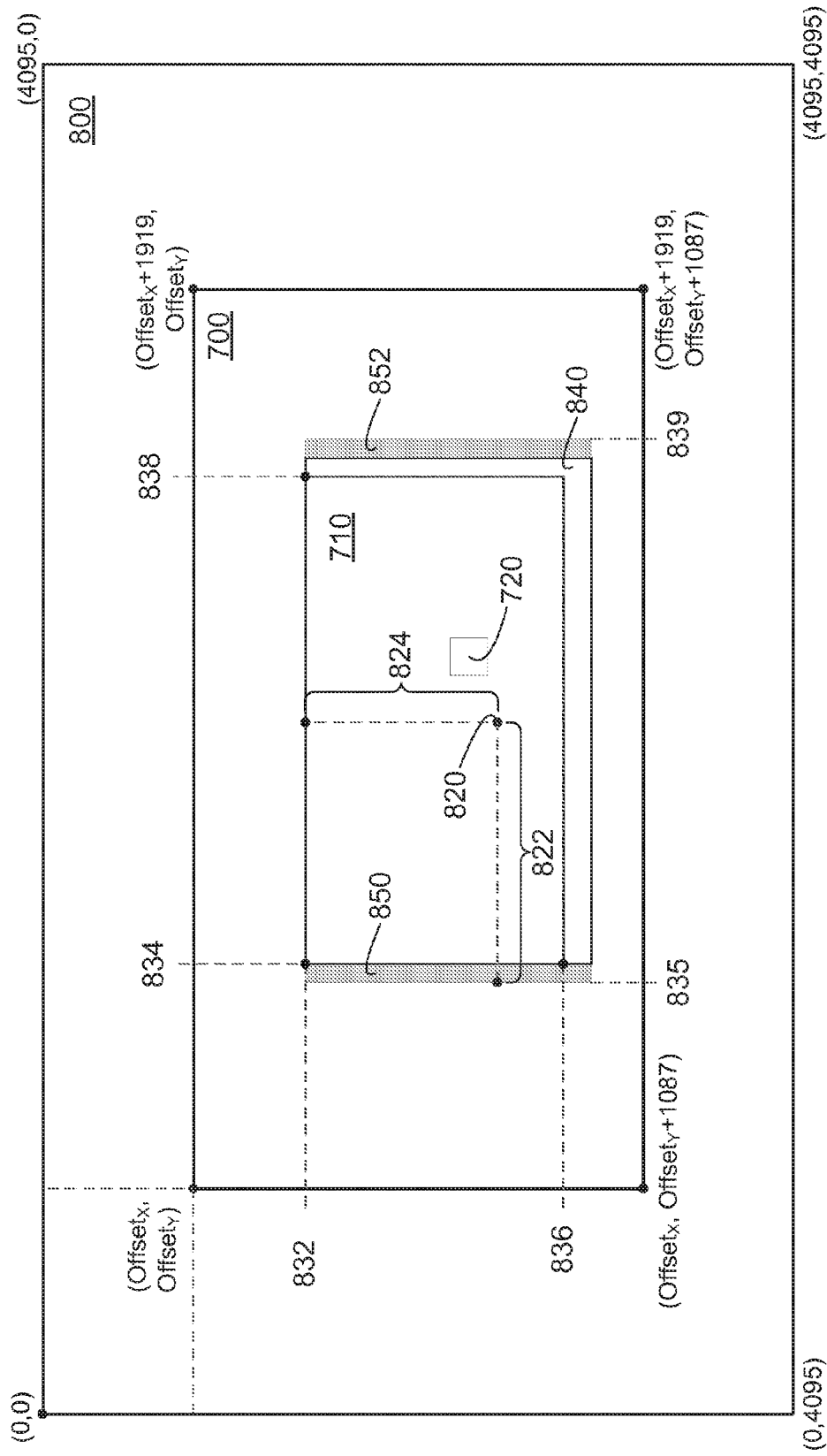
FIG. 8 is a diagram illustrating a pixel coordinate system, according to one example.

According to one embodiment and with reference to FIG. 8, the video compression co-processor 170 uses a pixel address space 800 large enough to address an entire video frame 700B without using negative numbers. The origin (0,0) is located at the upper left of the pixel address space 800. The example pixel address space 800 uses 12-bit pixel location values, so the pixel address space 800 is 4096 wide by 4096 pixels high. Using 12-bit pixel location values allows the pixel address space 800 to support a 1080i/p video frame 700B while allowing an estimated motion vector 820 to be approximately 1024 pixels outside of the video frame 700B. Of course, the pixel location values may use additional or fewer bits with a corresponding increase or decrease in the size of the pixel address space 800.

The video frame 700 may be located anywhere within the pixel address space 800. According to one embodiment, the video frame 700 is offset from the origin (0,0) by multiples of 16 pixels and the width of the video frame 700 is a multiple of 16 pixels. Thus, the values of (Offset$_X$,Offset$_Y$) may be (15,15), (31,15), (15,31), and so forth. Of course, any offset may be used.

The search window 710 is bounded by a starting search window row 832, starting search window column 834, ending search window row 836, and ending search window column 838. Thus, the upper left corner of the search window 710 has coordinates (starting search window row 832, starting search window column 834) and the lower right corner of the search window 710 has coordinates (ending search window row 836, ending search window column 838). If the search window 710 does not reside entirely within the video frame 700, the pixels located outside of the video frame 700 may be extrapolated. According to one embodiment, an extra fifteen pixel skirt 840 is provided to the right and bottom of the search window 710 for SAD calculations (discussed in more detail with reference to FIG. 9).

To accommodate integer and subpixel processing, the starting search window row 832 and column 834 and the ending search window row 836 and column 838 are addressed based on the resolution of the search. For example, when performing a quarter pixel search, the least two significant address bits represent the subpixel offset from the corresponding integer pixel indicated in the upper most address bits. According to one embodiment, the difference between the starting search window row 832 value and the ending search window row 836 value can be up to sixty-three pixels (e.g., where the maximum height of the search window 710 is sixty-four pixels). Thus, the starting search window row 832 and the ending search window row 836 may define a search window 710 having a height of fewer than sixty-four pixels.

Starting search window macroblock column alignment 835 indicates the leftmost pixel column (within a first sixteen pixel wide macroblock column) to be included within a search for pixels within the search window 710 that most closely match the macroblock 720. For example, if the starting search window macroblock column alignment 835 equals seven, pixel 7 and all pixels to the right (i.e., pixels 7-15 of pixels 0-15) are included in the search and all pixels to the left are excluded from the search (i.e., pixels 0-6 of pixels 0-15). By way of another example, if the starting search window macroblock column alignment 835 equals zero all pixels in the first sixteen pixel wide macroblock column are included in the search. In other words, if the starting search window macroblock column alignment 835 equals zero, the first sixteen pixel wide macroblock column is naturally aligned within the video frame 700. Even though some of the first sixteen pixel wide macroblock column pixels may not ultimately be used (based on the value of the starting search macroblock column alignment 835), all of the pixels may still be transferred to the video compression co-processor 170. Similarly, ending search window macroblock column alignment 839 indicates the rightmost pixel column (within a last sixteen pixel wide macroblock column) to be included within the search. For example, if the ending search window macroblock column alignment 839 equals eight, pixel 8 and all pixels to the left (i.e., pixels 0-8 of pixels 0-15) are included in the search and all pixels to the right are excluded from the search (i.e., pixels 9-15 of pixels 0-15). Skirts 850 and 852 represent between zero and fifteen pixels that are transferred to the video compression co-processor 170 but which may not be used in the search. All of the pixels in macroblock columns between the first sixteen pixel wide macroblock column and the last sixteen pixel wide macroblock column are included in the searches.

The estimated motion vector 820 may be located anywhere within the pixel address space 800. While an actual motion vector may not be known, the estimated motion vector 820 may be derived in several ways, such as from a previous macroblock on upper rows or from previous video frames. According to one embodiment, a distance between the estimated motion vector and the upper left most pixel in the first sixteen pixel wide macroblock column is provided to the video compression co-processor 170. Thus, the video compression co-processor 170 may receive a ΔX value 822 and a ΔY value 824.

Figure 9:
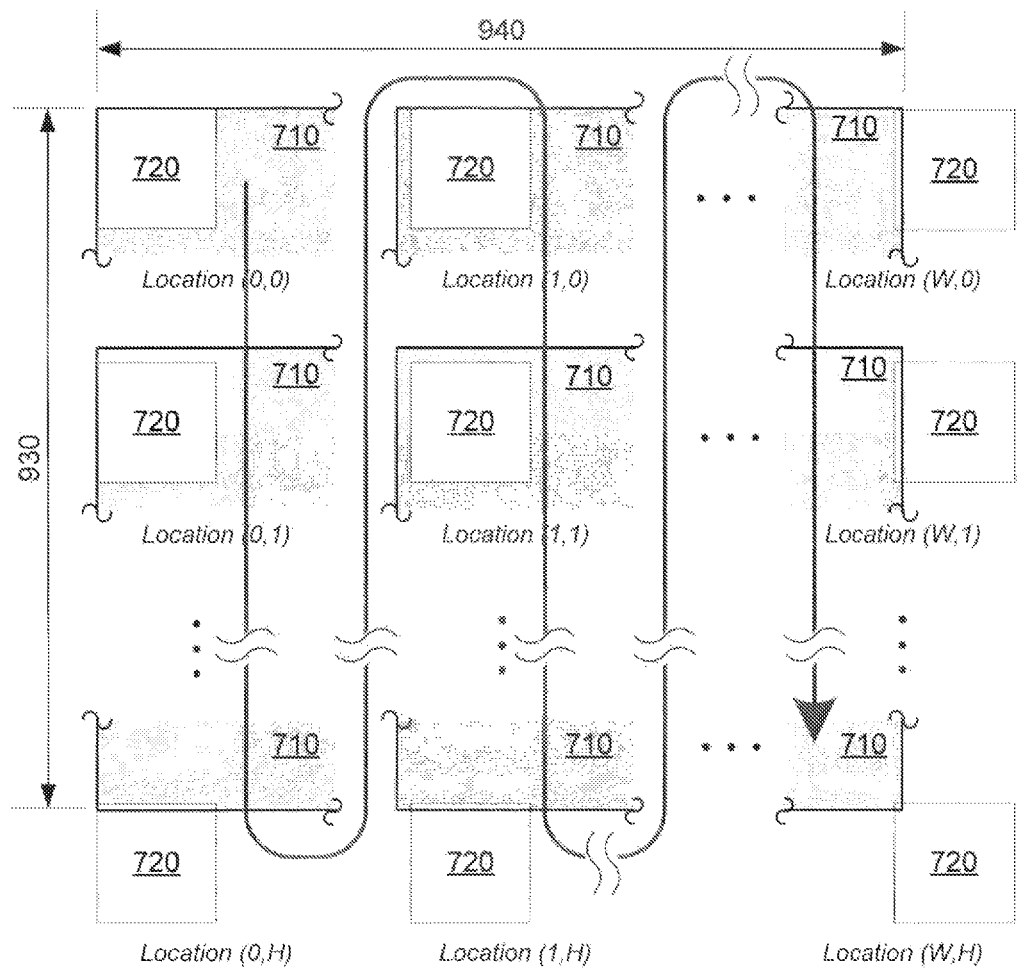
FIG. 9 is a block diagram illustrating a macroblock snaking through a search window to identify a set of search window pixels that most closely match the macroblock, according to one embodiment.

According to one embodiment, the video compression co-processor 170 performs a brute-force search through the search window. As shown in FIG. 9, a search starts by comparing pixels in the macroblock 720 to pixels within a search window 710 (having a height 930 and width 940) of a video frame. For example, the macroblock 720 may start so that the upper-left corner of the macroblock 720 is coincident with the upper-left corner of the search window 710 (shown as location (0,0) in FIG. 9). Next, the macroblock 720 slides down one pixel and another comparison is performed. The best match is retained along with its corresponding location (e.g., the lesser of the SAD values calculated at location (0,0) and location (0,1), while the greater of the SAD values and location are discarded). At each iteration, the macroblock 720 keeps sliding down by one pixel, until the upper left corner of the macroblock 720 resides at location (0,H), where H is the height of the search window. When the macroblock 720 resides at location (0,H), only the uppermost row of the macroblock 720 remains within the boundaries of the search window 710. After performing a comparison at location (0,H), the macroblock 720 returns to the top of the search window 710 and advances one column to the right (e.g., the upper-left pixel of the macroblock 720 is located at location (1,0)).

The macroblock 720 continues snaking through the search window 710 in a serpentine like manner until all possible macroblock locations have been compared. The location within the search window 710 that most closely matches the macroblock 720 (e.g., the address of the block of pixels that most closely match the macroblock 720) is retained along with the a comparison of the respective pixels (e.g., the SAD value). As shown in FIG. 9, the macroblock 720 resides outside of the search window 710 during a number of comparisons (e.g., locations (0,H), (1,H), (W,0), (W,1), and (W,H)). If the macroblock 720 is sixteen pixels wide by sixteen pixels high, a fifteen pixel skirt below and to the right of search window 710 can be employed. While only a fifteen pixel skirt suffices, sixteen pixels may be used for simplicity. FIG. 9 illustrates only one example of a search. Thus, the macroblock 720 may progress through the search window 710 in other ways. For example, after finding a close enough match (e.g., an acceptably small SAD value), the search may terminate and the video compression co-processor 170 may move onto the next search. In addition, the video compression co-processor 170 may also first sample portions of the search window to identify locations likely to contain the best match.

Figure 10:
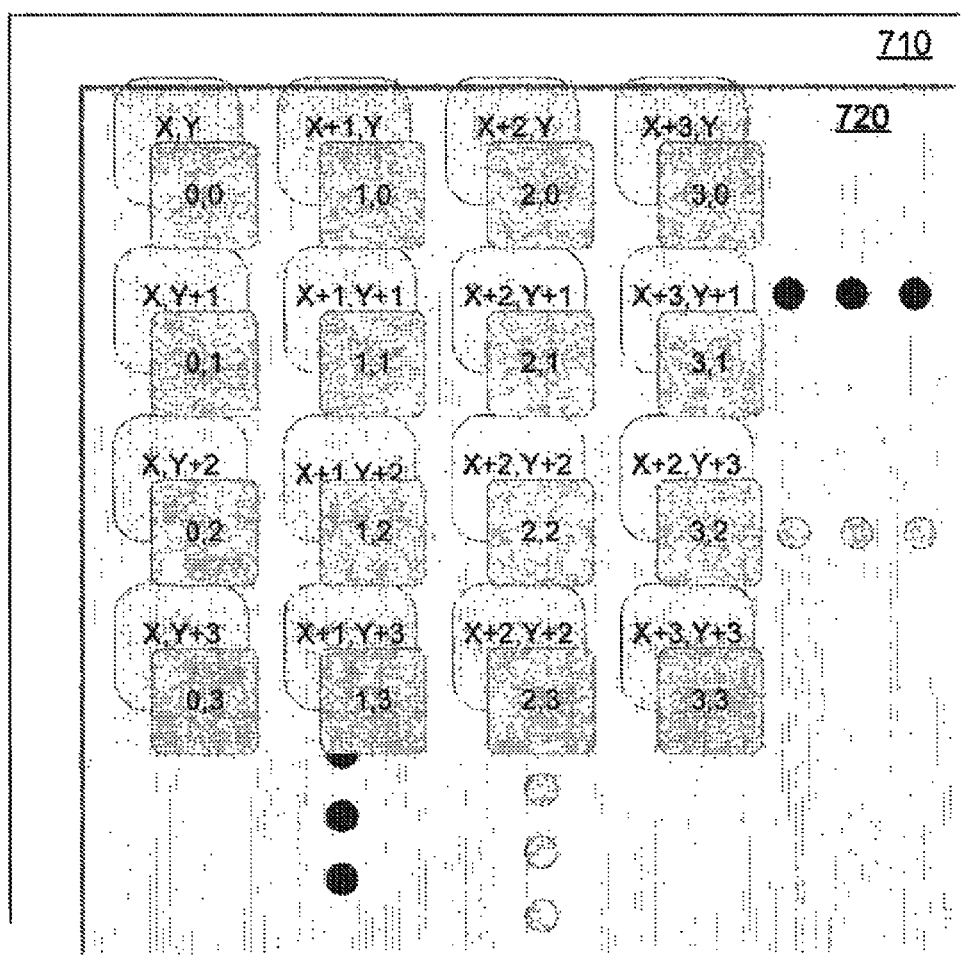
FIG. 10 is a block diagram illustrating one example of comparing pixel values in a set of search window pixels to corresponding pixel values in a macroblock to identify how closely the set of search window pixels match the macroblock pixels.

As shown in FIG. 10, pixels in the macroblock 720 may be compared to corresponding pixels in the search window 710 (e.g., pixel (0.0) is compared to pixels (X,Y), pixel (1,0) is compared to pixel (X+1, Y), and so forth). One possible comparison calculation is known as the sum of absolute differences (SAD). As Equation 1 illustrates, a SAD calculation adds the difference in magnitude between corresponding pixels within 720 macroblock and search window 710. The absolute value operation compensates for any negative numbers resulting from subtraction. Equation 1 assumes a sixteen-by-sixteen macroblock 720. While, SAD may be used, other methods may be used to compare macroblock pixels and search window pixels. For example, a sum of squared differences may be used.

$$SAD = \sum_{x=0}^{15} \sum_{y=0}^{15} |SWPixel_{xy} - MBPixel_{xy}| \quad \text{Equation 1}$$

Although the video compression co-processor 170 may identify the closest match based solely on the smallest SAD value, it may be desirable to factor in other variables, such as minimizing a distance between the location of the smallest SAD value and the estimated motion vector. Equation 2 illustrates one example of minimizing a distance between the location of the smallest SAD value and the estimated motion vector by comparing the relative weights of the two locations.

$$\text{WeightedSAD} = SAD + \lambda|EMV_x - MV_x| + \lambda|EMV_y - MV_y| \quad \text{Equation 2}$$

As Equation 2 shows, a weighted SAD value is calculated using a combination of the SAD value and a normalized distance between the estimated motion vector (EMV) and an identified motion vector (e.g., the location of the smallest SAD value). The EMV may be identified before the search begins and passed to the video compression co-processor 170. The distance weighting parameter, $\lambda$, may be passed to the video compression co-processor 170 each time the macroblock changes. Thus, $\lambda$ may change along with each macroblock. According to one embodiment, $\lambda$ is an eight-bit number and the weighted SAD is truncated to sixteen bits.

If the macroblock is partitioned, the SAD value may be scaled according to the size of the partition. For example, a sixteen-by-sixteen macroblock (i.e., 256 pixels) may be partitioned into halves (i.e., 128 pixels), quarters (i.e., 64 pixels), eighths (i.e., 32 pixels), and sixteenths (i.e., 16 pixels). Thus, in order to keep the relative magnitude of SAD values and motion vector components the same when calculating the weighted SAD, the SAD value may be multiplied by a value of 1, 2, 4, 8, or 16 depending on whether the macroblock partition has 256, 128, 64, 32, or 16 pixels.

In the case of a tie between weighted SAD values, any number of decision rules can be employed. One example decision rule is to choose the location with the lowest SAD value. If the SAD values are also equal, the tie may be resolved in various ways. For example, the SAD value closest to the upper-left corner of a given search window could be used.

According to one embodiment, the relative distance between two macroblocks is determined using a Manhattan distance. For example, as shown in FIG. 11, the search window 710 may contain two sets of pixels (e.g., a first set of pixels 1120 and a second set of pixels 1130) that closely match a macroblock. The first set of pixels 1120 is located one pixel to the right and five pixels above EMV 820 (e.g., $\Delta X=1$ and $\Delta Y=5$). The second set of pixels 1130 is located four pixels to the right and three pixels below the EMV 820 (e.g., $\Delta X=4$ and $\Delta Y=-3$). The distances between the EMV 820 and the sets of pixels may be calculated by summing the absolute value of $\Delta X$ and $\Delta Y$. Thus, the distance between the EMV 820 and the first set of pixels 1120 is six (distance=|1|+|5|=6) and the distance between the EMV 820 and the second set of pixels 1130 is seven (distance=|4|+|-3|=7). The lesser of the sums of the absolute values of $\Delta X$ and $\Delta Y$ is considered closer. The relative distances may also be calculated in other ways, such as using the Pythagorian theorem if computational resources permit.

Referring again to Equation 2, $\lambda$ is multiplied by the absolute value of the distance between the EMV and the identified motion vector. The multiplication need not be performed by the video compression co-processor 170 since a value representing $\lambda$ multiplied by the EMV may be passed to the video compression co-processor 170. Passing a scaled value representing $\lambda$ multiplied by the EMV to the video compression co-processor 170 allows an application running on the object array 105 to adjust the EMV for subpixel calculations.

Because Equation 2 employs the absolute value of the distance between the EMV and the identified motion vector (which is then multiplied by λ), the video compression co-processor 170 needs to compensate for the absolute value function if the scaled value representing λ multiplied by the EMV is passed to the video compression co-processor 170. For example, the video compression co-processor 170 may update the scaled value such that the scaled value remains a positive number. In other words, the video compression co-processor 170 may simply add or subtract λ from the updated scaled value each time the macroblock 720 moves one pixel (e.g., up or down, or to the left or to the right). Thus, the video compression co-processor 170 does not need to perform multiplication and instead can add or subtract λ from the horizontal or vertical component of the updated scaled value as the macroblock 720 snakes its way through the search window 710.

As shown in FIG. 12A, the EMV 820 is located to the left of the search window 710. Each time the macroblock 720 moves one pixel to the right, λ is added to the updated scaled value (representing the horizontal, or X, component). As shown in FIG. 12B, the EMV 820 is located within the search window 710 (at least horizontally). Assuming the macroblock 720 starts to the left of the EMV 820, each time the macroblock 720 moves one pixel to the right, λ is subtracted from the updated scaled value. After reaching the EMV 820, λ is added to the updated scaled value as the macroblock 720 continues to move to the right, one pixel at a time. As shown in FIG. 12C, the EMV 820 is located to the right of the search window 710. Each time the macroblock 720 moves one pixel to the right, λ is subtracted from the updated scaled value. FIGS. 12A, 12B, and 12C only illustrated the horizontal component of the operation. The vertical component is maintained in a similar manner. The video compression co-processor 170 may be provided with data Indicating whether the EMV 820 is located to the upper-left, upper-right, lower-left, or lower-right of the upper left corner of the search window 710 so that the video compression co-processor 170 knows whether to initially subtract or add λ at each iteration.

As illustrated in FIG. 13, the maximum distance from the EMV to the more distant side of the search window 720 (e.g., 1305 or 1310) is a function of how many bits are used to maintain the distance values. For example, if ten-bit numbers are used, the maximum distance (e.g., 1305 or 1310) is 1023 pixels. If λ is an eight-bit number and the distance values are ten-bit numbers, the product of λ and the distance values is an eighteen-bit number. The video compression co-processor 170 can maintain the updated scaled value as an eighteen-bit number. Even if an application running on the object array 105 calculates the scaled value (e.g., (λ)*(EMV)) as an eighteen-bit number, the application may remove the least significant two bits to allow a sixteen-bit scaled value to be passed to the video compression co-processor 170. If the video compression co-processor 170 receives the scaled value as a sixteen-bit number, the video compression co-processor 170 can reinstate the least significant two bits as zeros. Reinstating the least significant two bits as zeros has the effect of rounding down the eighteen-bit product to the nearest multiple of four.

Figure 14:
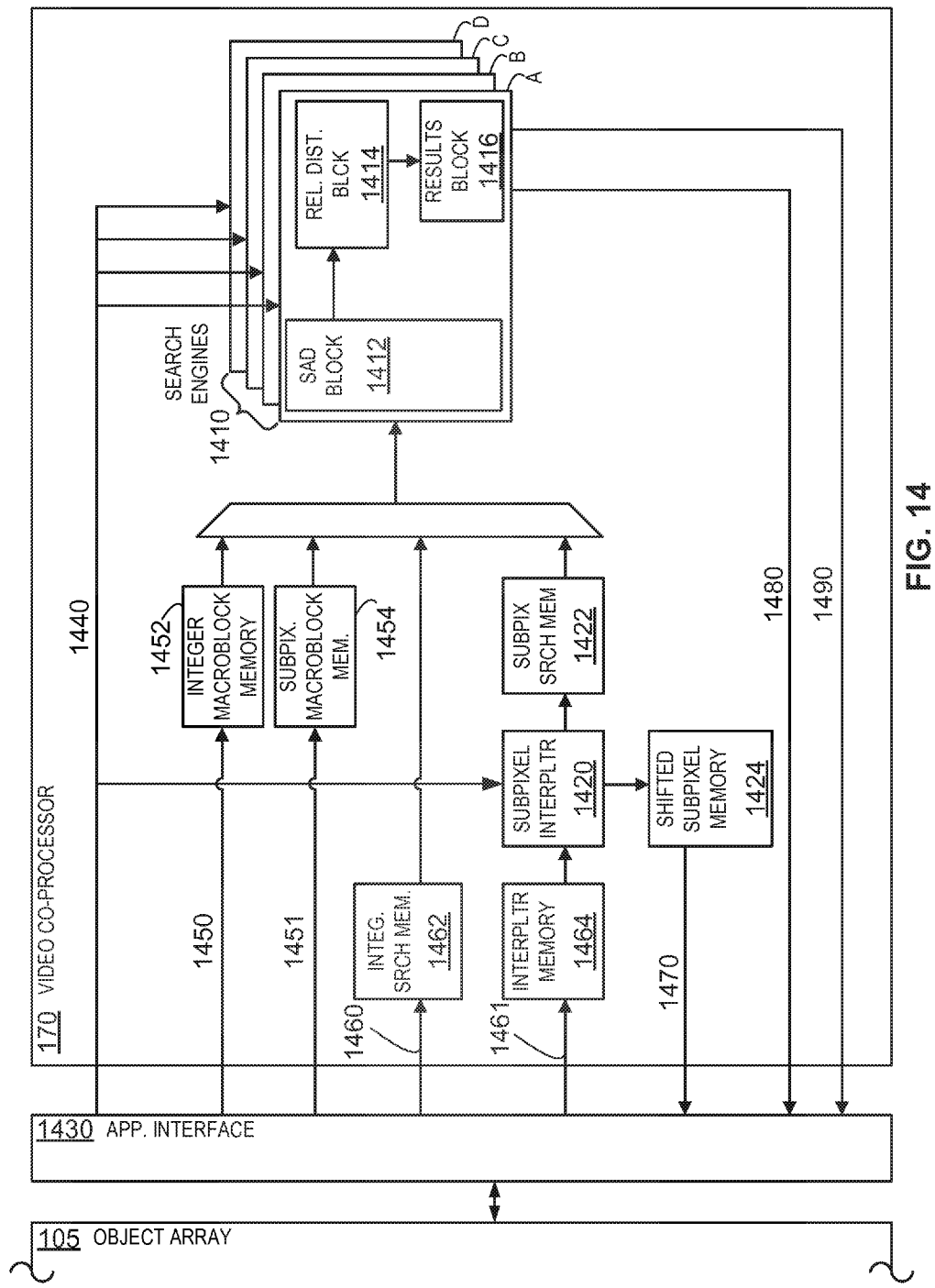
FIG. 14 is a high-level block diagram illustrating a video compression co-processor, according to one embodiment.

As shown in FIG. 14, an example video compression co-processor 170 comprises a set of search engines 1410 and a subpixel interpolator 1420. At a high level, one or more of the search engines 1410 may comprise a SAD block 1412, a relative distance block 1414, and a results block 1416. The SAD block 1412 performs SAD computations between search window pixels and macroblock pixels (using either integer pixels and/or subpixels). The relative distance block 1414 maintains the horizontal and vertical coordinates of a macroblock (e.g., in the pixel address space 800) and computes a relative distance between the macroblock and an EMV as the macroblock iteratively moves through a search window. As the macroblock progresses through the search window, the results block 1416 maintains (1) the best SAD value (e.g., the lowest SAD value) of the macroblock (or subpartition of the macroblock), (2) the corresponding horizontal and vertical coordinates of the macroblock (or subpartition of the macroblock) within the search window that resulted in the best SAD value, and (3) the relative distance between the macroblock (or subpartition of the macroblock) and the EMV within the search window that resulted in the best SAD value. According to one embodiment, four search engine 1410 are provided. However, any number of search engines 1410 may be provided to achieve a desired throughput. Additional details of the search engines 1410 will be discussed below.

As its name implies, the subpixel interpolator 1420 interpolates subpixels from integer pixels. The interpolated subpixels may then be (1) used to shift a set of integer pixels by a specified number of subpixels and/or (2) searched to identify a location within the interpolated subpixels that best matches a subpixel macroblock. The interpolated subpixels may be stored in a subpixel search memory 1422 so that one or more of the search engines 1410 can perform a subpixel search using subpixel macroblock data stored in a subpixel macroblock memory 1454. According to one embodiment, the subpixel search memory 1422 is sized to store approximately 8281 pixels in a 91-by-91 pixel array. Of course, the subpixel search memory 1422 may be sized to store additional or fewer pixels. The shifted integer pixels may be stored in a shifted pixel memory 1424. According to one embodiment, the shifted pixel memory 1424 is sized to store approximately 256 pixels in a 16-by-16 pixel array. Of course, the shifted pixel memory 1424 may be sized to store additional or fewer pixels. For example, the shifted pixel memory 1424 may be able to store two sets of shifted pixels that can be accessed in first-in, first-out (FIFO) order. Additional details of the subpixel interpolator 1420 will be discussed below. According to one embodiment, the subpixel interpolator 1420 can interpolate subpixels from four integer pixels per clock cycle. However, the subpixel interpolator 1420 may interpolate subpixels form any number of integer pixels per clock to achieve a desired throughput. For example, a wider subpixel interpolator 1420 may be provided so that twice the number of subpixels can be calculated per clock cycle.

At a high level an application interface 1430 is an interface between the video compression co-processor 170 and an application running on the object array 105. The application interface 1430 may comprise code embodied on a machine-readable medium (e.g., within the FPOA 100 or the video compression co-processor 170) that when executed by the FPOA 100 (or the video compression co-processor 170) performs the steps necessary to transfer data (e.g., configuration parameters, macroblock pixel data, search window pixel data, and the results from the search engines and subpixel interpolator). Alternatively, the steps may be performed by hardware components that include specific logic for performing the steps or by a combination of hardware, software, and/or firmware. According to one embodiment, the video compression co-processor 170 provides one or more status bits that can be relayed to the application running on the array 105 by the application interface 1430. The status bits can indicate the state of the internal functions and indicate when macroblock data, configuration data, and search window pixel data can be transferred to the video compression co-processor 170.

The application interface 1430 allows configuration parameters 1440 to be transferred to the video compression co-processor 170 and stored in one or more operational registers (not shown). The configuration parameters 1440 are used to configure various components within the video compression co-processor 170, such as the search engines 1410 and the subpixel interpolator 1420. For example, the configuration parameters 1440 for the search engines 1410 may include a $\lambda$ value, a $\lambda*EMV_X$ value, a $\lambda*EMV_Y$ value, the size and location (e.g., within the pixel address space 800) of the search window, the relative location of the EMV with respect to the search window, and an indication of whether to perform a subpixel search or integer search. By way of another example, the configuration parameters 1440 for the subpixel interpolator 1420 may include a subpixel resolution value (e.g., H.264 quarter pixels, H.264 eight pixel, and MPEG2 half pixel) and a horizontal and vertical shift value. The configuration parameters 1440 allow a unique configuration to be applied to the various components within the video compression co-processor 170 for every operation. Thus, the operation the video compression co-processor 170 is performing can be changed on the fly and can perform a different type of interpolate or search (e.g., integer, $\frac{1}{8}^{th}$ subpixel, $\frac{1}{4}$ subpixel, $\frac{1}{2}$ subpixel) for every operation.

The application interface 1430 also allows macroblock pixel data 1450 to be transferred to the video compression co-processor 170. For example, a sixteen-by-sixteen pixel macroblock may be transferred to the video compression co-processor 170 and stored in an integer macroblock memory 1452 so that one or more of the search engines 1410 can perform an integer search. By way of another example, a four-by-four subpixel macroblock may be transferred to the video compression co-processor 170 and stored in the subpixel macroblock memory 1454 (via bus 1451) so that one or more of the search engines 1410 can perform a subpixel search.

The application interface 1430 further allows search window pixel data 1460 to be transferred to the video compression co-processor 170. By way of example, a set of integer pixels may be transferred to an integer search pixel memory 1462 so that one or more of the search engines 1410 can perform an integer search using the macroblock data stored in the integer macroblock memory 1452. As will be described in more detail below, the integer search pixel memory 1462 may comprise a set of double buffers. For example, the set of double buffers may include four memories, each of which can store a macroblock column (e.g., a 16-by-64 pixel array). Thus, pixel data may be stored in the integer search pixel memory 1462 such that SAD calculations can be performed using pixel data in one (or more) of the four memories while additional data is stored in the other memories.

In addition, a set of integer pixels may be transferred to an interpolator pixel memory 1464 (via bus 1461) so that the subpixel interpolator 1420 can interpolate subpixels. As will be described in more detail below the interpolator pixel memory 1464 may be sized to store a set of 28-by-28 integer pixels. Thus, up to 784 integer pixels may be transferred to the interpolator pixel memory 1464 via party line communication channels within a set of objects 115 in the array 105 or via the DMA engine 180 (see, e.g., FIG. 6). Of course, the interpolator pixel memory 1464 may be sized to store a larger or smaller set of integer pixels.

The application interface 1430 also allows the results from the search engines 1410 and subpixel interpolator 1420 to be transferred from the video compression co-processor 170 to the array 105 of objects 115. For example, an application running on the array 105 may be notified that shifted integer pixels 1470 (e.g., integer pixels shifted by a number of subpixels interpolated by the subpixel interpolator 1420) may be pushed out or extracted from shifted pixel memory 1424 (e.g., via party line communication channels within a set of object 115 in the array 105). In addition, an application running on the array 105 may be notified that that integer search results 1480 (e.g., one or more integer SAD values, corresponding horizontal and vertical coordinates, and corresponding relative distances to the EMV) and/or subpixel search results 1490 (e.g., one or more subpixel SAD values, corresponding horizontal and vertical coordinates, and corresponding relative distances to the EMV) are available.

The search engines 1410 and the subpixel interpolator 1420 may be managed independently to increase data throughput. For example, an arbitrator may be used to allow operations (that may use different resources) to operate in parallel. The arbitrator may, for example, instruct the video compression co-processor 170 to perform a subpixel interpolation at the same time as an integer search and/or a subpixel search, or the arbitrator may instruct the video compression co-processor 170 to perform a subpixel shift at the same time as an integer search and/or a subpixel interpolation. The arbitrator may be located within the video compression co-processor 170 or may be implemented in the application running on the object array 105.

Figure 15:
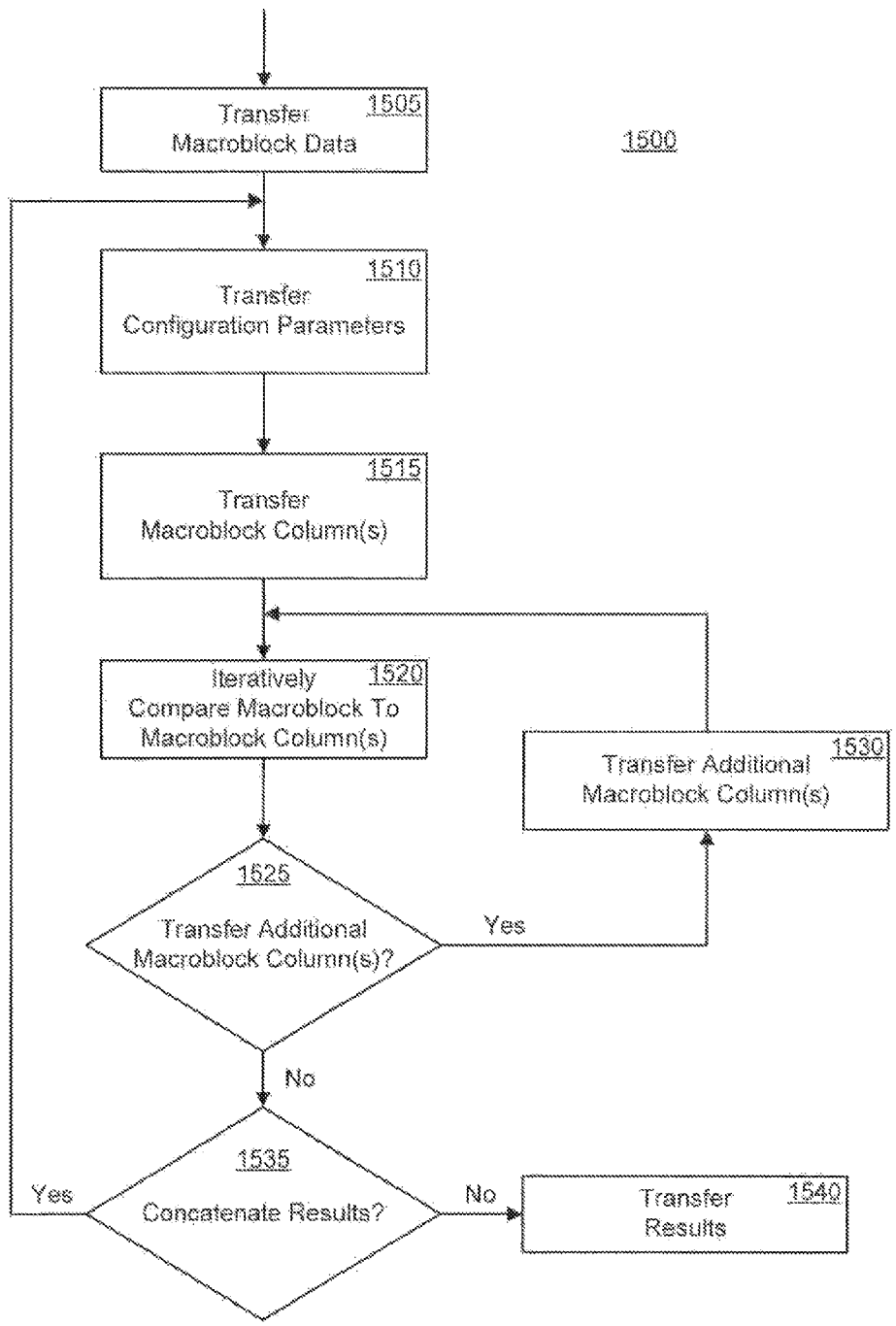
FIG. 15 is a flowchart illustrating a method of performing an integer search, according to one embodiment.

FIG. 15 is a high-level flowchart of a method 1500 of performing an integer search, according to one embodiment. The method 1500 first transfers macroblock data to the video compression co-processor 170 at step 1505. For example, a 16-by-16 integer macroblock may be stored in the integer macroblock memory 1452. Next, the method 1500 transfers configuration parameters to the video compression co-processor 170 at step 1510. For example, the configuration parameters may include an indication of whether to reset the results block 1416 (e.g., the values maintained by the results block 1416 may not be reset if search windows are being concatenated), an indication of whether to scale the SAD value based on the macroblock's partition size, a $\lambda$ value, a $\lambda*EMV_X$ value, a $\lambda*EMV_Y$ value, the size and location (e.g., within the pixel address space 800) of the search window, the relative location of the EMV with respect to the search window, and an Indication that an integer search should be performed. Step 1510 can be performed before, after, or at the same time as step 1505.

At step 1515, the method 1500 transfers one or more macroblock columns of pixel data to the video compression co-processor 170. By way of example, integer pixels from a search window may be transferred to the integer search pixel memory 1462 via party line communication channels within a set of objects 115 in the array 105 or via the DMA engine 180 (see, e.g., FIG. 6). If the integer search pixel memory 1462 comprises a set of double buffers, a macroblock column (e.g., a 16-by-64 pixel array) may be stored in an available memory in the set of double buffers. Step 1515 can be performed before, after, or at the same time as steps 1505 and 1510.

The method 1500 commences the integer pixel search at step 1520. For example, the method 1500 may start the integer pixel search by comparing the macroblock pixels to pixels within the first macroblock column (which represents a portion of a search window within a video frame). As described with reference to FIG. 10, the comparison may involve computing a SAD value, but other comparisons may be used, such as a sum of squared differences. Next, the macroblock slides down by one pixel row and another comparison is performed. The best match is retained along with its corresponding location. At each iteration, the macroblock keeps sliding down by one pixel row, until the macroblock reaches the bottom of the first macroblock column. The macroblock may then move to the right by one pixel column and repeats the same process (i.e., iteratively move slide down by one pixel row). After reaching the bottom again, the macroblock moves to the right by one pixel column, and so forth until the second macroblock column is fully processed.

While the method 1500 is performing the integer search at step 1520, additional integer pixels may be transferred to the video compression co-processor 170. Before transferring additional integer pixels, the method 1500 may first check whether additional macroblock columns should be transferred at step 1525. For example, the video compression co-processor 170 may wait for an active level on a permission signal. If additional macroblock columns should be transferred, the method 1500 transfers the additional macroblock columns at step 1530. By way of example, additional macroblock columns may be transferred to the integer search pixel memory 1462 via party line communication channels within a set of objects 115 in the array 105 or via the DMA engine 180 (see, e.g., FIG. 6). Again, if the integer search pixel memory 1462 comprises a set of double buffers, additional macroblock columns (e.g., 16-by-64 pixel arrays) may be stored in the other memories in the set of double buffers. Next, the method 1500 may perform another search at step 1520, except on the two additional macroblock columns. The method 1500 may repeat steps 1520, 1525, and 1530 until the entire search window has been searched.

At step 1535 the method 1500 determines whether search results for more than one search window should be concatenated (e.g., the video compression co-processor 170 may return the best results from both a first search window and a second search window using the same EMV). For example, the configuration parameters transferred to the video compression co-processor 170 may include an indication of whether to reset the results block 1416 (i.e., concatenate search results). If the method 1500 determines that search results should be concatenated, the method 1500 repeats steps 1510 through 1530. If not, the method 1500 transfers the results at step 1540. For example, the video compression co-processor 170 may transfer one or more subpixel SAD values, corresponding horizontal and vertical coordinates, and corresponding relative distances to the EMV to the object array 105. According to one embodiment, the video compression co-processor 170 performs multiple transfers (e.g., forty-one transfers for each macroblock partition) using three party line communication channels within a set of objects 115. The first party line may be used to transfer a sixteen-bit SAD value, the second party line may be used to transfer a twelve-bit horizontal offset value, and the third party line may be used to transfer a twelve-bit vertical offset value. Of course, the results may be transferred in other ways.

Figure 16:
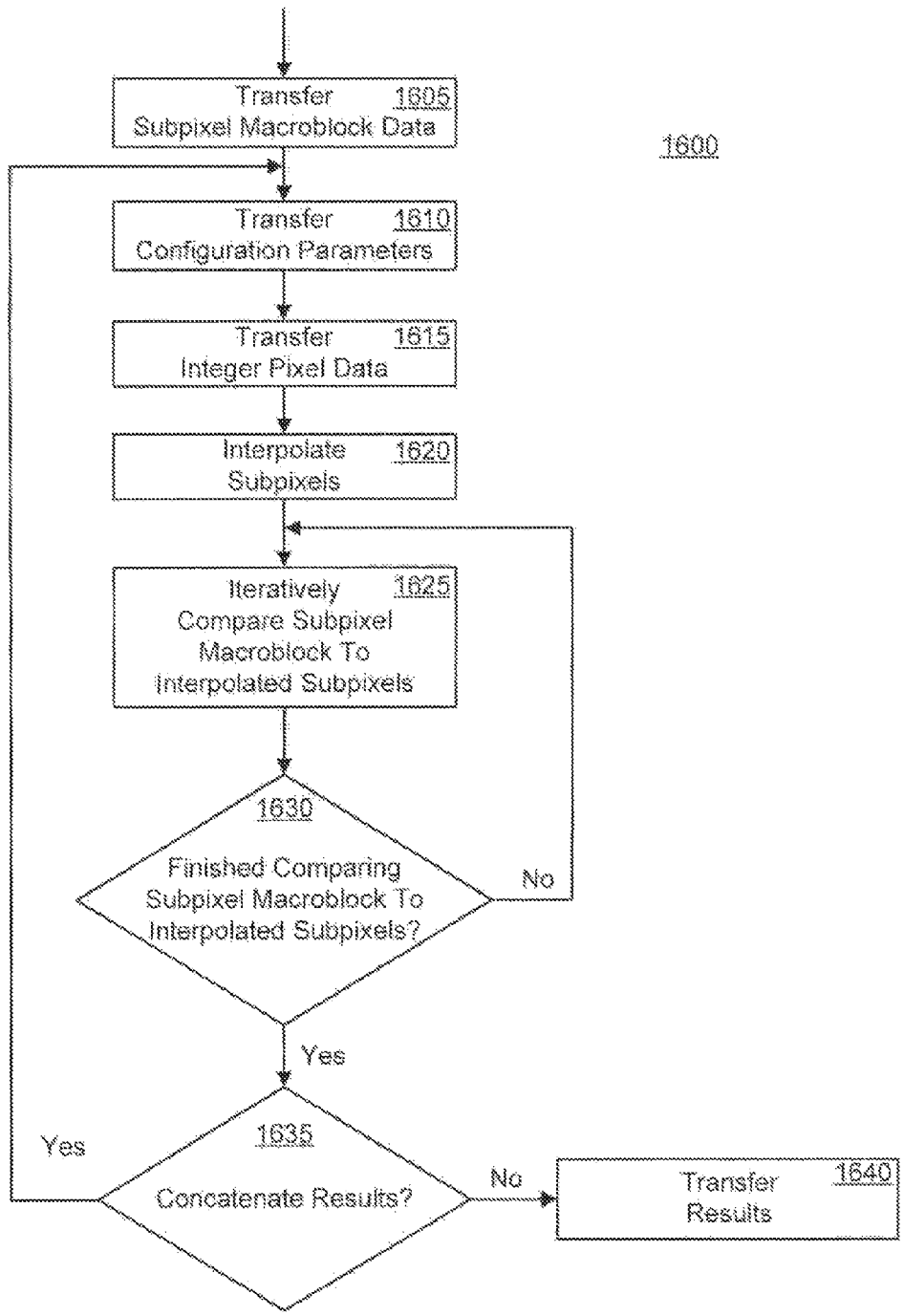
FIG. 16 is a flowchart illustrating a method of performing a subpixel search, according to one embodiment.

FIG. 16 is a high-level flowchart of a method 1600 of performing a subpixel search, according to one embodiment. The method 1600 first checks whether the subpixel interpolator 1420 is ready to be configured. For example, the video compression co-processor 170 may wait for an active level on a ready-to-configure signal. When the subpixel interpolator is ready to be configured, the method 1600 transfers subpixel macroblock data to the video compression co-processor 170 at step 1605. For example, a 16-by-16 subpixel macroblock may be stored in the subpixel macroblock memory 1454. Other subpixel macroblock partitions may be used, such as 8-by-16 subpixels, 16-by-8 subpixels, 8-by-8 subpixels, 4-by-8 subpixels, 8-by-4 subpixels, and 4-by-4 subpixels. Step 1605 can be performed before, after, or at the same time as steps 1610 and 1615.

At step 1610, the method 1600 transfers configuration parameters to the video compression co-processor 170. For example, the configuration parameters may include an indication of whether to reset the results block 1416 (e.g., the values maintained by the results block 1416 may not be reset if search windows are being concatenated), an indication of whether to scale the SAD value based on the macroblock's partition size, a λ value, a λ*$EMV_X$ value, a λ*$EMV_Y$ value, the size and location (e.g., within the pixel address space 800) of the search window, the relative location of the EMV with respect to the search window, an indication that a subpixel search should be performed, an indication of the subpixel macroblock partition size (e.g., a 16-by-16 macroblock, a 8-by-16 or 16-by-8 macroblock, a 8-by-8 macroblock, etc.), an indication of the subpixel resolution (e.g., H.264 quarter pixel, H.264 eighth pixel, or MPEG2 half pixel), an alignment value (e.g., how many integer pixels to ignore at the beginning of each integer pixel row), the number of pixels to be transferred per row (e.g., 16 pixels, 32 pixels, or 64 pixels), the number of IRAMs 160 containing integer pixel data, and the number of bits per pixel (e.g., 10-bit pixels, 11-bit pixels, or 12-bit pixels). Step 1610 can be performed before, after, or at the same time as steps 1605 and 1615.

The method 1600 transfers the appropriate integer pixel data to the video compression co-processor 170, at step 1615. By way of example, integer pixels from a search window may be transferred to the interpolator pixel memory 1464 via party line communication channels within a set of objects 115 in the array 105 or via the DMA engine 180 (see, e.g., FIG. 6). If the interpolator pixel memory 1464 is sized to store a set of 28-by-28 integer pixels, twenty eight pixels will be stored per row and twenty eight rows will be stored so that the subpixel interpolator 1420 can interpolate subpixels and perform the search. Step 1615 can be performed before, after, or at the same time as steps 1605 and 1610.

Before interpolating subpixels at step 1620, the method 1600 first checks whether the subpixel interpolator 1420 is ready to start. For example, the video compression co-processor 170 may wait for an active level on a ready-to-start signal. When the subpixel interpolator 1420 is ready to start, the method 1600 interpolates subpixels at step 1620. For example, the subpixel interpolator 1420 may interpolate quarter pixels and store the interpolated subpixels in the subpixel search memory 1422 so that one or more of the search engines 1410 can perform a subpixel search using subpixel macroblock data stored in a subpixel macroblock memory 1454.

At step 1625, the method 1600 searches the interpolated subpixels to identify a location within the interpolated subpixels that best matches the subpixel macroblock. For example, the method 1600 may start the subpixel search by comparing the subpixel macroblock pixels to pixels within a first subpixel macroblock column (e.g., if the subpixel macroblock is 8-by-8 pixels, the macroblock column would be eight subpixels wide). As described with reference to FIG. 10, the comparison may involve computing a SAD value, but other comparisons may be used, such as a sum of squared differences. Next, the subpixel macroblock slides down by one subpixel row and another comparison is performed. The best match is retained along with its corresponding location. At each iteration, the subpixel macroblock keeps sliding down by one subpixel row, until the subpixel macroblock reaches the bottom of the first subpixel macroblock column. The method 1600 may then move to the right by one subpixel column and repeats the same process (i.e., iteratively move slide down by one pixel row). After reaching the bottom again, the method 1600 moves to the right by one subpixel column, and so forth. Finally, at step 1630, the method 1600 determines whether the comparisons are complete. For example, the method 1600 may check to see whether the subpixel macroblock has reached the lower right hand portion of the interpolated subpixel array. The same one or more of the search engines 1410 that performed the integer search may be used to perform the subpixel search.

At step 1635 the method 1600 determines whether search results for more than one interpolated subpixel array should be concatenated. For example, the configuration parameters transferred to the video compression co-processor 170 may include an indication of whether to reset the results block 1416 (i.e., concatenate search results). If the method 1600 determines that search results should be concatenated, the method 1600 repeats steps 1610 through 1630. If not, the method 1600 transfers the results at step 1640. For example, the video compression co-processor 170 may transfer the subpixel SAD value, corresponding horizontal and vertical coordinate, and/or corresponding relative distance to the EMV to the object array 105. According to one embodiment, the video compression co-processor 170 performs the transfer using three party line communication channels within a set of objects 115. The first party line may be used to transfer a sixteen-bit SAD value, the second party line may be used to transfer a fourteen-bit horizontal address, and the third party line may be used to transfer a fourteen-bit vertical address. Of course, the results may be transferred in other ways.

Figure 17:
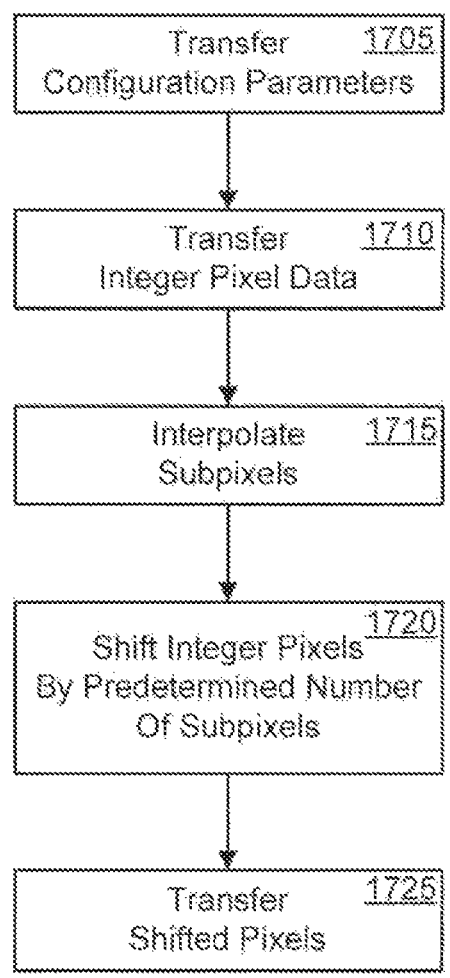
FIG. 17 is a flowchart illustrating a method of shifting an array of integer pixels by a specified number of subpixels, according to one embodiment.

FIG. 17 is a high-level flowchart of method 1700 of shifting an array of integer pixels by a specified number of subpixels, according to one embodiment. The method 1700 first checks whether the subpixel interpolator 1420 is ready to be configured. For example, the video compression co-processor 170 may wait for an active level on a ready-to-configure signal. When the subpixel interpolator is ready to be configured, the method 1700 transfers configuration parameters to the video compression co-processor 170 at step 1705. For example, the configuration parameters may include an indication of the partition size (e.g., a 16-by-16 pixels, a 8-by-16 or 16-by-8 pixels, a 8-by-8 pixels, a 2-by-2 pixels, etc.), an indication of the subpixel resolution (e.g., H.264 quarter pixel, H.264 eighth pixel, or MPEG2 half pixel), a horizontal shift value (e.g., shift left by ⅞ subpixels, shift right by ¼ subpixels, no horizontal shift, etc.), a vertical shift value (e.g., shift up by ⅞ subpixels, shift down by ¼ subpixels, no vertical shift, etc.), an alignment value (e.g., how many integer pixels to ignore at the beginning of each integer pixel row), the number of pixels to be transferred per row (e.g., 16 pixels, 32 pixels, or 64 pixels), the number of IRAMs 160 containing integer pixel data, and the number of bits per pixel (e.g., 10-bit pixels, 11-bit pixels, or 12-bit pixels).

At step 1710, the method 1700 transfers the appropriate integer pixel data to the video compression co-processor 170. By way of example, integer pixels from a search window may be transferred to the interpolator pixel memory 1464 via party line communication channels within a set of objects 115 in the array 105 or via the DMA engine 180 (see, e.g., FIG. 6). If the interpolator pixel memory 1464 is sized to store a set of 28-by-28 integer pixels, twenty eight pixels will be stored per row and twenty eight rows will be stored so that the subpixel interpolator 1420 can interpolate subpixels and perform the shift. Step 1710 can be performed before, after, or at the same time as step 1705.

Before interpolating subpixels at step 1715, the method 1700 first checks whether the subpixel interpolator 1420 is ready to start. For example, the video compression co-processor 170 may wait for an active level on a ready-to-start signal. When the subpixel interpolator 1420 is ready to start, the method 1700 interpolates subpixels at step 1715. For example, the subpixel interpolator 1420 may interpolate quarter pixels. It should be noted that the array of interpolated subpixels still includes the integer pixel values (except subpixels are now interspersed between the integer pixels).

At step 1720, the method 1700 shifts the array of integer pixels by a predetermined number of subpixels. For example, the method 1700 may start with the location of an integer pixel within the array of interpolated subpixels, and move left by ¾ pixels and move up by ¾ pixels to arrive at the shifted location. The shifted integer pixels may be stored in a shifted pixel memory 1424. Additional details of interpolating subpixels and shifting integer pixels by a predetermined number of subpixels will be discussed in more detail below.

The method 1700 transfers the shifted pixels at step 1725 (e.g., if the partition size was 2-by-2, four pixels are returned, if the partition size was 16-by-16, 256 pixels are returned, etc.). For example, the video compression co-processor 170 may transfer the shifted pixels to the object array 105 in raster scan order (e.g., transfer each row of pixels from left to right and transfer the rows from top to bottom). The video compression co-processor 170 may transfer the shifted pixels to the object array 105 in macroblock column order. For example, if a sixteen-by-sixteen array is divided into four-by-four subpartitions A-N, P, and Q (see, e.g., FIG. 30), the video compression co-processor 170 may return the subpartitions in order (A followed by E, followed by I, followed by M, followed by B, followed by F, followed by J, and so forth). Each four-by-four subpartition may itself be returned in raster scan order. Returning the shifted pixels in macroblock column order allows initial results to be transferred to the array while additional results are being interpolated thereby increasing throughput. The shifted pixels may be transferred after being interpolated or the shifted pixels may be stored in the shifted subpixel memory 1424 until the application running on the object array 105 requests the shifted pixels to be transferred. According to one embodiment, the video compression co-processor 170 performs the transfer using one party line communication channel within a set of objects 115.

Data Transfers

Once configured and initiated, the video compression co-processor 170 operates, for the most part, independently of an application running on the object array 105. The video compression co-processor 170 should, however, be supplied pixels at a certain minimum rate. According to one embodiment, the clock driving the objects 115 (e.g., core clock) is separated from the clock driving the video compression co-processor 170. Driving the video compression co-processor 170 with a separate clock can save power and also allow the video compression co-processor 170 to operate at a different (e.g., higher) frequency. According to one embodiment, a phase lock loop (PLL) is used to generate the video compression co-processor 170's clock such that the core clock operates no slower than ¼ of the video compression co-processor 170 clock rate so that data can cross clock domains. The relative clock rate may be set based on the amount of data needed per clock cycle. For example, if the video compression co-processor 170 needs to receive four pixels from the application per clock cycle (i.e., the video compression co-processor 170 clock) and the interface between the video compression co-processor 170 and the application is eight pixels wide, the application need only run at ½ of the video compression co-processor 170 clock rate to meet the four pixels per clock rate requirement. It should be noted, however, that supplying data at a slower rate will not cause a malfunction but will only reduce the operating performance of the video compression co-processor 170.

Thus, as can be appreciated, the FPOA 100 and the video compression co-processor 170 transfer and process a significant amount of video data. For example, pixel data may be transferred to one or more IRAMs 160 from external memory 520 (via the XRAM interface 155). In addition, pixel data may be transferred to memory within the video compression co-processor 170 from one or more IRAMs 160. According to one embodiment, the bandwidth needed to transfer search window pixels to the video compression co-processor 170 is higher than the bandwidth needed to transfer macroblock pixels to the video compression co-processor 170 and to transfer the results from the video compression co-processor 170 back to the object array 105. For example, a 1080i high definition video resolution delivering 30 frames per second requires processing approximately 245K macroblocks per second. Thus, the search window pixel bandwidth needed to provide an entire 512-by-64 pixel search window for each macroblock is approximately 10 GigaPixels per second (and each pixel may be approximately one or two bytes per pixel). The video compression co-processor 170 uses several techniques to help minimize data transfer bandwidth.

Figure 18:
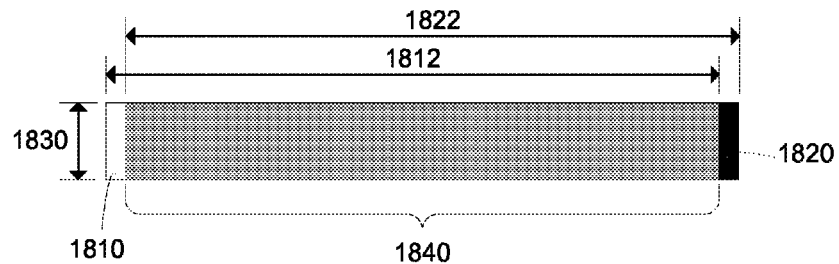
FIG. 18 is a diagram illustrating reuse of previously transferred search window pixel data to save data transfer bandwidth, according to one embodiment.

Once such bandwidth minimizing technique is illustrated in FIG. 18. It may be desirable to search an entire video frame 700 (or at least a portion larger than one search window 710) for a macroblock 720 instead of just searching for the macroblock 720 in one search window 710. For example, the video compression co-processor 170 may search both search window 1810 (e.g., a pixel array having a horizontal width 1812 equal to 512 pixels and a vertical height 1830 equal to 64 pixels) and search window 1820 (e.g., another pixel array having a horizontal width 1822 equal to 512 pixels and a vertical height 1830 equal to 64 pixels). When first loading pixel data from one search window 710 into one or more IRAMs 180, a relatively large amount of data needs to be transferred. For example, if the search window 1810 is 512-by-64 pixels, a sixteen pixel skirt is provided below the search window 1810, and each pixel occupies two byes, then approximately 80K bytes of data needs to be transferred from external memory 520 to one or more IRAMs 160. However, if the next search window 1820 overlaps the previous search window 1810 by pixels 1840 (e.g., 496 pixels) as shown in FIG. 18, a smaller amount of data needs to be transferred. For example, if the next search window 1820 is moving over by sixteen pixels (e.g., one 16-by-16 macroblock), only 2.5K bytes of additional data needs to be transferred from external memory 520 to one or more IRAMs 160.

In a similar vein, if another search window (e.g., located sixteen rows below search windows 1810 and 1820) will be searched, additional bandwidth can be saved by reusing data. For example, instead of returning to the far left side of the video frame 700, the next search window could descend one macroblock (e.g., sixteen pixel rows) and traverse the row in right to left order, saving approximately ¾ of the bandwidth that would be needed to reload the entire search window.

Yet another bandwidth minimizing technique is to store video frame pixel data in raster scan order in the external memory 520. For example, eight-bit pixels can align on either word or byte boundaries (aligning on word boundaries helps reduce bandwidth), and ten-bit or twelve-bit pixels can align on sixteen-bit word boundaries (the extra six or four bits may remain unused). While the XRAM interface 155 can transfer 32 bytes of data over a 64-bit interface or 36 bytes of data over a 72-bit interface, transferring 32 bytes of data over the 64-bit interface may occur more often in moving the video frame pixel data. For example, when transferred pixel data from external memory 520 to IRAM, 16 contiguous pixels are often read. If each pixel occupies 2 bytes, a 16 contiguous pixels transfer conveniently matches the 64-bit interface (which transfers 32-bytes at a time). In addition, placing sequential rows of a given video frame into different memory banks allows the external memory to achieve optimal transfer rates during reads by hiding a precharge of one bank while accessing another bank (e.g., external memory containing at least 1 Gbit may contain eight banks while external memory containing less than 1 Gbit may contain only four banks).

Pixel data may be transferred to one or more IRAMs 160 from the external memory 520 (via the XRAM interface 155) using (1) the DMA engine 180 or (2) or party line communication channels within a set of objects 115 in the array 105. Transferring the pixel data from the external memory 520 to the IRAMs 160 using the party line communication channels may offer advantages over using the DMA engine 180. For example, the party line communication channels allow pixel data to be spread across multiple IRAMs 160 (whereas the DMA engine 180 may not). In addition, the party line communication channels allow the data to be reformatted when writing to the IRAMs 160 (e.g., one or more of the objects 115 can reformat the data).

Figure 19:
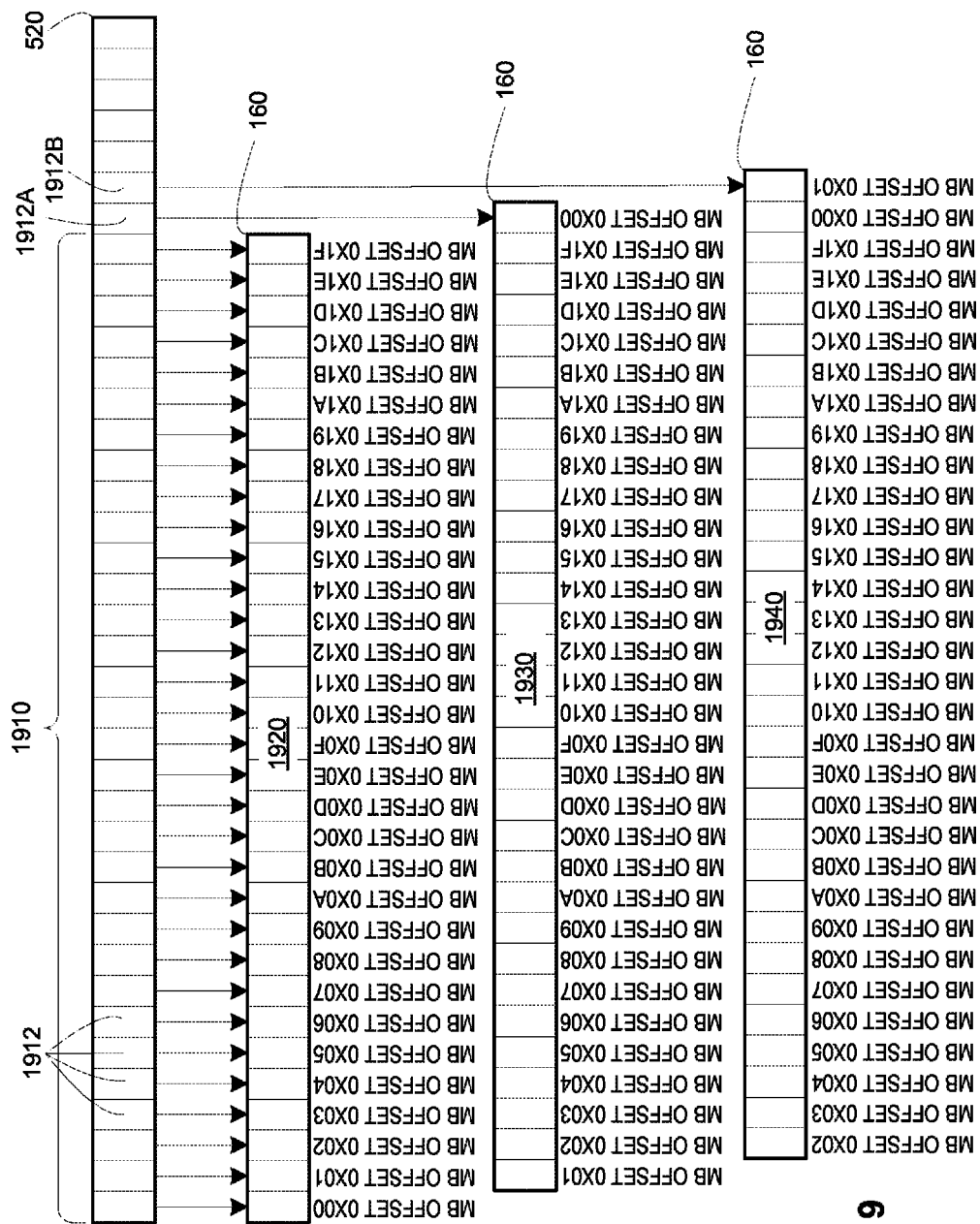
FIG. 19 is a diagram illustrating transferring search window pixel data from external memory, according to one embodiment.

FIG. 19 illustrates one example of transferring video frame pixels data from the external memory 520 to the IRAMs 160. The external memory 520 has stored therein video frame pixel data in raster scan order. FIG. 19 shows an entire search window row 1910 of data (e.g., 512 pixels) occupying 32 columns 1912 (e.g., each column 1912 represents a 16-pixel-wide macroblock column). The initial transfer of pixel data representing search window 1920 from the external memory 520 to the IRAMs 160 is efficient since the XRAM interface 155 simply opens the appropriate row in the external memory 520 (i.e., the row containing the desired search window data) at the beginning of the row and keeps the row open for 512 pixels (e.g., approximately 80K bytes of data for a 64 row deep search window).

As previously discussed, to save data transfer bandwidth, search windows may overlap (e.g., search windows 1920, 1930, and 1940 contain overlapping data). After initially loading search window 1920 into the IRAMs 160, loading search window 1930 only requires one additional column 1912A (e.g., a 16-pixel-wide macroblock column). Likewise, loading search window 1940 only requires one additional column 1912B. Address aliasing can be used to avoid moving search window data within the IRAMs 160. For example, address aliasing can be used to place column 1912A for the second search window 1930 in the same location as the leftmost column in the first search window 1920. Thus, the second search window 1920 can start processing in column 1 (i.e., macroblock (MB) Offset 0x01) and stop in column 32 which aliases back to the location of column 0 (i.e., MB Offset 0x00). Thus, address aliasing allows the use of the same memory footprint in the IRAMs 160.

One possible complication in transferring the additional columns 1912A and 1912B arises depending on how many bytes are used to store a single pixel. For example, if two bytes of external memory are used to store a single pixel, each of the search windows 1920, 1930, and 1940 starts and stops on a 32-byte boundary (conveniently matching the transfer from external memory). However, if one byte of external memory is used to store a single pixel (e.g., 8-bit pixels) only 16-byte transfers are needed. For example, column 1912A would occupy the first 16 bytes in external memory while column 1912B would occupy the second 16 bytes. The application running on the object array 105 should determine whether or not to load a pair of columns (e.g., columns 1912A and 1912B) at a time.

As previously discussed with reference to FIG. 6, pixel data may be transferred from the IRAMs 160 to the memory within the video compression co-processor 170 using (1) party line communication channels within a set of objects 115 in the array 105 and/or (2) the DMA engine 180. For example, up to eight party line communication channels can be used to transfer eight 2-byte pixels or eight/sixteen 1-byte pixels thereby allowing the core clock to operate at a different clock frequency (e.g., slower) than the video compression co-processor's clock and still maintain data transfer rates necessary for video processing applications. Determining whether to use the DMA engine 180 or the party line communication channels may be guided by several factors. For example, using party line communication channels may result in a higher transfer rate (and higher bandwidth) while using the DMA engine 180 may reduce the number of objects 115 necessary to route data. According to one embodiment, the video compression co-processor 170 uses different circuitry to process pixels arriving from the party line communication channels and the DMA engine 180. Thus, the application running on the object array 105 may switch between the party line communication channels and the DMA engine 180 at operation boundaries. For example, application running on the object array 105 can send integer pixels via the party line communication channels for a current integer search and integer pixels for a subsequent operation (e.g., a subpixel interpolation and/or search) via the DMA engine 180.

Figure 20A:
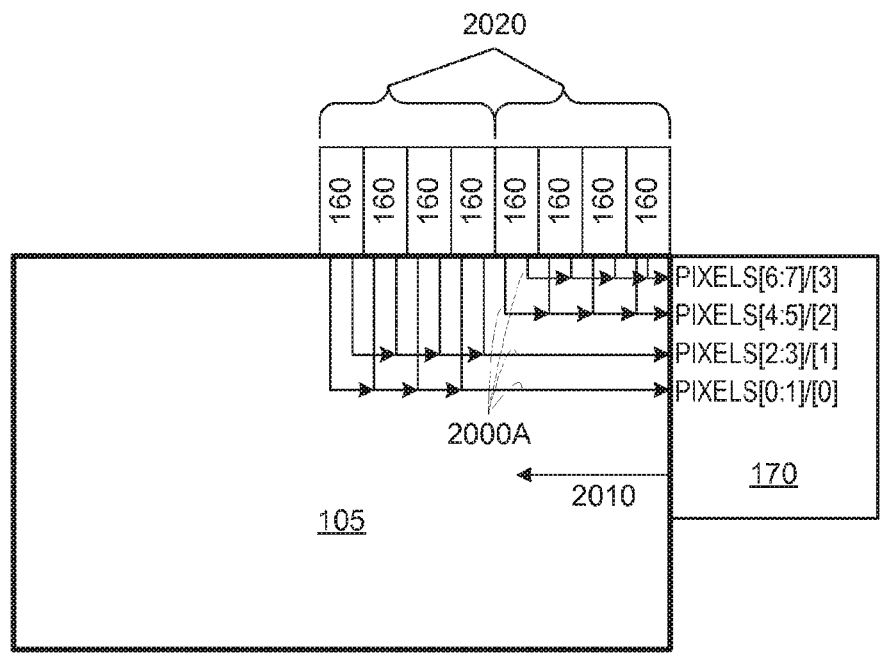
FIGS. 20A and 20B are diagrams illustrating transferring search window pixel data to a video compression co-processor using party lines, according to various embodiments.
Figure 20B:
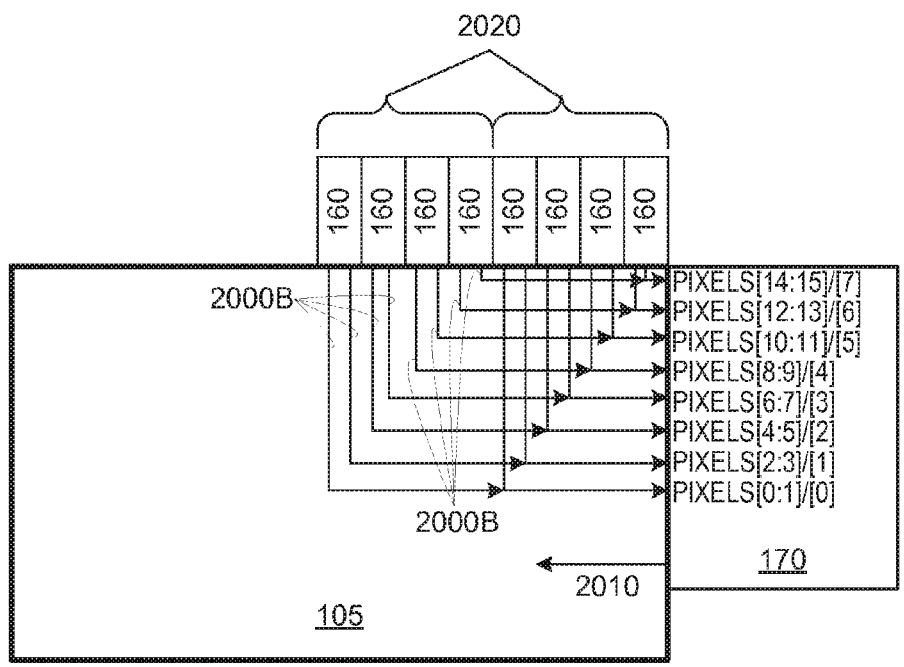

FIGS. 20A and 20B are diagrams illustrating the transfer of search window pixel data from the IRAMs 160 to the video compression co-processor 170 using party line communication channels. As shown in the FIG. 20A embodiment, four party line communication channels 2000A are used to transfer eight one-byte pixels or four two-byte pixels. Thus, eight eight-bit pixels can be transferred per clock or four ten-bit (or twelve-bit) pixels can be transferred per clock. The FIG. 20B embodiment shows using eight party line communication channels 2000B to transfer sixteen one-byte pixels or eight two-byte pixels. Thus, sixteen eight-bit pixels can be transferred per clock or eight ten-bit (or twelve-bit) pixels can be transferred per clock. The application running on the object array 105 can switch between transfer modes (e.g., using four or eight party line communication channels) when the video compression co-processor 170 is idle. Of course, any number of party line communication channels may be used to transfer data depending on the application.

To manage data flow, the application running on the object array 105 monitors a send-macroblock-column signal 2010 (e.g., waits for an active level). Once determining that data may be transferred, the application should deliver data at a certain rate to keep the video compression co-processor 170 operating at full capacity. For example, when the video compression co-processor 170 indicates that it is ready to receive a macroblock column, the macroblock column may need to be transferred within the next 4*(search window height) video compression co-processor clocks to prevent the video compression co-processor 170 from idling. If the video compression co-processor 170 does not have data to process, the video compression co-processor 170 simply waits for the data to arrive.

As shown in FIGS. 20A and 20B, data from the IRAM 160 on the left hand side of the figure may need to travel further than data from the IRAM 160 on the right hand side. Thus, the video compression co-processor 170 supports a programmable delay on each party line communication channel (e.g., 0-3 clocks) to accommodate the difference in pipeline delay for the pixel data arriving from each IRAM. The programmable delay may be static and set when the FPOA 100 is initialized. If the party line communication channels include a valid indication, the valid indication can also be delayed by a certain number of clocks (e.g., 0-3 clocks). The IRAMs 160 may be configured as double buffers 2020 which will be described in more detail with respect to FIG. 22.

Figure 21:
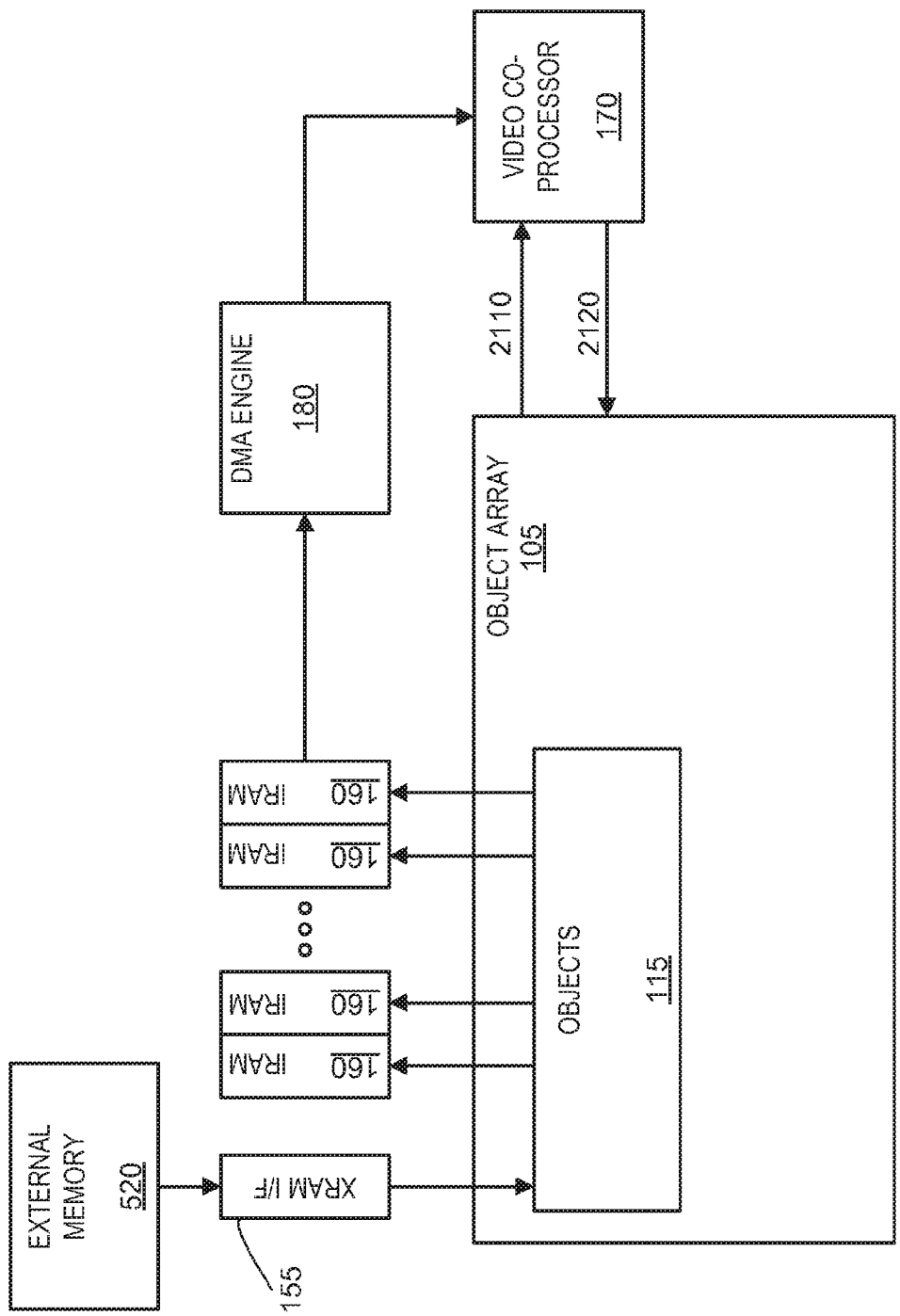
FIG. 21 is a diagram illustrating transfer of search window pixel data to a video compression co-processor using a DMA engine, according to one embodiment.

FIG. 21 is a diagram illustrating the transfer of search window pixel data from the IRAMs 160 to the video compression co-processor 170 using the DMA engine 180. As previously described, pixel data may be transferred from external memory 520 (via the XRAM interface 155) to the object array 105 (e.g., sixteen twelve-bit pixels per read or thirty-two eight-bit pixels per read). One or more objects 115 may process and/or format the data (e.g., apply an entropy filter, perform resolution manipulation, and perform sub-pixel operations) and store the data within one or more IRAMs 160. The application running on the object array 105 can then instruct the DMA engine 180 to transfer the data from one or more IRAMs 160 to the video compression co-processor 170. As previously described, the video compression co-processor 170 can receive other data 2110 (e.g., macroblock pixel data and configuration data) from the object array 105 and transfer result data 2120 (e.g., shifted integer pixels, SAD values, corresponding horizontal and vertical coordinates, and/or corresponding relative distances to the EMV).

When transferring data to the video compression co-processor 170, two or more IRAMs 160 (e.g., two IRAMs 160) may operate simultaneously to provide full bandwidth. The video compression co-processor 170 can differentiate between multiple IRAMs 160 using source addresses. For example, IRAM A could have a two-bit source address of 00, IRAM B could have a two-bit source address of 01, IRAM C could have a two-bit source address of 10, and IRAM D could have a two-bit source address of 11. As will be described in more detail below, data representing a macroblock column (e.g., a 16-by-64 array of pixels) may be spread across four IRAMs 160 (e.g., pixels in row 0, columns 0-1 may be in IRAM A; pixels in row 0, columns 2-3 may be in IRAM B; pixels in row 0, columns 4-5 may be in IRAM C; and pixels in row 0, columns 6-7 may be in IRAM D; and so forth). If a macroblock column is spread across four IRAMs 160, four independent DMA transfers may be needed to move the macroblock column to the memory within the video compression co-processor 170.

Transferring search window pixel data from the IRAMs 160 to the video compression co-processor 170 using the DMA engine 180 may offer several advantages. For example, the IRAMs 160 used to store the search window pixel data can be located closer to the XRAM interface 155 than the video compression co-processor 170, thereby helping to reduce the data routing complexity from XRAM interface 155 to the IRAMs 160. In addition, no party line communication channels are needed to move the data from the IRAMs 160 to the video compression co-processor 170. Further, objects 115 that would otherwise be responsible for transferring data from the IRAMs 160 to the video compression co-processor 170 may perform other functions if the DMA engine 180 is responsible for moving the data.

Figure 22:
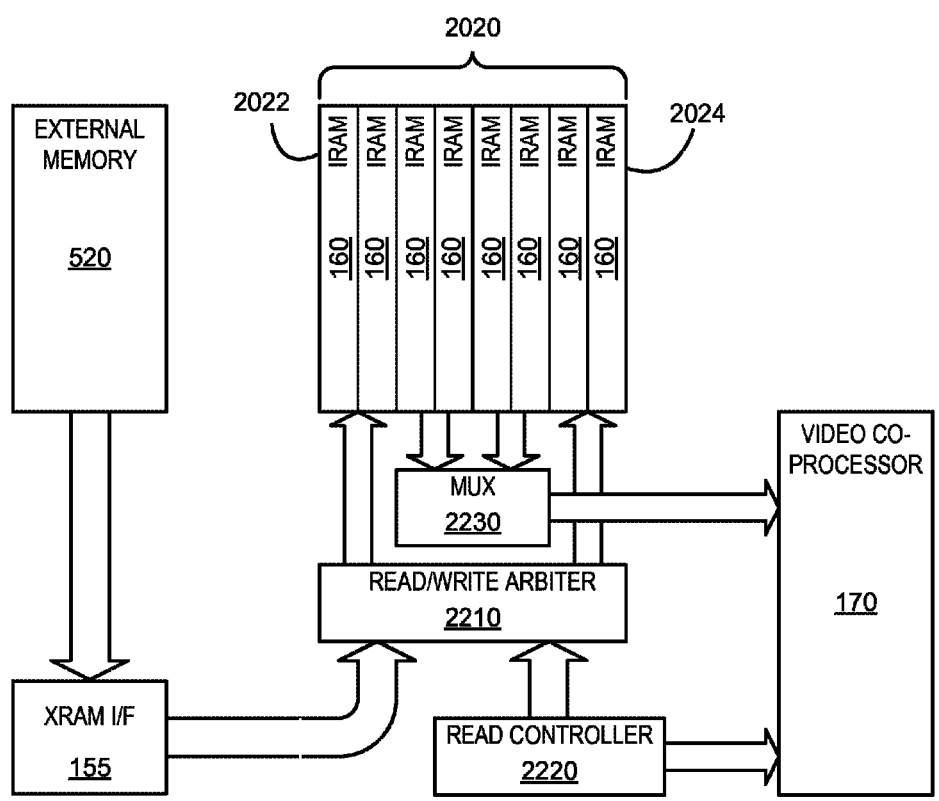
FIG. 22 is a block diagram illustrating double buffering search window buffers within an internal RAM (IRAM) periphery object, according to one embodiment.

FIG. 22 illustrates one example implementation of a double buffer 2020 within the IRAMs 160. Double buffering within the IRAMs 160 allows the application running on the object array 105 to read data (e.g., data representing a search window) from the external memory 520 (via XRAM interface 155), process and/or format the data, and write to one half of the double buffer (e.g., 2022) while the video compression co-processor 170 reads data (e.g., data representing another search window) from the other half of the double buffer (e.g., 2024) and processes the data. The two sets of IRAMs 160 (i.e., 2022 and 2024) toggle at operation boundaries (i.e., when switching between various search windows). For example, one search window (e.g., search window 1810 shown in FIG. 18) may be first loaded to half 2024 of the double buffer 2020. While the video compress co-processor reads and processes the search window data from that half 2024, another search window (e.g., search window 1820 shown in FIG. 18) may loaded to the other half 2022 of the double buffer 2020.

The double buffer 2020 may comprise any number of IRAMs 160. According to one embodiment, the double buffer 2020 comprises eight IRAMs 160 divided into a first half 2022 of IRAMs 160 (i.e., four IRAMs 160) and a second half 2024 of IRAMs 160 (i.e., another four IRAMs 160). A read/write arbiter 2210 may be provided to control which half of the double buffer 2020 should be written to (e.g., 2022) and which half of the double buffer should be read from (e.g., 2024). A read controller 2220 may monitor the state of the video compression co-processor 170 and make read request to the read/write arbiter 2210. For example, the read controller 2220 may monitor the video compression co-processor 170 to determine when additional data is needed or to determine when the video compression co-processor 170 has finished processing a macroblock column. A multiplexer 2230 may be provided to control which half of the double buffer 2020 should transfer data to the video compression co-processor 170. For example, if party line communication channels are used to transfer data from the IRAMs 160 to the video compression co-processor 170, the multiplexer 2230 can ensure that the proper half of the double buffer 2020 transfers data to the video compression co-processor 170 via the proper party line communication channels. The read/write arbiter 2210, the read controller 2220, and/or the multiplexer 2230 may be implemented using one or more of the objects 115 and/or dedicated hardware.

Figure 23A:
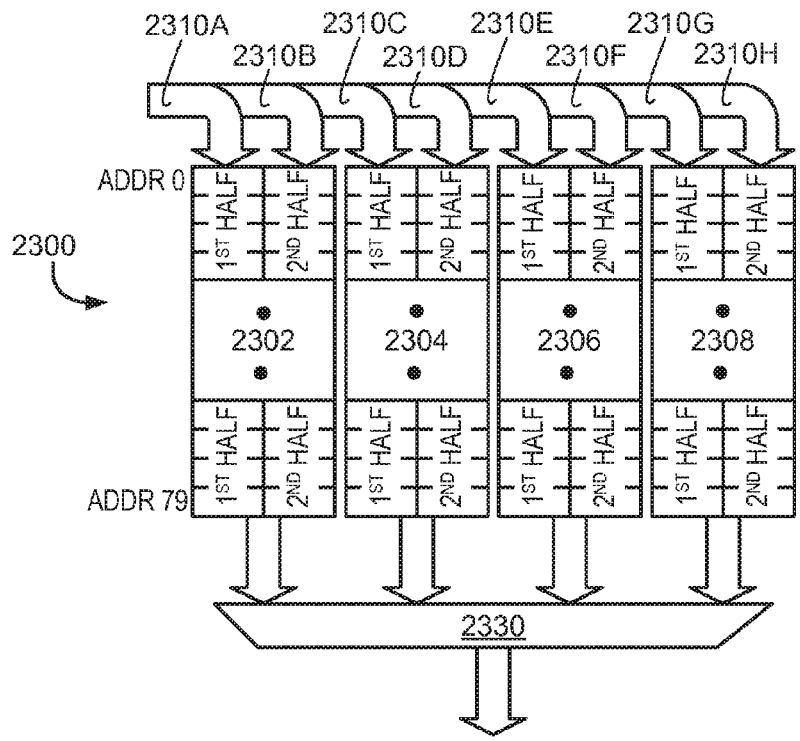
FIG. 23A is a diagram illustrating transfer of search window pixel data to memory within a video compression co-processor, according to one embodiment.
Figure 23B:
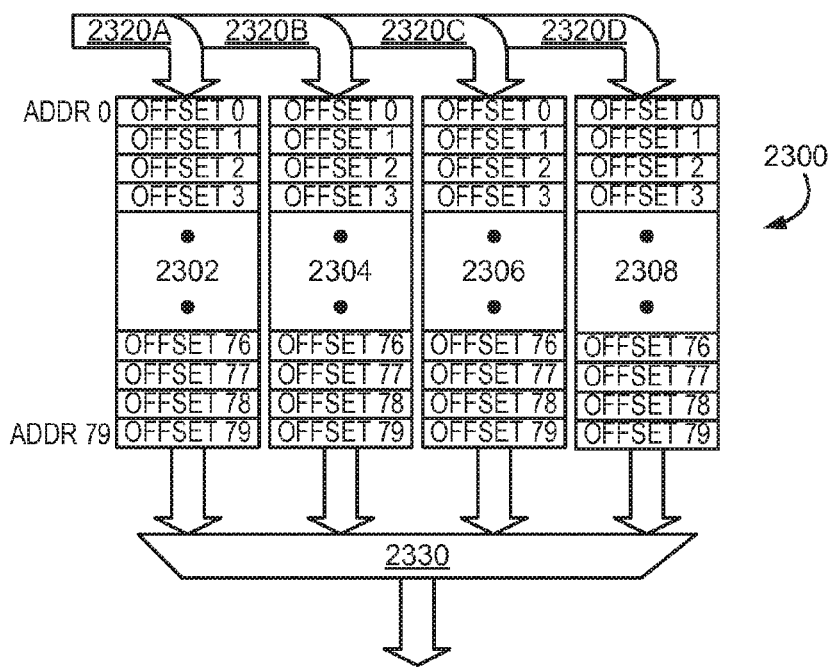
FIG. 23B is a diagram illustrating transfer of search window pixel data to memory within a video compression co-processor, according to another embodiment.

FIGS. 23A and 23B illustrate one example of a memory buffer 2300 that may be used within a video compression co-processor 170. The example memory buffer 2300 shown in FIGS. 23A and 23B comprises four memories: memory 2302; memory 2304; memory 2306; and memory 2308. Each of the memories 2302, 2304, 2306, and 2308 is sized to store a macroblock column (e.g., a 16-by-64 pixel array). However, the memories within the buffer 2300 may be sized to store more or less data. In addition, the buffer 2300 may include additional or fewer memories.

As previously discussed with reference to FIGS. 20A, 20B, and 21, search window pixel data may be transferred to the video compression co-processor 170 using (1) party line communication channels within a set of objects 115 in the array 105 or (2) the DMA engine 180. FIG. 23A illustrates transferring search window pixel data to memories 2302, 2304, 2306, and 2308 in eight pixel blocks 2310A, 2310B, 2310C, 2310D, 2310E, 2310F, 2310G, and 2310H. Thus, a first row of a macroblock column is transferred to memory 2302 in two eight-pixel block transfers (i.e., blocks 2310A and 2310B), a first row of a second macroblock column is transferred to memory 2304 in two other eight-pixel block transfers (i.e., blocks 2310C and 2310D), a first row of a third macroblock column is transferred to memory 2306 in two other eight-pixel block transfers (i.e., blocks 2310E and 2310F), and a first row of a fourth macroblock column is transferred to memory 2308 in two other eight-pixel block transfers (i.e., blocks 2310G and 2310H).

In a similar vein, FIG. 23B illustrates transferring search window pixel data to the memories 2302, 2304, 2306, and 2308 in sixteen-pixel blocks 2320A, 2320B, 2320C, and 2320D. Thus, a first row of a first macroblock column is transferred to the memory 2302 in one sixteen pixel-block transfer 2320A, a first row of a second macroblock column is transferred to the memory 2304 in another sixteen-pixel block transfer 2320B, a first row of a third macroblock column is transferred to the memory 2306 in yet another sixteen-pixel block transfer 2320C, and a first row of a fourth macroblock column is transferred to the memory 2308 in still another sixteen-pixel block transfer 2320D.

As shown in FIGS. 23A and 23B, the memories 2302, 2304, 2306, and 2308 are each eighty rows deep. Thus, the memories 2302, 2304, 2306, and 2308 can store macroblock columns from a search window that is sixty-four pixels high and includes a sixteen pixel skirt (i.e., macroblock columns that are sixteen pixels wide by eighty pixels high). Of course, the memories 2302, 2304, 2306, and 2308 may support larger or smaller macroblock columns.

Initially, the video compression co-processor 170 loads the memory 2302 with a first macroblock column of the search window and the memory 2304 with a second macroblock column of the search window. After the first and second macroblock columns have been loaded into the memories 2302 and 2304, the video compression co-processor 170 can start the search. While searching through the macroblock columns in the memories 2302 and 2304, additional macroblock columns can be stored in the memories 2306 and 2308 (using the DMA engine 180 or the party line communication channels). After searching the macroblock column in the memory 2302, the video compression co-processor 170 continues to search the macroblock columns in the memories 2304 and 2306 (which should be already loaded). While reading from the memories 2304 and 2306, another macroblock column can be stored in the memory 2302. Thus, the video compression co-processor 170 sequentially cycles through the memories 2302, 2304, 2306, and 2308. In other words, the video compression co-processor 170 reads from the memories 2302 and 2304 while data is stored in the memories 2306 and/or 2308, reads from the memories 2304 and 2306 while data is stored in the memories 2308 and/or 2302, reads from the memories 2306 and 2308 while data is stored in the memories 2302 and/or 2304, and so forth. The video compression co-processor 170 includes one or more multiplexers 2330 so that data can be read from the appropriate memory (e.g., the memories 2302, 2304, 2306, and 2308).

An example of four search engines (e.g., search engines A, B, C, and D of FIG. 14) processing search window pixel data will be described with reference to FIGS. 24 and 25. FIG. 24 illustrates a search window 2400 divided into eight macroblock columns (numbered 0 through 7). As shown, each macroblock column is sixteen pixels wide and eighty pixels high (e.g., a sixty-four pixel high search window with a sixteen pixel high skirt). Thus, a search window having 512 horizontal pixels can be divided into thirty-two sixteen pixel wide macroblock columns. Search engines 2410, 2412, 2414, and 2416 each start at the top of search window 2400 and are laterally offset from one another by one pixel (the search engines are shown vertically offset for illustration purposes). For simplicity, this example refers to the search engines moving. It should be noted that the search engines 2410 through 2416 actually represent the relative location of the macroblock (e.g., a sixteen-by-sixteen pixel array) each search engine is processing with respect to the search window 2400.

After performing the appropriate computations (e.g., SAD computations), each search engine moves down by one pixel and performs another computation. The search engines iteratively move down by one pixel and perform additional computations until the search engines reach the bottom of the macroblock columns, or another stopping point (such as halfway down the macroblock column). After reaching the bottom of the macroblock columns (or another stopping point) four pixel columns will be processed (i.e., pixel columns 0-3) and each search engine moves to the right by four pixels. The search engines will again iteratively move down by one pixel and perform additional computations until the search engines reach the bottom of the macroblock columns (or another stopping point), at which point the search engines will move to the right by another four pixels. The search engines repeat the process of (1) iteratively move down by one pixel and perform additional computations and then (2) iteratively moving to the right by four pixels until the entire search window 2400 is processed.

As summarized in Table 1 below, the search engine 2410 starts by processing pixels in pixel columns 0-15, the search engine 2412 starts by processing pixels in pixel columns 1-16, the search engine 2414 starts by processing pixels in pixel columns 2-17, and the search engine 2416 starts by processing pixels in pixel columns 3-18. It should be noted that since each of the search engines 2410 through 2416 is processing a sixteen-by-sixteen pixel macroblock, the search engines are also processing pixels 0-16 in a vertical direction. It should also be noted that on the first pass, the search engine 2410 processes only pixels in the macroblock column 0 while the search engines 2412, 2414, and 2416 process pixels in both macroblock column 0 and macroblock column 1. After the search engines iteratively move down by one pixel and reach the bottom of the macroblock column (or another stopping point), each search engine moves to the right by four pixels. Thus, on the second pass, the search engine 2410 processes pixels in pixel columns 4-19, the search engine 2412 processes pixels in pixel columns 5-20, the search engine 2414 processes pixels in pixel columns 6-21, and the search engine 2416 processes pixels in pixel columns 7-22. The search engines repeat the process of (1) iteratively move down by one pixel and perform additional computations and (2) iteratively moving to the right by four pixels until the entire search window 2400 is processed.

TABLE 1

| Pass | Search Engine 2410 | Search Engine 2412 | Search Engine 2414 | Search Engine 2416 |
|---|---|---|---|---|
| 1 | 0-15 | 1-16 | 2-17 | 3-18 |
| 2 | 4-19 | 5-20 | 6-21 | 7-22 |
| 3 | 8-23 | 9-24 | 10-25 | 11-26 |
| 4 | 12-27 | 13-28 | 14-29 | 15-30 |
| 5 | 16-31 | 17-32 | 18-33 | 19-34 |
| 6 | 20-35 | 21-36 | 22-37 | 23-38 |
| 7 | 24-39 | 25-40 | 26-41 | 27-42 |
| 8 | 28-43 | 29-44 | 30-45 | 31-46 |
| 9 | 32-47 | 33-48 | 34-49 | 35-50 |
| 10 | 36-51 | 37-52 | 38-53 | 39-54 |
| 11 | 40-55 | 41-56 | 42-57 | 43-58 |
| 12 | 44-59 | 45-60 | 46-61 | 47-62 |
| 13 | 48-63 | 49-64 | 50-65 | 51-66 |
| 14 | 52-67 | 53-68 | 54-69 | 55-70 |
| 15 | 56-71 | 57-72 | 58-73 | 59-74 |
| 16 | 60-75 | 61-76 | 62-77 | 63-78 |
| ⋮ | Repeat for subsequent passes until the search window 2400 is fully processed | | | |

FIG. 25 illustrates how a portion of the search window 2400 may be stored in the example memory buffers 2302-2308 described with reference to FIGS. 23A and 23B. As shown in FIG. 25, macroblock column 0 (see FIG. 24) is stored within the memory 2302, macroblock column 1 is stored within the memory 2304, macroblock column 2 is stored within the memory 2306, and macroblock column 3 is stored within the memory 2308. Thus, initially, the memory 2302 stores pixel columns 0-15, the memory 2304 stores pixel columns 16-31, the memory 2306 stores pixel columns 32-47, and the memory 2308 stores pixel columns 48-63. As described with reference to FIG. 24, during the first pass, the search engine 2410 processes pixels in pixel columns 0-15, the search engine 2412 processes pixels in pixel columns 1-16, the search engine 2414 processes pixels in pixel columns 2-17, and the search engine 2416 processes pixels in pixel columns 3-18. During passes 1-4, the search engines 2410-2416 read from the memories 2302 and 2304 (see Table 1, and FIG. 25). While data is being read from the memories 2302 and 2304 during passes 1-4, pixel data can be stored in the memories 2306 and 2308 (i.e., pixel columns 32-63) using the DMA engine 180 or the party line communication channels.

On pass 5, the search engines 2410-2416 no longer need the pixel data stored in the memory 2302 (i.e., pixel columns 0-15) and instead process pixel data stored in the memories 2304 and 2306. While data is being read from the memories 2304 and 2306 during passes 5-8, new pixel data can be stored in the memory 2302 (i.e., pixel columns 64-79) using the DMA engine 180 or the party line communication channels. In addition, additional data may be stored in the memory 2308 as needed (e.g., if pixel columns 48-63 had not been fully transferred). Likewise, on pass 9, the search engines 2410-2416 no longer need the pixel data stored in the memory 2304 (i.e., pixel columns 16-31) and instead process pixel data stored in the memories 2306 and 2308. While data is being read from the memories 2306 and 2308 during passes 9-12, new pixel data can be stored in the memory 2304 (i.e., pixel columns 80-95) using the DMA engine 180 or the party line communication channels. The process of reading from two memories while writing (or finishing writing) additional pixel data to two other memories continues until the search window 2400 is fully processed. Table 2 summarizes the read/write operations in the memories 2302-2308 for various passes of the search engines 2410-2416.

TABLE 2

| Pass | Read From Memories | Write To Memories |
|---|---|---|
| 1 | 2302 and 2304 | 2306 and/or 2308 |
| 2 | | |
| 3 | | |
| 4 | | |
| 5 | 2304 and 2306 | 2308 and/or 2302 |
| 6 | | |
| 7 | | |
| 8 | | |
| 9 | 2306 and 2308 | 2302 and/or 2304 |
| 10 | | |
| 11 | | |
| 12 | | |
| 13 | 2308 and 2302 | 2304 and/or 2306 |
| 14 | | |
| 15 | | |
| 16 | | |
| ⋮ | Repeat for subsequent passes until the search window 2400 is fully processed | |

After reaching the end of the search window 2400, the application running on the object array 105 can either wait or immediately start transmitting pixel information for a subsequent search window. Regardless of whether additional macroblock column data is transferred, the video compression co-procession 170 keeps track of the last macroblock column in the search window 2400 (e.g., macroblock column 31 of a search window having 512 horizontal pixels) for purposes of returning the search results for the search window 2400 (e.g., the best SAD value, the corresponding horizontal and vertical coordinates, and the relative distance).

The video compression co-processor 170 may provide a flow-control mechanism, such as a ready-to-send signal, to let the application running on the object array 105 know whether additional macroblock column data can be transferred. For example, if the ready-to-send signal is high, the application can transfer a macroblock column (e.g., pixel columns 48-63 to the memory 2308) using the DMA engine 180 or the party line communication channels. If there are no additional memories to write data to (e.g., if the search engines are still processing pixel column data in the memory 2302), the ready-to-send signal goes low. When one of the memories again becomes available (e.g., the memory 2302 after the search engines have moved onto pixel columns 16-47 in the memories 2304 and 2306), the ready-to-send signal goes high again.

Thus, as can be appreciated from the previous discussion, using the memory buffer 2300 as described with reference to FIGS. 24 and 25 allows a relatively large amount of data (i.e., the search window 2400) to be searched using a memory buffer having a relatively small memory footprint. The total number of memories 2300 and the size of each memory may be depend upon several factors, such as the number of bits used to encode pixel data, the data transfer rate, and how quickly the video compression co-processor can perform the computations. In general, minimizing the total size of the memories used within the video compression co-processor 170 helps reduce the amount of hardware required to implement the memories and reduces the amount of area within the FPOA 100 dedicated to implementing the memories.

While one example of four search engines processing search window pixel data was described with reference to FIGS. 24 and 25, other configurations are possible. For example, more than (or less than) four memories 2300 may be used depending on how quickly the data is processed. In addition, the macroblock that each search engine compares against corresponding pixels in the search window may be larger or smaller than sixteen-by-sixteen pixels and may utilize the memories within the video compression co-processor 170 differently. Further, more or fewer search engines may be provided requiring the use of additional or fewer memories.

The memory buffer 2300 described with reference to FIGS. 23A and 23B may be used within the video compression co-processor 170 for any of its memories. For example, a memory buffer similar (or identical) to the memory buffer 2300 may be used for the integer search memory 1462 (see FIG. 14) and/or the interpolator memory 1464 to allow an application running on the object array 105 to begin supplying additional pixel data for subsequent operations while a current operation is in progress (helping to increase throughput). In addition, a memory buffer similar (or identical) to the memory buffer 2300 may be used for the integer macroblock memory 1452 and/or the subpixel macroblock memory 1454 to allow the application to begin supplying additional macroblock pixel data for a subsequent search while a current search is being performed. Further, a memory buffer similar (or identical) to the memory buffer 2300 may be used for configuration memories storing configuration data 1440 to allow the application to supply new configuration data for subsequent operations while the current operation is in progress. Further still, a memory buffer similar (or identical) to the memory buffer 2300 may be used for the subpixel search memory 1422 so that the subpixel interpolator 1420 can interpolate subpixels from another set of integer pixels and store the subpixels in part of the double buffer (e.g., two of the memories 2304-2308) while the search engines 1410 read and process the previously interpolated subpixels in another portion of the double buffer (e.g., the two other memories 2304-2308). Similarly, the shifted subpixel memory 1424 may use a memory buffer similar (or identical) to the memory buffer 2300 so that the subpixel interpolator 1420 can perform another interpolation and shift while previously shifted integer pixels 1470 are being transferred (or waiting to be transferred) to the array 105 of objects 115. The memories within the results block 1416 may also use a memory buffer similar (or identical) to the memory buffer 2300 so that additional search results can be stored in the results block while previous search results 1480 and 1490 are being transferred (or waiting to be transferred) to the array 105 of objects 115.

Figure 26:
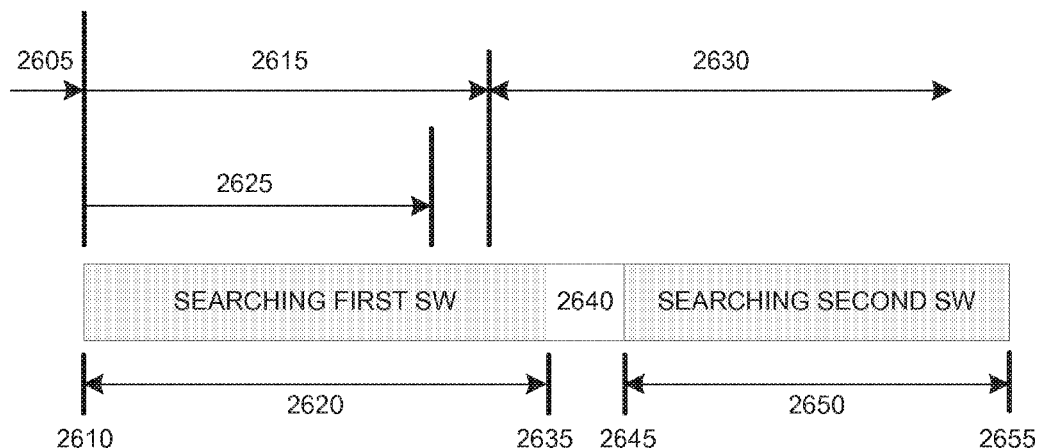
FIG. 26 is a diagram illustrating that additional data may be transferred to memory within a video compression co-processor while the video compression co-processor searches previously transferred search window pixel data, according to one embodiment.

FIG. 26 is a diagram illustrating one example of the timing of various data transfers (e.g., search window pixel data, macroblock data, and configuration data) while a search is being performed. Before a search begins, at least a portion of the search window pixel data (e.g., one or two macroblock columns) are transferred to the video compression co-processor 170, as indicated by period 2605. The video compression co-processor 170 beings searching a first search window after receiving sufficient data, as indicated by point 2610. Additional pixel data for the first search window (e.g., additional macroblock columns) is transferred to the video compression co-processor 170 (period 2615), while the first search window is being searched (period 2620). In addition, one or more macroblocks for a subsequent search or search window and/or additional configuration information may also be loaded while the video compression co-processor 170 is searching the first search window (period 2625). Period 2625 will generally be shorter than period 2615 since the macroblock(s) and configuration data will generally take less time to transfer. Search window pixel data for a second search window may start loading (period 2630) before the video compression co-processor 170 finishes searching the first search window (point 2635). The video compression co-processor 170 may wait for a period of time (period 2640) before beginning to search the second search window at point 2645 (e.g., wait for the compressor trees to complete their computations). While the video compression co-processor 170 is searching the second search window (period 2650), additional pixel data for the second search window is transferred (period 2630). At point 2655, the video compression co-processor 170 finishes searching the second search window. Of course, data for subsequent search windows may be loaded in a similar manner.

The application running on the object array 105 may choose to store data within the IRAMs 160 in any format. To optimize data throughput, the application may strategically arrange search window data within one or more IRAMs 160. In particular, the search window data may be arranged in a particular order and format within the IRAMs 160 based on (1) whether the DMA engine 180 or the party line communication channels are used to transfer data from the IRAMs 160 to memory within the video compression co-processor 170, (2) whether eight, ten, or twelve bit pixels are used to store pixel data, and/or (3) how many IRAMs 160 are being used to store pixel data.

For example, assuming that the party line communication channels are used to transfer data spread across four IRAMs 160, the data format within the IRAMs 160 may depend on whether eight, ten, or twelve bit pixels are used. If ten or twelve bit pixels are used, a 496-by-48 pixel search window (along with a 16 pixel wide skirt to the right and bottom of the search window) may be stored in the four IRAMs 160 by partitioning each IRAM into two sixteen bit segments (six or four bits of which may remain unused). If eight-bit pixels are used, a 496-by-64 pixel search window (along with a 15-pixel-wide skirt to the right and bottom of the search window) may be stored in the four IRAMs 160 by partitioning each IRAM into four eight-bit segments. It should be noted that if eight bits are used, the search window can contain an extra sixteen pixels in the horizontal direction (assuming the same size IRAMs). When eight-bit pixels are used, an entire row of a sixteen-pixel-wide macroblock column fits across four IRAMs (e.g., pixel columns 0-3 are stored in the first IRAM, pixel columns 4-7 are stored in the second IRAM, pixel columns 8-11 are stored in the third IRAM, and pixel columns 12-15 are stored in the fourth IRAM). If ten or twelve bit pixels are used, only half of a row of a sixteen pixel macroblock column (i.e., pixel columns 0-7) fits across four IRAMs. The second half of the row (i.e., pixel columns 8-15) are stored in the next address location. For example, address 0 of the four IRAMs would contain the first row of pixel columns 0-7, address 1 of the four IRAMs would contain the first row of pixel columns 8-15, address 2 of the four IRAMs would contain the second row of pixel columns 0-7, address 3 of the four IRAMs would contain the second row of pixel columns 8-15, and so forth.

Data may also be stored in a specific format within one or more IRAMs 160 to accommodate data transfers using the DMA engine 180. In particular, because the DMA engine 180 can transfer 36-bits from two consecutive IRAM addresses (e.g., address 0 and 1) during the same clock, data may be lost if a macroblock column were spread across four IRAMs. For example, if eight-bit pixels are used, an entire row of a sixteen-pixel-wide macroblock column can fit across four IRAMs (e.g., pixel columns 0-3 can be stored in the first IRAM, pixel columns 4-7 can be stored in the second IRAM, pixel columns 8-11 can be stored in the third IRAM, and pixel columns 12-15 can be stored in the fourth IRAM). However, if the entire row of the sixteen-pixel-wide macroblock column is spread across four IRAMs, data may be lost when the DMA engine 180 moves (to the video compression co-processor 170) multiple pixels from the same row in the macroblock column at the same time because the video compression co-processor 170 may not be able to write the data to two locations within its internal memory at the same time. To avoid data loss (and to more closely match the data transfer rate from external memory to the four IRAMs), data may be stored within the four IRAMs in a particular format and order. In particular, the first row of a macroblock column (i.e., row 0, columns 0-15) can be stored in the first two rows of a pair of IRAMs (i.e., addresses 0 and 1 in IRAMs A and B) and the next row of the macroblock column (i.e., row 1, columns 0-15) can be stored in the first two rows of another pair of IRAMs (i.e., addresses 0 and 1 in IRAMs C and D). Subsequent rows of the macroblock column can be stacked on top of each other in a similar manner.

If only one IRAM is used to store eight-bit pixels, the rows of each macroblock column can be stacked on top of each other (e.g., address 0 would contain row 0, columns 0-3, address 1 would contain row 0, columns 4-7, address 2 would contain row 0, columns 8-11, address 3 would contain row 0, columns 12-15, address 4 would contain row 1, columns 0-3, and so forth). If two IRAMs are used to store eight-bit pixels, each row of a macroblock column can be spread across the two IRAMs (address 0 of IRAM A could contain row 0, columns 0-3, address 0 of IRAM B could contain row 0, columns 4-7, address 1 of IRAM A could contain row 0, columns 8-11, address 1 of IRAM B could contain row 0, columns 12-15, and so forth).

In a similar vein, if only one IRAM is used to store ten or twelve bit pixels, the rows of each macroblock column can be stacked on top of each other (e.g., address 0 would contain row 0, columns 0-1, address 1 would contain row 0, columns 2-3, address 2 would contain row 0, columns 4-5, and so forth). Likewise, if two IRAMs are used to store ten or twelve bit pixels, each row of a macroblock column can be spread across the two IRAMs (address 0 of IRAM A could contain row 0, columns 0-1, address 0 of IRAM B could contain row 0, columns 2-3, address 1 of IRAM A could contain row 0, columns 4-5, address 1 of IRAM B could contain row 0, columns 6-7, and so forth). If four IRAMs are used to store ten or twelve bit pixels, each row of a macroblock column can be spread across the four IRAMs (address 0 of IRAM A could contain row 0, columns 0-1, address 0 of IRAM B could contain row 0, columns 2-3, address 0 of IRAM C could contain row 0, columns 4-5, address 0 of IRAM D could contain row 0, columns 6-7, address 1 of IRAM A could contain row 0, columns 8-9, and so forth).

In order to allow different search windows to store data in different formats (perhaps due to multiple streams) and still use the DMA engine 180 to transfer data to the video compression co-processor 170, information identifying the format transfers, such as tag bits, may be sent along with the pixel data. For example, a tag bit may indicate whether one-byte or two-byte pixels are used, two tag bits may indicate how many IRAMs contain each macroblock row (e.g., one, two or four IRAMs), and another two tag bits may indicate the source of the data (e.g., IRAM A, B, C, or D). The tag bits may be spread across the IRAM address (e.g., half of the tag bits may be stored in even IRAM address while the other half of the tag bits may be stored in odd IRAM addresses).

Search Engine Slice(s)

As previously described with reference to FIG. 14, a video compression co-processor 170 may include one or more search engines 1410 operating independently, but in lock-step with one another. Any practical number of the search engines 1410 can be incorporated into the video compression co-processor 170 to achieve the desired performance goals. For example, a video compression co-processor 170 may be provided with a single search engine to help minimize the amount of area within the FPOA 100 dedicated specifically to video processing and conserve resources within the FPOA 100. If additional computational throughput is desired, the video compression co-processor 170 may be provided with additional search engines with minimal modifications to other circuitry within the video compression co-processor 170. One embodiment of the video compression co-processor 170 includes four search engines.

Figure 27:
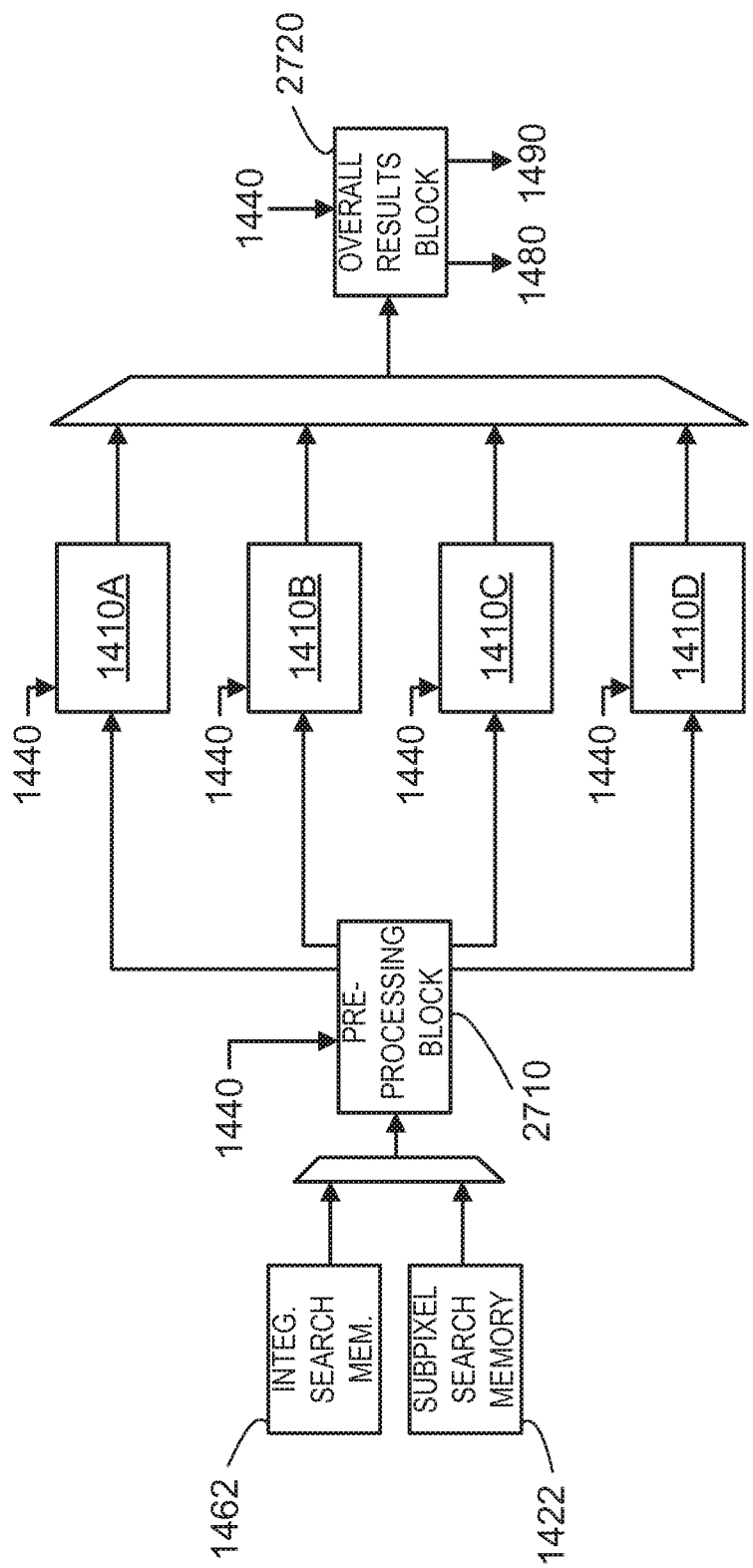
FIG. 27 is a block diagram illustrating additional details of the video compression co-processor of FIG. 14.

FIG. 27 is a block diagram illustrating additional details of the video compression co-processor of FIG. 14. As previously discussed, the search engines 1410 may perform searches on any type of data (e.g., integer pixels or subpixels). For example, when performing an integer search, a first search engine 1410A may begin by processing data in pixel columns 0-15, a second search engine 1410B may begin by processing data in pixel columns 1-16, a third search engine 1410C may begin by processing data in pixel columns 2-17, and a forth search engine 1410D may begin by processing data in pixel columns 3-18 (see FIG. 29). By way of another example, when performing a subpixel search, each search engine 1410A-1410D may process different pixel strides. For instance, when performing a search with a quarter pixel resolution, search engine 1410A may process pixels in the integer pixel stride, search engine 1410B may process pixels in the ¼ pixel stride, search engine 1410C may process pixels in the ½ pixel stride, and search engine 1410D may process pixels in the ¾ pixel stride. It should be noted that interpolated subpixels are interspersed between the integer pixels. Thus, an array of interpolated subpixels might be ordered integer pixel, ¼ subpixel, ½ subpixel, ¾ subpixel, integer pixel, ¼ subpixel, and so forth in both the horizontal and vertical directions.

A preprocessing block 2710 may be provided to reformat pixels in each pixel row based on the type of search. For example, the application running on the object array 105 could send configuration data 1440 to the preprocessing block 2710 indicating how each pixel row should be formatted. For instance, if a search is being performed with a quarter subpixel resolution, the preprocessing block 2710 may reformat each pixel row (or select pixels in each row) such that integer pixels are adjacent integer pixels, ¼ subpixels are adjacent ¼ subpixels, ½ subpixels are adjacent ½ subpixels, and ¾ subpixels are adjacent ¾ subpixels. Thus, instead of sending a pixel row having integer pixels, subpixels ¼, ½ subpixels, and ¾ subpixels to each search engine, the pixel rows sent to each search engine will only contain the appropriate pixels (e.g., only integer pixels, ¼ subpixels, ½ subpixels, or ¾ subpixels).

The pixel rows themselves are transferred to each search engine in order (e.g., a row of integer pixels, a row of ¼ subpixels, a row of ½ subpixels, a row of ¾ subpixels, another row of integer pixels, another row of ¼ subpixels, and so forth). As will be described in more detail with respect to FIG. 28, the pixel rows are shifted though an N-stage pipeline to help ensure that the appropriate subpartition receives the appropriate pixel row. In other words, the select lines of a plurality of pixel row multiplexers in each search engine are set such that each pixel row multiplexer steers a desired pixel row to a desired subpartition on a desired clock cycle. Thus, through a combination of the preprocessing block 2710 and the pixel row multiplexers, each pixel in a given row and the pixel rows themselves are delivered to an appropriate search engine and an appropriate subpartition within each search engine at an appropriate clock cycle. In other words, by reformatting the data, the search engines can be identical and still perform any type of search. Of course, the preprocessing block 2710 could also reformat pixel rows themselves so that each search engine 1410A-14100 receives the proper data.

An overall results block 2720 may be provided to determine the best SAD values (along with its corresponding coordinates and/or distance to the EMV) from each search engine (e.g., search engines 1410A through 1410D). In other words, the overall results block 2720 determines the best of the best SAD values determined by each search engine. The integer search results 1480 (e.g., one or more integer SAD values, corresponding horizontal and vertical coordinates, and/or corresponding relative distances to the EMV) and/or the subpixel search results 1490 (e.g., one or more subpixel SAD values, corresponding horizontal and vertical coordinates, and/or corresponding relative distances to the EMV) may be transferred to the object array 105 via the application interface 1430.

Figure 28:
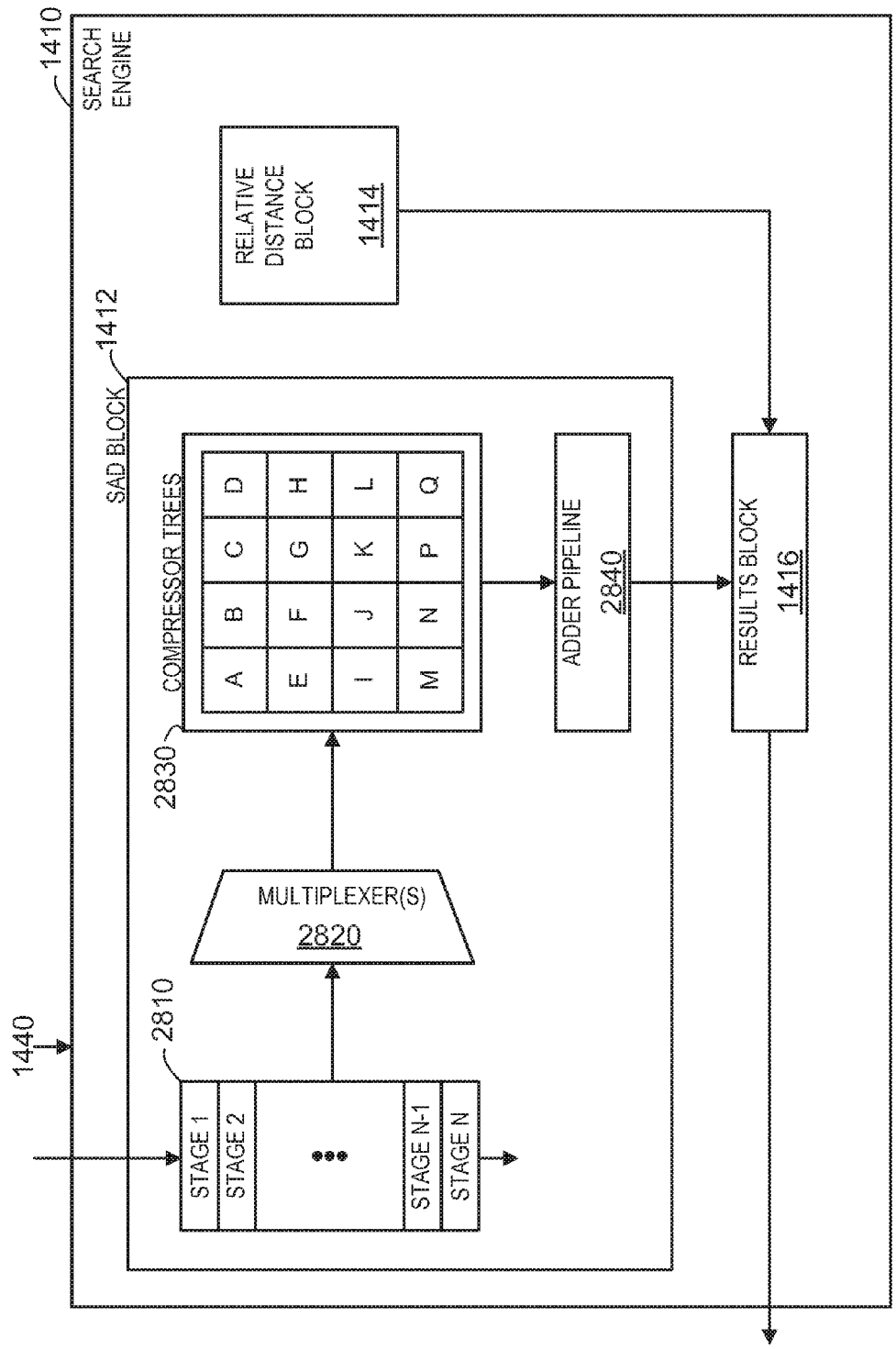
FIG. 28 is a high-level block diagram illustrating a search engine within a video compression co-processor, according to one embodiment.

FIG. 28 illustrates a high-level overview of the logic within and data flow through a single search engine (e.g., one of the search engines 1410 of FIG. 14), according to one embodiment. The search engine 1410 comprises a SAD block 1412, a relative distance block 1414, and a results block 1416. As previously described, the SAD block 1412 performs SAD computations, the relative distance block 1414 maintains the coordinates of a macroblock and/or computes a relative distance between the macroblock and an EMV, and the results block 1416 maintains the best SAD value along with its corresponding location and distance from the EMV.

The SAD block 1412 illustrated in the example search engine of FIG. 28 comprises an N-stage pipeline 2810 and a plurality of multiplexers 2820 for delivering pixels to an appropriate subpartition of compressor trees 2830. The N-stage pipeline 2810 may comprise a plurality of flip-flops configured such that the rows in the macroblock column can be shifted through the pipeline and tapped at appropriate stages to deliver data to an appropriate subpartition of the compressor trees 2830. As shown in FIG. 28, the rows in the macroblock column are shifted through each stage of pipeline 2810 from top to bottom. The depth of the pipeline can be determined according to the following equation: depth= (pixel resolution)*3+1. For example, to support an integer search (e.g., the pixel resolution=1), the N-stage pipeline 2810 may include four stages, each of which can store all or part of a row of a macroblock column (e.g., each stage can hold a sixteen-pixel-wide row of a macroblock column). By way of another example, to support a quarter subpixel search (e.g., the pixel resolution=4), the N-stage pipeline 2810 may include thirteen stages. By way of still another example, to support a ⅛ subpixel search (e.g., the pixel resolution=8), twenty-five stages may be provided. Of course, the depth of the pipeline can be determined in other ways and additional or fewer stages may be included.

The multiplexers 2820 steer pixels within the N-stage pipeline 2810 to the appropriate subpartition of the compressor trees 2830. For example, each subpartition of the compressor trees 2830 may be configured to calculate a SAD value for a four-by-four pixel subpartition of a sixteen-by-sixteen pixel macroblock (e.g., subpartitions A-N, P, and Q are each four-by-four subpartitions). The multiplexers 2820 help steer pixels from the various stages to the correct subpartitions. According to one embodiment, four sets of multiplexers 2820 are used to deliver pixels from four stages of the N-stage pipeline 2810 to the compressor trees 2830. For example, assuming that each stage of the pipeline 2810 holds a sixteen-pixel-wide row and that a search with a half-subpixel resolution is being performed, the first of the four sets of multiplexers 2820 could deliver pixels 0-3 In stage 1 to subpartitions A, E, I, and M, pixels 4-7 in stage 1 to subpartitions B, F. J, and N, pixels 8-11 in stage 1 to subpartitions C, G, K, and P, and pixels 12-15 in stage 1 to subpartitions D, H. L, and Q. Similarly, the second of the four sets of multiplexers 2820 could deliver pixels 0-3 in stage 3 to subpartitions A, E, I, and M, pixels 4-7 in stage 3 to subpartitions B, F, J, and N, pixels 8-11 in stage 3 to subpartitions C, G, K, and P, and pixels 12-15 in stage 3 to subpartitions D, H, L, and Q. Likewise, the third of the four sets of multiplexers 2820 could deliver pixels 0-3 in stage 5 to subpartitions A, E, I, and M, pixels 4-7 in stage 5 to subpartitions B, F. J, and N, pixels 8-11 in stage 5 to subpartitions C, G, K, and P, and pixels 12-15 in stage 5 to subpartitions D, H, L, and Q. In a similar vein, the fourth of the four sets of multiplexers 2820 could deliver pixels 0-3 in stage 7 to subpartitions A, E, I, and M, pixels 4-7 in stage 7 to subpartitions B, F, J, and N, pixels 8-11 in stage 7 to subpartitions C, G, K, and P, and pixels 12-15 in stage 7 to subpartitions D, H, L, and Q. Thus, during each clock cycle, a sixteen-by-sixteen pixel array of a macroblock column can be delivered to the compressor trees 2830.

Depending upon the resolution of the search, the four sets of multiplexers 2820 may tap from different stages of the N-stage pipeline 2810. For example, assuming that the search engine 1410 is provided with a thirteen-stage pipeline 2810, the search engine 1410 may tap from stages 1, 2, 3, and 4 when performing an integer search, stages 1, 3, 5, and 7 when performing a search with a half-subpixel resolution, and stages 1, 5, 9, and 13 when performing a search with a quarter-subpixel resolution. Thus, through a combination of the preprocessing block 2710, the N-stage pipelines 2810, and the multiplexers 2820, the compressor trees 2830 in each search engine 1410A-D receive the appropriate pixels (e.g., integer pixels, ¼-subpixels, ½-subpixels, and ¾-subpixels) at the appropriate clock cycle. Of course, additional or fewer sets of multiplexers 2820 may be provided.

As will be discussed in more detail below, each compressor tree 2830 can perform a SAD computation for a given subpartition (e.g., comparing macroblock column data to a macroblock) every clock cycle. According to one embodiment, a sixteen-by-sixteen macroblock is divided into forty-one subpartitions: sixteen four-by-four pixel subpartitions: eight four-by-eight pixel subpartitions; eight eight-by-four pixel subpartitions: four eight-by-eight pixel subpartitions; two eight-by-sixteen pixel subpartitions; two sixteen-by-eight pixel subpartitions; and one sixteen-by-sixteen pixel subpartition. Of course, any number and combination of subpartitions are possible. As shown in FIG. 28, the compressor tree 2830 can compute the sixteen four-by-four pixel subpartitions (e.g., subpartitions A-N, P, and Q) during each clock cycle and output the SAD values to an adder pipeline 2840.

As will be described in more detail below, the adder pipeline 2840 derives SAD values for the other, larger partitions from the sixteen four-by-four pixel subpartitions. According to one embodiment, the SAD values may be truncated to sixteen-bits when twelve-bit pixels are used. The adder pipeline 2840 can output forty-one subpartition SAD values to the results block 1416 each clock cycle (sixteen of the forty-one subpartitions may be taken directly from the compressor trees). The adder pipeline 2840 may also output a one-bit valid indication for each of the subpartition SAD values.

The relative distance block 1414 maintains the horizontal and vertical coordinates of each subpartition of a macroblock and/or computes a relative distance between each subpartition of the macroblock and an EMV. According to one embodiment, the vertical coordinates of each subpartition are incremented by one each time the macroblock moves down by one row and the horizontal coordinates of each subpartition are incremented by four each time the macroblock moves to the right by four columns (see, e.g., the description of FIGS. 24 and 25). As the search window is traversed, the relative distance from the EMV may be computed and stored in a distance pipeline so that the various subpartitions can extract their corresponding distances from appropriate stages in the distance pipeline. According to one embodiment, each horizontal and vertical coordinate is twelve bits and the distance values are sixteen bits.

As previously described, the results block 1416 maintains the best SAD value from each of the subpartitions along with its corresponding location and distance from the EMV. According to one embodiment, the results block 1416 comprises forty-one integer filters that retain the lowest SAD value for each of the forty-one subpartitions and one subpixel filter that retains the lowest subpixel SAD value for the selected subpixel partition size. Of course, fewer or additional filters may be provided. The results block 1416 returns to the object array 105 (via the application interface 1430) a SAD value, a horizontal coordinate, a vertical coordinate, and/or a distance from the EMV for each of the forty-one subpartitions and the one subpixel search. The results block 1416 may also output a one-bit valid indication indicating the validity of each SAD value returned.

Figure 29:
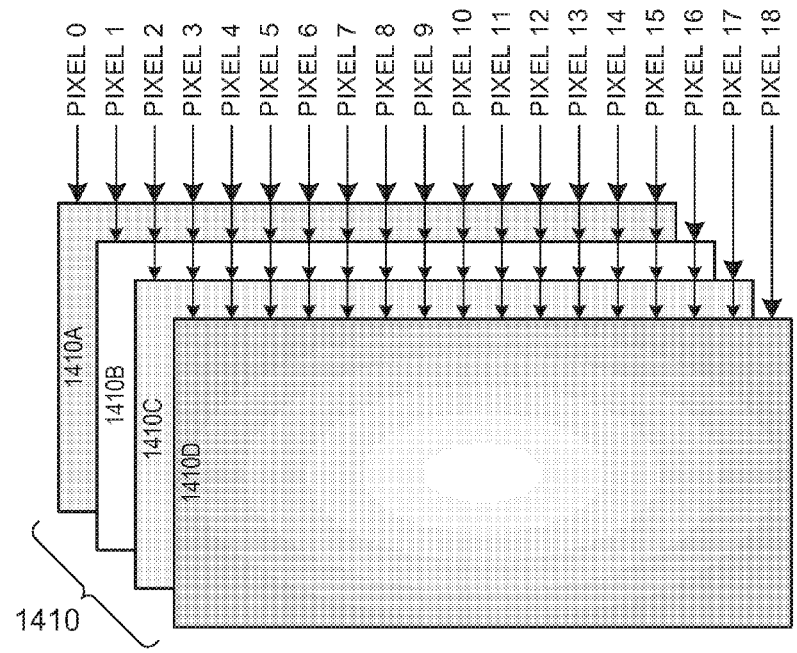
FIG. 29 is a diagram illustrating that search engines within a video compression co-processor may share pixel data to save data transfer bandwidth, according to one embodiment.

As previously described, one embodiment of the video compression co-processor 170 instantiates four search engines 1410. Several techniques may be used to help minimize data transfer bandwidth. For example, as illustrated in FIG. 29 instead of transferring different pixel data to each of the four search engines 1410, data transfer bandwidth efficiencies can be realized by sharing fifteen of the sixteen pixels between adjacent search engines 1410. Thus, thirteen (pixels 3-15) of the nineteen pixels shown in FIG. 29 are used four times (once by each search engine 1410). Of the remaining six pixels, two are used three times (pixels 2 and 16), two are used twice (pixels 1 and 17), and two are used only once (pixels 0 and 18).

Data transfer bandwidth efficiencies are also realized by computing multiple macroblock subpartitions at a given time. For example, by iteratively moving the macroblock down by one pixel row (with respect to the search window) per clock cycle, subpartition E (see FIG. 30) performs a SAD computation on the same search window pixels as subpartition A four clock cycles later, subpartition I performs a SAD computation on the same search window pixels as subpartition A eight clock cycles later, and subpartition M performs a SAD computation on the same search window pixels as subpartition A twelve clock cycles later.

Figure 30:
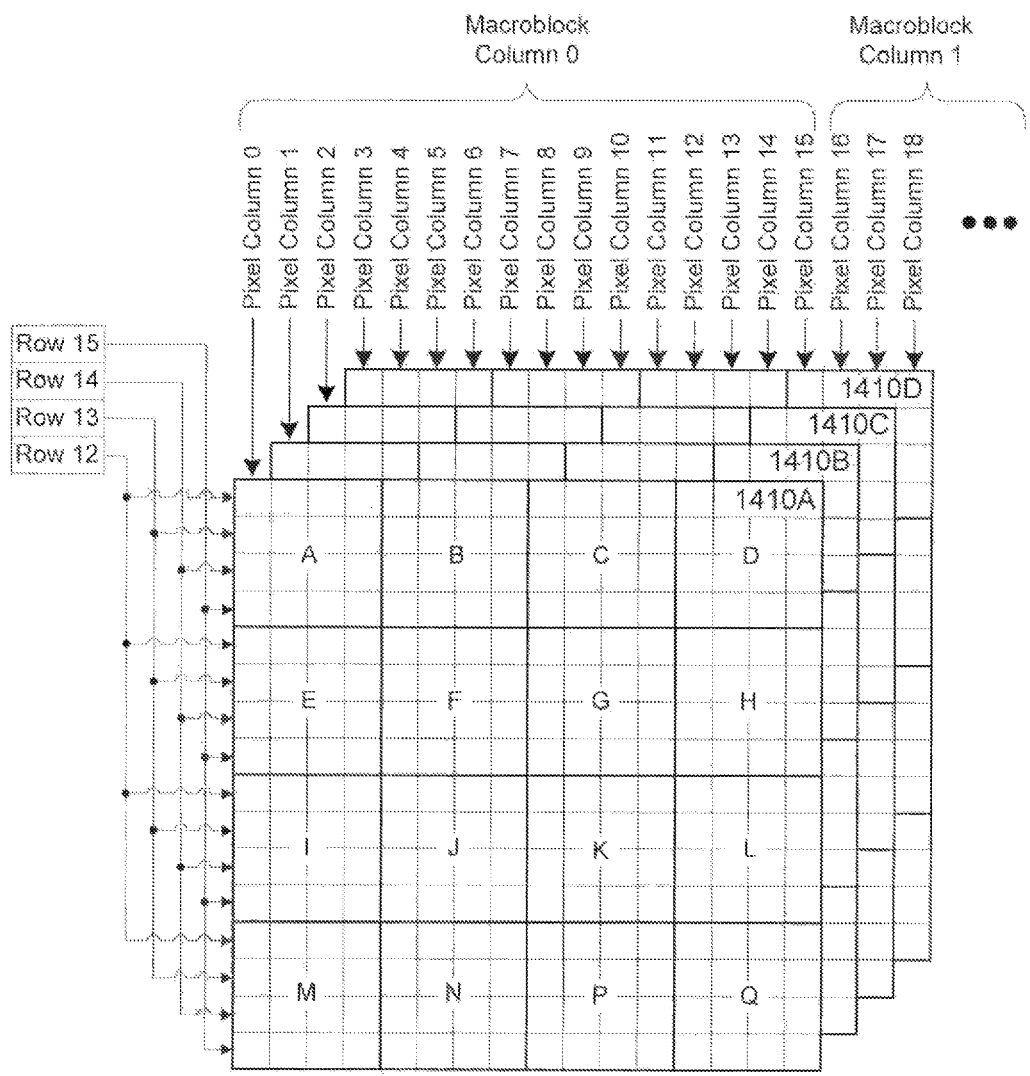
FIG. 30 is a diagram illustrating a sixteen-by-sixteen pixel macroblock divided into sixteen four-by-four pixel subpartitions, according to one embodiment.

FIG. 30 illustrates a sixteen-by-sixteen pixel macroblock column divided into sixteen four-by-four pixel subpartitions A-N, P, and Q. FIG. 30 also illustrates four search engines 1410A-D horizontally offset from each other by one pixel (the search engines 1410A-D are shown vertically offset for illustration purposes). Through a combination of the N-stage pipeline 2810 and the plurality of multiplexers 2820 data can be delivered to the appropriate subpartitions A-N, P, and Q. Thus, at clock cycle 1, subpartition A will have row 0, columns 0-3 in its bottom most row, subpartition B will have row 0, columns 4-7 in its bottom most row, subpartition C will have row 0, columns 8-11 in its bottom most row, and subpartition D will have row 0, columns 12-15 in its bottom most row. At clock cycle 4, subpartitions A, B, C, and D will each have sufficient data to perform a SAD computation (e.g., row 0 will be in the top most row of subpartitions A-D and row 3 will be in the bottom most row). From clock cycle 4 on, subpartitions A-D can process search window pixel data until the bottom of the search window is reached (or another stopping point). In a similar vein, subpartitions E, F, G, and H will have sufficient data to perform a SAD computation at clock cycle 8, subpartitions I, J, K, and L will have sufficient data to perform a SAD computation at clock cycle 12, and subpartitions M, N, P, and Q will have sufficient data to perform a SAD computation at clock cycle 16. FIG. 30 shows a snap shot of the computations that may be performed at clock cycle 16, according to one embodiment. At clock cycle 16 subpartitions A, E, I, and M each receive pixels from rows 12-15 and pixel columns 0-3. If an integer search is being performed, rows 12-15 may be tapped from stages 1-4 of the N-stage pipeline 2810. Similarly, pixels from rows 12-15 are also sent to subpartitions B, F, J, and N (pixel columns 4-7), subpartitions C, G, K, and P (pixel columns 8-11), and subpartitions D, H, L, and Q (pixel columns 12-15). Thus, at clock cycle 16 subpartitions A, E, I, and M are all seeing the same pixel data, but subpartition M performs a SAD computation as if sixteen-by-sixteen macroblock were located at row 0 of the macroblock column 0, subpartition I performs a SAD computation as if the sixteen-by-sixteen macroblock were located at row 4, subpartition E performs a SAD computation as if the sixteen-by-sixteen macroblock were located at row 8, and subpartition A performs a SAD computation as if the sixteen-by-sixteen macroblock were located at row 12.

Figure 31:
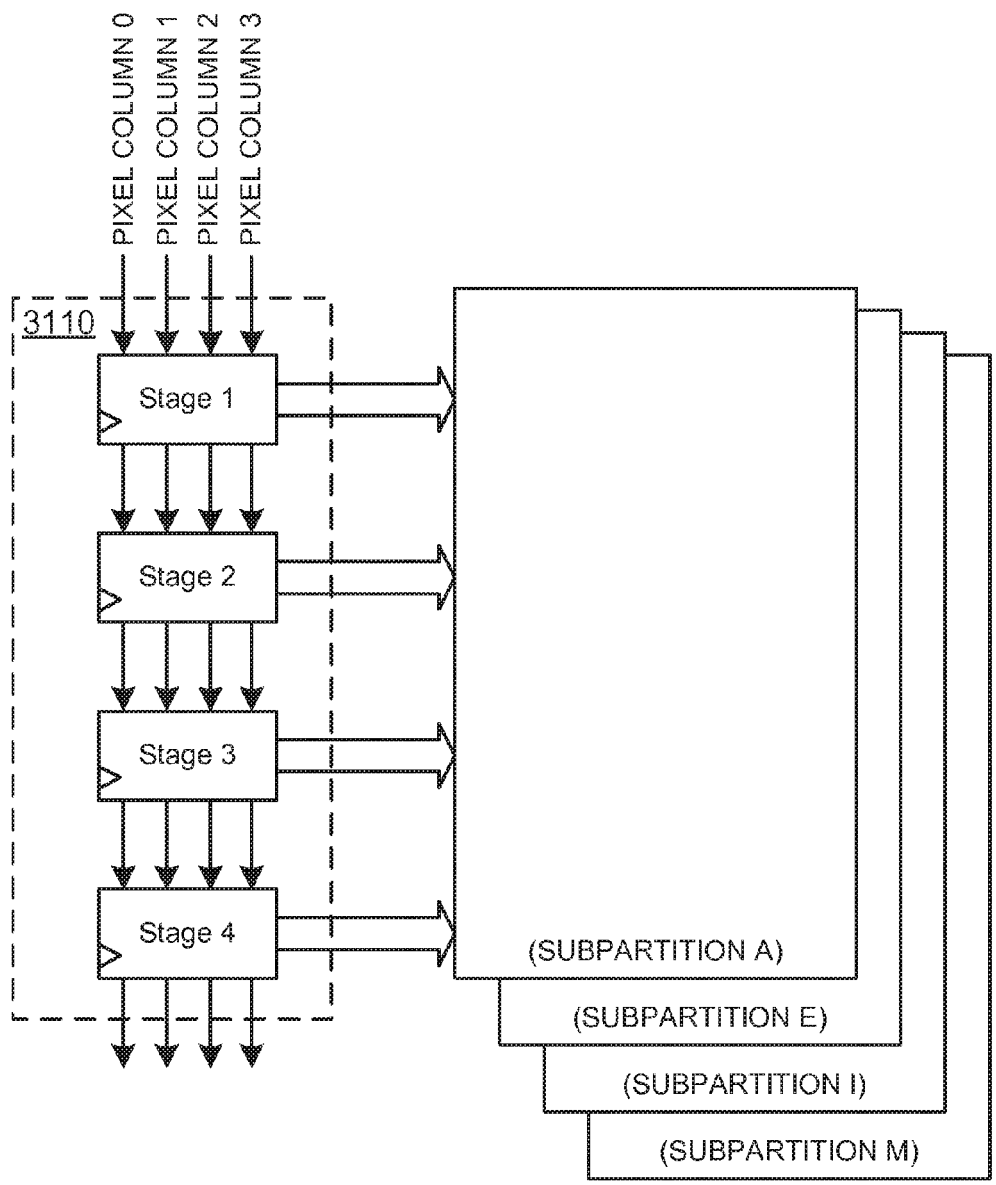
FIG. 31 is a block diagram illustrating a search engine utilizing a single pixel bus, according to one embodiment.

An example of subpartitions A, E, I, and M processing pixel columns 0-3 will now be provided with reference to FIG. 31 and Table 3. While FIG. 31 illustrates subpartitions A, E, I, and M tapping a four-stage pipeline 3110, it should be recognized that a larger or smaller pipeline may be used. Pixels in four horizontally adjacent pixel columns (e.g., pixel columns 0-3) are moved through each stage of the four-stage pipeline 3110 every clock cycle (row by row). As each row from the pixel columns is iteratively shifted through the four-stage pipeline 3110, the subpartitions will have pixel data with which to perform SAD computations. It should be noted that each of the subpartitions A, E, I, and M will see the same pixel data corresponding to different macroblock locations per subpartition.

Table 3 shows for each clock cycle the location of each row of one of the pixel columns (e.g., pixel column 0). For example, at clock cycle 1, row 0 is at stage 1 (stages 2-4 have not yet received known shifted data). At clock cycle 2, row 1 is at stage 1 and row 0 is at stage 2. At clock cycle 3, row 2 is at stage 1, row 1 is at stage 2, and row 0 is at stage 3. At clock cycle 4, row 3 is at stage 1, row 2 is at stage 2, row 1 is at stage 3, and row 0 is at stage 4, and so forth. Thus, after four clocks, subpartition A will have the required data (i.e., rows 0, 1, 2, and 3 of pixel columns 0-3) to perform a SAD computation. Thus, at clock cycle 4, subpartition A performs a SAD computation as if the sixteen-by-sixteen pixel macroblock were located at row 0 of the macroblock column. At clock cycle 5, subpartition A performs a SAD computation as if the macroblock were located at row 1 of the macroblock column. At clock cycle 6, subpartition A performs a SAD computation as if the macroblock were located at row 2 of the macroblock column, and so forth.

When the macroblock is at row 0, it should be noted that subpartition E performs a SAD computation using rows 4-7 of the macroblock column. Thus, at clock cycle 8, subpartition E performs a SAD computation as if the macroblock were located at row 0 of the macroblock column. At clock cycle 9, subpartition E performs a SAD computation as if the macroblock were located at row 1 of the macroblock column, and so forth. In a similar vein, when the macroblock is at row 0, subpartition I performs a SAD computation using rows 8-11 of the macroblock column (clock cycle 12) and subpartition M performs a SAD computation using rows 12-16 of the macroblock column (clock cycle 16).

At clock cycle 67, subpartition A performs a SAD computation as if the macroblock were located at row 63 of the macroblock column. Thus, after 67 clocks, subpartition A has performed SAD computations at all 64 locations in a macroblock column having a height of 64 pixels. However, when the macroblock is located at row 63, subpartition M performs a SAD computation using rows 75-78 (using pixels in the bottom pixel skirt). Because pixels in rows 75-78 are not shifted to the appropriate stages (of the four-stage pipeline 3110) until clock cycle 79, subpartition M will finish its final SAD computation twelve clock cycles after subpartition A. Thus, using the four-stage pipeline 3110 shown in FIG. 31, it takes 79 clock cycles to process all 64 locations in the macroblock column before the search engine 1410 starts processing the next macroblock column (e.g., shifted to the right by four pixel columns). In other words, the example described with reference to FIG. 31 and Table 3 is operating with an approximately 80% percent efficiency.

TABLE 3

| Clock | Pixel Row | | | | Macroblock Row | | | |
| --- | --- | --- | --- | --- | --- | --- | --- | --- |
| Cycle | Stage 1 | Stage 2 | Stage 3 | Stage 4 | A | E | I | M |
| 1 | 0 | — | — | — | — | — | — | — |
| 2 | 1 | 0 | — | — | — | — | — | — |
| 3 | 2 | 1 | 0 | — | — | — | — | — |
| 4 | 3 | 2 | 1 | 0 | 0 | — | — | — |
| 5 | 4 | 3 | 2 | 1 | 1 | — | — | — |
| 6 | 5 | 4 | 3 | 2 | 2 | — | — | — |
| 7 | 6 | 5 | 4 | 3 | 3 | — | — | — |
| 8 | 7 | 6 | 5 | 4 | 4 | 0 | — | — |
| 9 | 8 | 7 | 6 | 5 | 5 | 1 | — | — |
| 10 | 9 | 8 | 7 | 6 | 6 | 2 | — | — |
| 11 | 10 | 9 | 8 | 7 | 7 | 3 | — | — |
| 12 | 11 | 10 | 9 | 8 | 8 | 4 | 0 | — |
| 13 | 12 | 11 | 10 | 9 | 9 | 5 | 1 | — |
| 14 | 13 | 12 | 11 | 10 | 10 | 6 | 2 | — |
| 15 | 14 | 13 | 12 | 11 | 11 | 7 | 3 | — |
| 16 | 15 | 14 | 13 | 12 | 12 | 8 | 4 | 0 |
| 17 | 16 | 15 | 14 | 13 | 13 | 9 | 5 | 1 |
| ⋮ | ⋮ | ⋮ | ⋮ | ⋮ | ⋮ | ⋮ | ⋮ | ⋮ |
| 66 | 65 | 64 | 63 | 62 | 62 | 58 | 54 | 50 |
| 67 | 66 | 65 | 64 | 63 | 63 | 59 | 55 | 51 |
| 68 | 67 | 66 | 65 | 64 | — | 60 | 56 | 52 |
| 69 | 68 | 67 | 66 | 65 | — | 61 | 57 | 53 |
| 70 | 69 | 68 | 67 | 66 | — | 62 | 58 | 54 |
| 71 | 70 | 69 | 68 | 67 | — | 63 | 59 | 55 |
| 72 | 71 | 70 | 69 | 68 | — | — | 60 | 56 |

TABLE 3-continued

| Clock | Pixel Row | | | | Macroblock Row | | | |
|---|---|---|---|---|---|---|---|---|
| Cycle | Stage 1 | Stage 2 | Stage 3 | Stage 4 | A | E | I | M |
| 73 | 72 | 71 | 70 | 69 | — | — | 61 | 57 |
| 74 | 73 | 72 | 71 | 70 | — | — | 62 | 58 |
| 75 | 74 | 73 | 72 | 71 | — | — | 63 | 59 |
| 76 | 75 | 74 | 73 | 72 | — | — | — | 60 |
| 77 | 76 | 75 | 74 | 73 | — | — | — | 61 |
| 78 | 77 | 76 | 75 | 74 | — | — | — | 62 |
| 79 | 78 | 77 | 76 | 75 | — | — | — | 63 |
| ⋮ | ⋮ | ⋮ | ⋮ | ⋮ | ⋮ | ⋮ | ⋮ | ⋮ |

Figure 32:
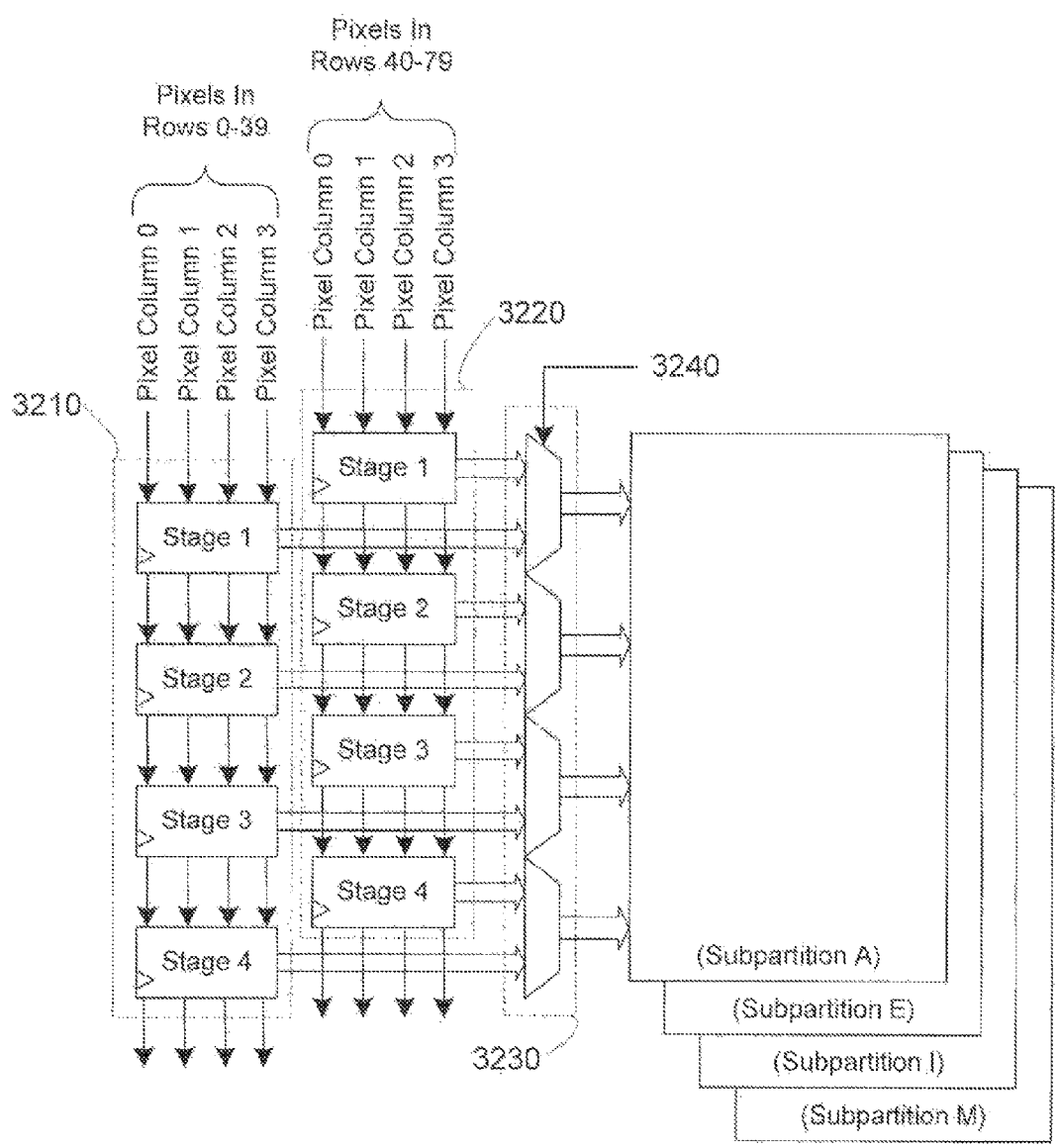
FIG. 32 is a block diagram illustrating a search engine utilizing a dual pixel bus, according to one embodiment.

Referring now to FIG. 32, another example of subpartitions A, E, I, and M processing pixel columns 0-3 will be provided. As shown in FIG. 32, the example search engine 1410 uses two pipelines 3210 and 3220 (sourced from different internal memories) to increase efficiency. Of course, more than two pipelines may also be used. The four-stage pipeline 3210 supplies pixel data from an upper portion of the macroblock column while the four-stage pipeline 3220 supplies pixel data from a lower portion of the macroblock column. According to one embodiment, the upper portion includes rows 0-39 and the lower portion includes rows 40-79. However, the upper and lower portions may be divided differently (e.g., the upper portion may include rows 0-15 and the lower portion may include rows 16-79). Multiplexers 3230 select between the four stages of each of the pipelines 3210 and 3220. Sixteen sets of 2:1 multiplexers 3230 may be provided to individually select between the four stages for each of the four subpartitions (e.g., subpartitions A, E, I, and M). A separate select line 3240 may be provided for each of the four multiplexers 3230 as shown in FIG. 32.

Initially, all of the multiplexers 3230 select pixels from the upper rows of the macroblock column (i.e., pixels for rows 0-39) by tapping the pipeline 3210. As shown in Table 4, the states of each stage of pipeline 3210 are identical to the states of each stage of pipeline 3110 shown in Table 3 for the first 40 clock cycles. Approximately halfway down the macroblock column (e.g., row 40), the multiplexers 3230 consecutively start tapping the pipeline 3220. The switch occurs on consecutive clocks for each of the four stages so that a consecutive stream of pixels are available for the partitions A, E, I, and M. The multiplexers 3230 (e.g., four multiplexers for pixel columns 0-3) switch simultaneously. Table 4 shows the pipeline 3210 delivering 40 pixels before transitioning to the pipeline 3220 (e.g., the transition from the pipeline 3210 to the pipeline 3220 for stage 1 occurs at clock cycle 41, for stage 2 occurs at clock cycle 42, for stage 3 occurs at clock cycle 43, and for stage 4 occurs at clock cycle 44).

As described with reference to FIG. 31 and Table 3, the four right most columns of Table 4 show the relative locations of the subpartitions A, E, I, and M with respect to the rows of the macroblock column (e.g., at clock cycle 4, the subpartition A is located at row 0 of the macroblock column; at clock cycle 17, the subpartition A is located at row 13; at clock cycle 43, the subpartition A is located at row 39; at clock cycle 67, the subpartition A is located at row 63; and so forth). As the processing of the subpartition A approaches the bottom row of the macroblock column, the pipeline 3210 starts receiving pixels from the top row of the next macroblock column (e.g., the macroblock column is shifted right by four pixels). The timing (e.g., clock cycle) of when the pipeline 3210 starts receiving pixels from the next macroblock column is selected so that the first four stages (stages 1-4) of the pipeline 3210 contain pixel rows 0-3 on clock 68.

Thus, after the subpartition A completes the calculation on clock cycle 67 (e.g., the subpartition A is effectively located at row 63 of the first macroblock column), the subpartition A can immediately start performing computations on clock cycle 68 (e.g., the subpartition A is effectively located at row 0 of the next macroblock column) instead of waiting for subpartitions E, I, and M to complete their respective computations on the first macroblock column. Thus, at clock cycle 68, all four multiplexers 3230 associated with the subpartition A partition are tapping from the pipeline 3210. The other subpartitions (e.g., subpartitions E, I, and M) continue to tap from the pipeline 3220. At clock cycle 72, all four multiplexers 3230 associated with the subpartition E partition tap from the pipeline 3210 while the subpartitions I and M continue to tap from the pipeline 3220. At clock cycle 76, all four multiplexers 3230 associated with the subpartition I partition tap from the pipeline 3210 while the subpartition M continues to tap from the pipeline 3220. Finally, at clock cycle 80, all four multiplexers 3230 associated with the subpartition M taps from the pipeline 3210.

The search engine 1410 continues to switch between the pipelines 3210 and 3220 until the entire search window has been processed. By using two pipelines, the subpartition A does not remain idle until the subpartitions E, I, and M complete their respective computations on the first macroblock column. Thus, the example described with reference to FIG. 32 and Table 4 is operating with an approximately 100% efficiency.

TABLE 4

| Clock | Pixel Row | | | | | | | Macroblock Row | | | |
|---|---|---|---|---|---|---|---|---|---|---|---|
| | Stage 1 | | Stage 2 | | Stage 3 | | Stage 4 | | | | |
| Cycle | 3210 | 3220 | 3210 | 3220 | 3210 | 3220 | 3210 | 3220 | A | E | I | M |
| 1 | 0 | — | — | — | — | — | — | — | — | — | — | — |
| 2 | 1 | — | 0 | — | — | — | — | — | — | — | — | — |
| 3 | 2 | — | 1 | — | 0 | — | — | — | — | — | — | — |
| 4 | 3 | — | 2 | — | 1 | — | 0 | — | 0 | — | — | — |
| 5 | 4 | — | 3 | — | 2 | — | 1 | — | 1 | — | — | — |
| 6 | 5 | — | 4 | — | 3 | — | 2 | — | 2 | — | — | — |
| 7 | 6 | — | 5 | — | 4 | — | 3 | — | 3 | — | — | — |
| 8 | 7 | — | 6 | — | 5 | — | 4 | — | 4 | 0 | — | — |
| 9 | 8 | — | 7 | — | 6 | — | 5 | — | 5 | 1 | — | — |
| 10 | 9 | — | 8 | — | 7 | — | 6 | — | 6 | 2 | — | — |
| 11 | 10 | — | 9 | — | 8 | — | 7 | — | 7 | 3 | — | — |

TABLE 4-continued

| Clock | Pixel Row | | | | | | | | Macroblock Row | | | |
|---|---|---|---|---|---|---|---|---|---|---|---|---|
| | Stage 1 | | Stage 2 | | Stage 3 | | Stage 4 | | | | | |
| Cycle | 3210 | 3220 | 3210 | 3220 | 3210 | 3220 | 3210 | 3220 | A | E | I | M |
| 12 | 11 | — | 10 | — | 9 | — | 8 | — | 8 | 4 | 0 | — |
| 13 | 12 | — | 11 | — | 10 | — | 9 | — | 9 | 5 | 1 | — |
| 14 | 13 | — | 12 | — | 11 | — | 10 | — | 10 | 6 | 2 | — |
| 15 | 14 | — | 13 | — | 12 | — | 11 | — | 11 | 7 | 3 | — |
| 16 | 15 | — | 14 | — | 13 | — | 12 | — | 12 | 8 | 4 | 0 |
| 17 | 16 | — | 15 | — | 14 | — | 13 | — | 13 | 9 | 5 | 1 |
| ⋮ | ⋮ | ⋮ | ⋮ | ⋮ | ⋮ | ⋮ | ⋮ | ⋮ | ⋮ | ⋮ | ⋮ | ⋮ |
| 40 | 39 | — | 38 | — | 37 | — | 36 | — | 36 | 32 | 28 | 24 |
| 41 | — | 40 | 39 | — | 38 | — | 37 | — | 37 | 33 | 29 | 25 |
| 42 | — | 41 | — | 40 | 39 | — | 38 | — | 38 | 34 | 30 | 26 |
| 43 | — | 42 | — | 41 | — | 40 | 39 | — | 39 | 35 | 31 | 27 |
| 44 | — | 43 | — | 42 | — | 41 | — | 40 | 40 | 36 | 32 | 28 |
| 45 | — | 44 | — | 43 | — | 42 | — | 41 | 41 | 37 | 33 | 29 |
| 46 | — | 45 | — | 44 | — | 43 | — | 42 | 42 | 38 | 34 | 30 |
| ⋮ | ⋮ | ⋮ | ⋮ | ⋮ | ⋮ | ⋮ | ⋮ | ⋮ | ⋮ | ⋮ | ⋮ | ⋮ |
| 63 | — | 62 | — | 61 | — | 60 | — | 59 | 59 | 55 | 51 | 48 |
| 64 | — | 63 | — | 62 | — | 61 | — | 60 | 60 | 56 | 52 | 48 |
| 65 | 0 | 64 | — | 63 | — | 62 | — | 61 | 61 | 57 | 53 | 49 |
| 66 | 1 | 65 | 0 | 64 | — | 63 | — | 62 | 62 | 58 | 54 | 50 |
| 67 | 2 | 66 | 1 | 65 | 0 | 64 | — | 63 | 63 | 59 | 55 | 51 |
| 68 | 3 | 67 | 2 | 66 | 1 | 65 | 0 | 64 | 0 | 60 | 56 | 52 |
| 69 | 4 | 68 | 3 | 67 | 2 | 66 | 1 | 65 | 1 | 61 | 57 | 53 |
| 70 | 5 | 69 | 4 | 68 | 3 | 67 | 2 | 66 | 2 | 62 | 58 | 54 |
| 71 | 6 | 70 | 5 | 69 | 4 | 68 | 3 | 67 | 3 | 63 | 59 | 55 |
| 72 | 7 | 71 | 6 | 70 | 5 | 69 | 4 | 68 | 4 | 0 | 60 | 56 |
| 73 | 8 | 72 | 7 | 71 | 6 | 70 | 5 | 69 | 5 | 1 | 61 | 57 |
| 74 | 9 | 73 | 8 | 72 | 7 | 71 | 6 | 70 | 6 | 2 | 62 | 58 |
| 75 | 10 | 74 | 9 | 73 | 8 | 72 | 7 | 71 | 7 | 3 | 63 | 59 |
| 76 | 11 | 75 | 10 | 74 | 9 | 73 | 8 | 72 | 8 | 4 | 0 | 60 |
| 77 | 12 | 76 | 11 | 75 | 10 | 74 | 9 | 73 | 9 | 5 | 1 | 61 |
| 78 | 13 | 77 | 12 | 76 | 11 | 75 | 10 | 74 | 10 | 6 | 2 | 62 |
| 79 | 14 | 78 | 13 | 77 | 12 | 76 | 11 | 75 | 11 | 7 | 3 | 63 |
| 80 | 15 | 79 | 14 | 78 | 13 | 77 | 12 | 76 | 12 | 8 | 4 | 0 |
| 81 | 16 | — | 15 | — | 14 | — | 13 | — | 13 | 9 | 5 | 1 |
| ⋮ | ⋮ | ⋮ | ⋮ | ⋮ | ⋮ | ⋮ | ⋮ | ⋮ | ⋮ | ⋮ | ⋮ | ⋮ |

Figure 33:
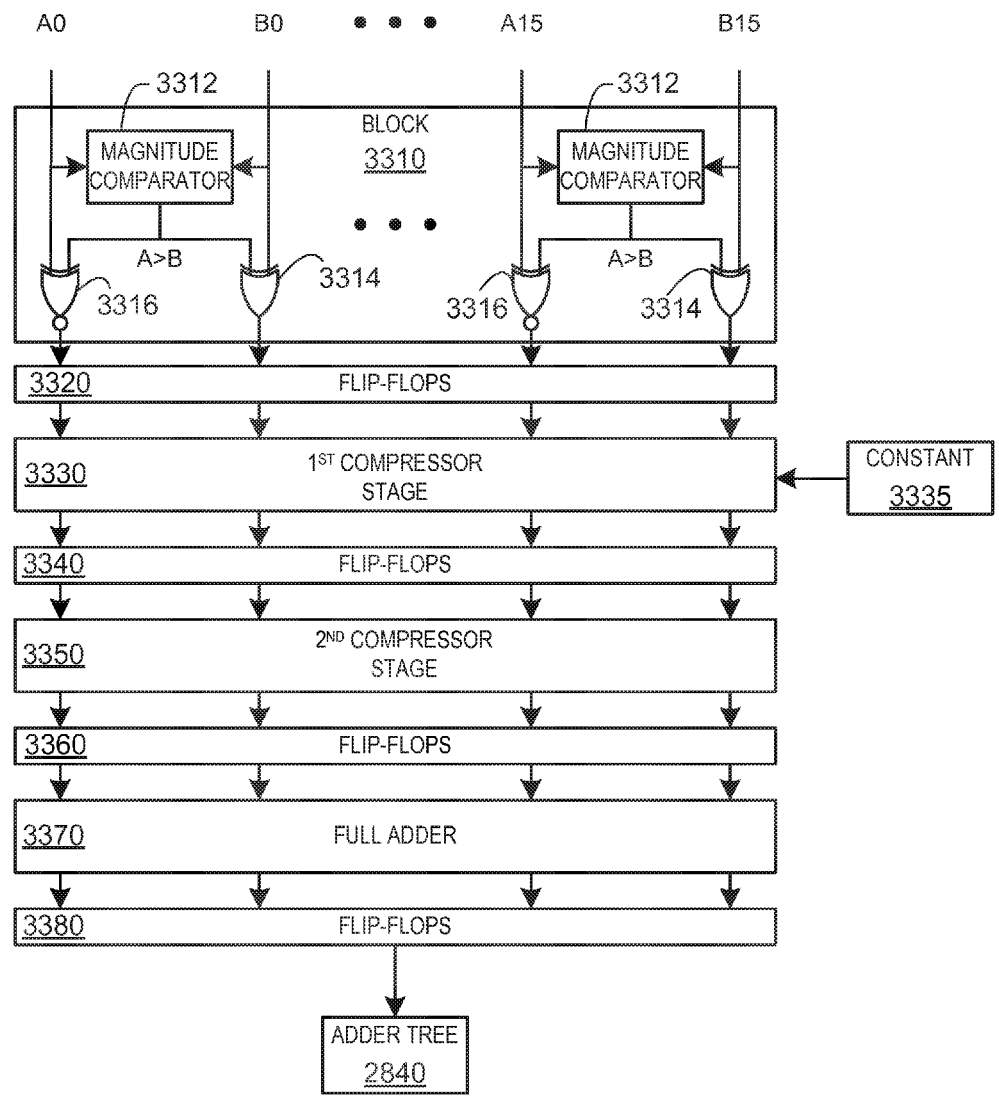
FIG. 33 is a block diagram illustrating a pipelined compressor tree for calculating a sum of absolute difference (SAD), according to one embodiment.

FIG. 33 is a block diagram illustrating an example of a set of compressor stages forming a compressor tree that computes a SAD value for one of the four-by-four pixel subpartitions of the sixteen-by-sixteen pixel macroblock (e.g., subpartitions A-N, P, and Q of FIG. 28). As shown in FIG. 33, the compressor tree is staged or pipelined to improve the overall throughput. The compressor tree for each of the subpartitions A-N, P, and Q may be similar or identical to that shown in FIG. 33 and SAD computations for each of the subpartitions A-N, P, and Q may proceed in parallel. As will be described in more detail with reference to FIG. 34, the calculated SAD values from each of the subpartitions can be combined (e.g., using adder trees) to determine SAD values for larger partitions (e.g., the eight four-by-eight subpartitions, the eight eight-by-four subpartitions, and so forth).

As previously discussed with reference with FIG. 10, one possible way of comparing pixels in macroblock 720 to pixels in the search window 710 is by computing a SAD value (see, e.g., Equation 1). The SAD computation adds the difference in magnitude between corresponding pixels within 720 macroblock and search window 710.

As shown in block 3310 of FIG. 33, a magnitude comparator 3312, a two-input bitwise XOR gate 3314, and a two-input bitwise XNOR gate 3316 are used to determine the greater of the macroblock pixel value and the search window pixel value and inverting the lesser of the two pixel values. For example, assuming A0=19 (10011 in binary) and B0=15 (01111 in binary), the magnitude comparator 3312 would determine that A0 is larger than 80 and could output 1 (or 11111 bitwise), which would be input to the XOR gate 3314 and XNOR gate 3316. The XOR gate 3314 would output 10000 and the XNOR gate 3316 would output 10011. By way of another example, assuming A0=15 (01111 in binary) and 80=19 (10011 in binary), the magnitude comparator 3312 would determine that 80 is larger than A0 and could output 0 (or 00000 bitwise), which would be input to the XOR gate 3314 and XNOR gate 3316. Now, the XOR gate 3314 would output 10011 and the XNOR gate 3316 would output 10000. Thus, as these examples show, the magnitude comparator 3312, the XOR gate 3314, and XNOR gate 3316 determine the greater of A0 and B0 and invert the lesser of A0 and B0. Because the subpartitions A-N, P, and Q are each comparing an array of four-by-four pixel values, a total of sixteen magnitude comparators 3312, XOR gates 3314, and XNOR gates 3316 are used for each subpartition. Thus, block 3310 has thirty-two inputs, A0-A15 (e.g., sixteen twelve-bit search window pixels for subpartition A) and B0-B15 (e.g., sixteen twelve-bit macroblock pixels for subpartition A), and thirty-two outputs (e.g., sixteen twelve-bit non-inverted pixel values and sixteen twelve-bit inverted pixel values).

Once the greater of the macroblock pixel value and the search window pixel value is known and the lesser of the two pixel values is inverted, the inverted and non-inverted values are added together along with a carry-in bit (e.g., −A=NOT(A)+1) to implement a single |A−B| operation. For example, as described above, the XOR gate 3314 and the XNOR gate 3318 output either 10000 or 10011. Adding 10000 to 10011 yields 00011 (if the carry-out is ignored, such as when performing a two's complement addition). Adding the carry-in bit (e.g., 1) to 00011 yields 00100 (which is 4 in decimal, or 19-15). The thirty-two results (half of which are inverted and the other half of which are non-inverted) are added together using a compressor tree and a constant 3335 of plus sixteen is added in order to compensate for the two's complement inversion of the sixteen inverted terms.

The compressor tree itself is broken into a series of computational stages, a first compressor stage 3330, a second compressor stage 3350, and an adder 3370. Sets of flip-flops 3320, 3340, 3360, and 3380 may be interleaved between the computational stages in order to improve computational throughput by breaking the relatively large cone of logic associated with the SAD computation. The set of flip-flops 3380 feed the adder tree 2840.

Figure 34:
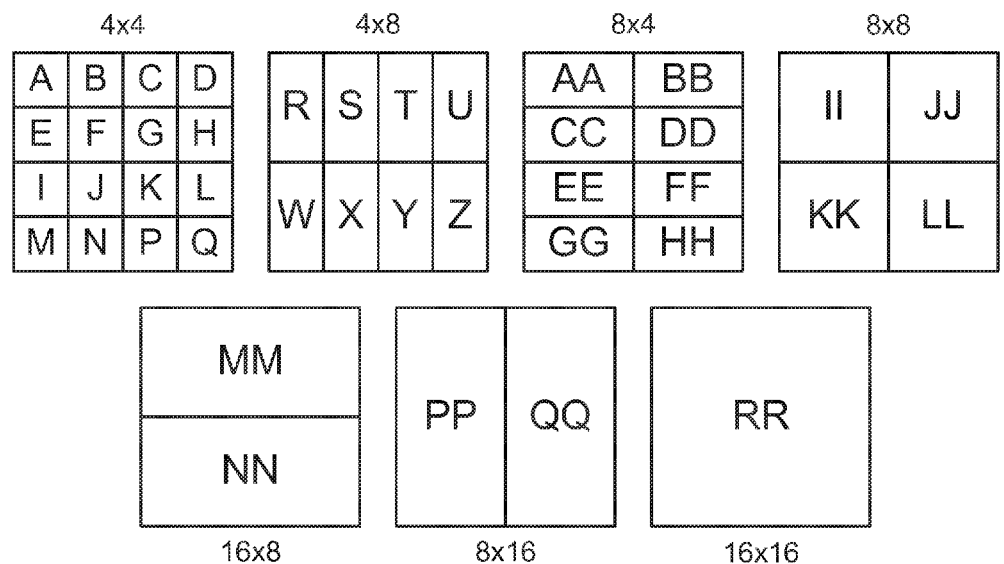
FIG. 34 is a diagram illustrating various partitions of a macroblock, according to one embodiment.

As previously described, a sixteen-by-sixteen macroblock can be divided into forty-one subpartitions. The sixteen four-by-four pixel subpartitions (e.g., subpartitions A-N, P, and Q) can be calculated as described with reference to FIG. 33. The other twenty-five subpartitions can be calculated as described with reference to FIG. 35. As shown in FIG. 34, the eight four-by-eight pixel subpartitions can be calculated by adding the SAD values from the four-by-four subpartitions. For example, adding the SAD values from subpartitions A and E yields a SAD value for subpartition R. The eight eight-by-four pixel subpartitions can be calculated in a similar manner. For example, adding the SAD values from subpartitions A and B yields a SAD value for subpartition AA.

The four eight-by-eight pixel subpartitions can be calculated by adding two four-by-eight subpartitions, two eight-by-four subpartitions, or four four-by-four subpartitions. For example, adding the SAD values from subpartitions R and S or AA and CC yields a SAD value for subpartition it. The two sixteen-by-eight pixel subpartitions and two eight-by-sixteen subpartitions can be calculated by adding two eight-by-eight subpartitions, four eight-by-four subpartitions, four four-by-eight subpartitions, or eight four-by-four subpartitions. For example, adding the SAD values from subpartitions II and JJ yields a SAD value for subpartition MM. The sixteen-by-sixteen pixel subpartition can be calculated by adding two eight-by-sixteen subpartitions, two sixteen-by-eight subpartitions, four eight-by-eight subpartitions, and so forth. For example, adding the SAD values from subpartitions MM and NN or PP and QQ yields a SAD value for subpartition RR.

Figure 35C:
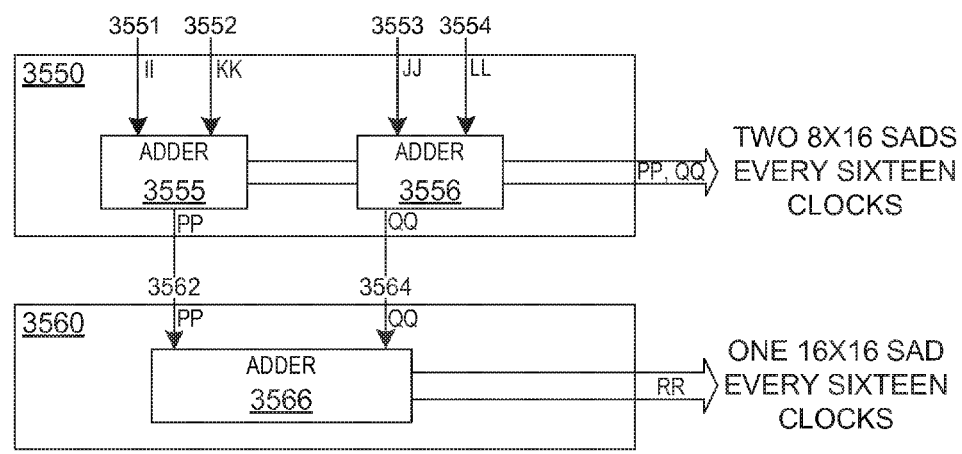
FIGS. 35A, 35B, and 35C are block diagrams illustrating an adder tree for combining smaller partition SAD values into larger partition SAD values, according to one embodiment.
Figure 35A:
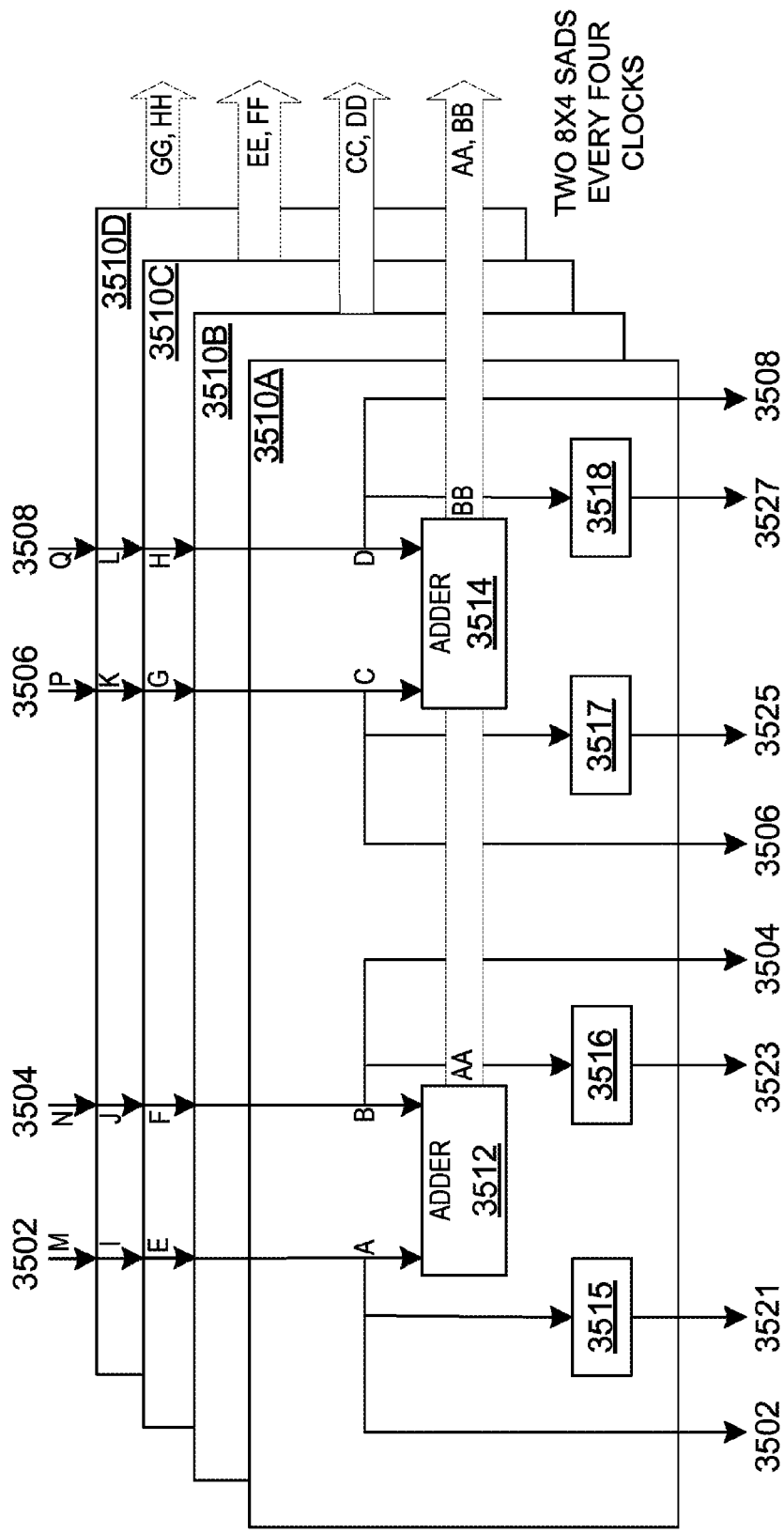
Figure 35B:
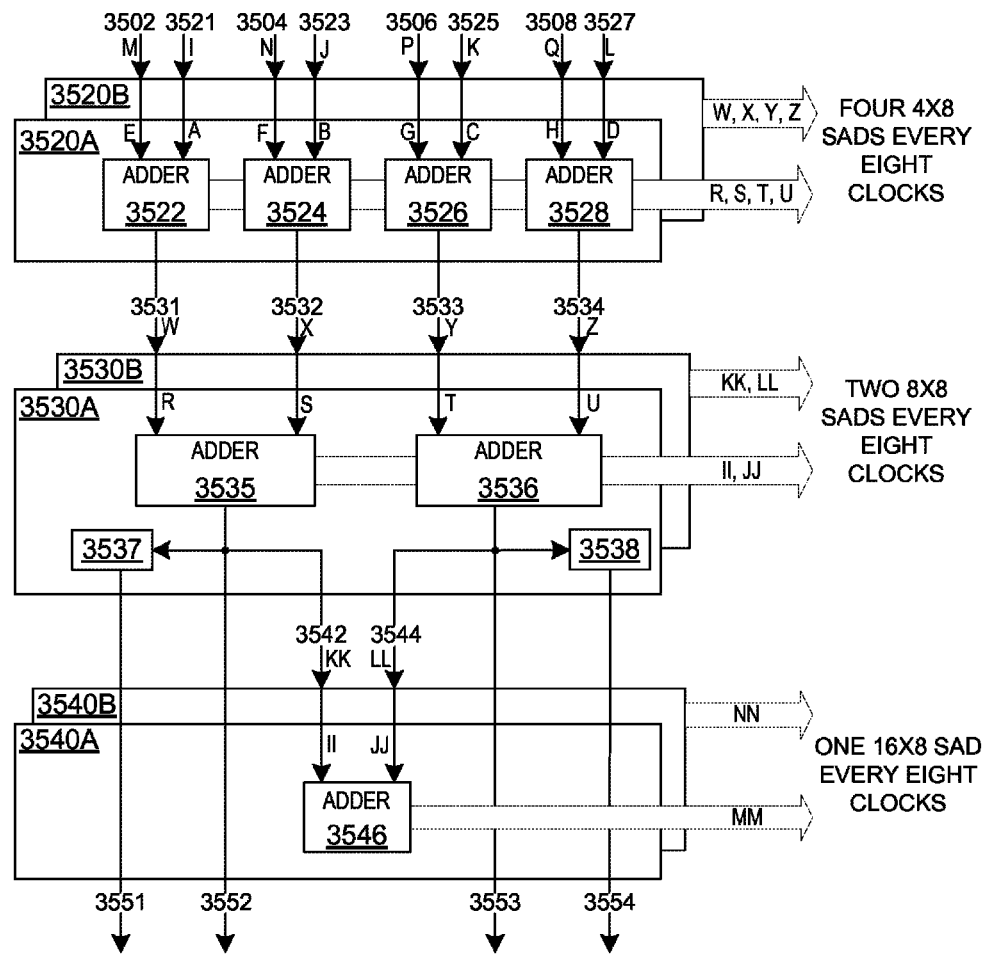

FIGS. 35A, 35B, and 35C illustrate one example of the adder pipeline 2840. The adder pipeline 2840 comprises six stages 3510, 3520, 3530, 3540, 3550, and 3560. Each stage generates a sequence of SAD values for different subpartitions as shown in FIG. 34. Each successive stage generates SAD values for generally larger subpartitions. The first stage 3510 can receive SAD values from the compressor tree 2830 as the SAD values become available. According to one embodiment, the adder pipeline 2840 includes four first stages 3510A-D (e.g., for calculating subpartitions AA through HH). Each of the first stages 3510A-D have four inputs 3502, 3504, 3506, and 3508. The input 3502 can deliver SAD values from the left most four-by-four subpartitions of the compressor tree 2830 (i.e., subpartitions A, E, I, and M). The input 3504 can deliver SAD values from the middle left four-by-four subpartitions of the compressor tree 2830 (i.e., subpartitions B, F, J, and N). The input 3506 can deliver SAD values from the middle right four-by-four subpartitions of the compressor tree 2830 (i.e., subpartitions C, G, K, and P). The input 3508 can deliver SAD values from the right most four-by-four subpartitions of the compressor tree 2830 (i.e., subpartitions D, H, L, and Q).

As described with reference to Tables 3 and 4, SAD values for subpartitions A, B, C, and D are available after four clock cycles (e.g., when the macroblock is located at row 0 of the macroblock column). Thus, the stage 3510A can compute subpartition AA from subpartitions A and B using an adder 3512, and subpartition 88 from subpartitions C and D using an adder 3514 after four clock cycles (see Table 5 below). The SAD values for subpartitions A, B, C, and D are stored in registers 3515, 3516, 3517, and 3518, respectively, for use by the second stage 3520 during clock cycle eight.

After eight clock cycles, subpartitions E, F, G, and H are available. Thus, on clock eight, the stage 3510B (e.g., a stage similar or identical to the stage 3510A that operates in parallel with stage 3510A) can compute subpartitions CC and DD from subpartitions E, F, G, and H using the adders 3512 and 3514.

As shown in FIG. 35B, stage 3520 has eight inputs 3502, 3504, 3506, 3508, 3521, 3523, 3525, and 3527. According to one embodiment, the adder pipeline 2840 includes two second stages 3520A-B (e.g., for calculating subpartitions R-U and W-Z). The inputs 3502, 3504, 3506, and 3508 receive SAD values from the various subpartitions of the compressor tree 2830 (e.g., subpartitions E, F, G, and H on clock cycle eight). The inputs 3521, 3523, 3525, and 3527 receive SAD values from the registers 3515, 3516, 3517, and 3518, respectively (e.g., subpartitions A, B, C, and D on clock cycle eight in the first stage 3510A). Thus, after eight clock cycles, the stage 3520A can compute a SAD value for subpartition R from subpartitions A and E (via inputs 3521 and 3502, respectively) using an adder 3522. Likewise, the stage 3520A can compute a SAD value for subpartition S from subpartitions B and F (via inputs 3523 and 3504, respectively) using an adder 3524, subpartition T from subpartitions C and G (via inputs 3525 and 3506, respectively) using an adder 3526, and subpartition U from subpartitions D and H (via inputs 3527 and 3508, respectively) using an adder 3528.

The third stage 3530 receives four inputs 3531, 3532, 3533, and 3534 from adders 3522, 3524, 3526, and 3528, respectively. According to one embodiment, the adder pipeline 2840 includes two third stages 3530A-B (e.g., for calculating subpartitions II, JJ, KK, and LL). Since subpartitions R, S. T, and U are available after eight clock cycles, the stage 3530A can compute SAD values for subpartitions II and JJ using adders 3535 and 3536, respectively. The SAD values for subpartitions II and JJ may be stored in registers 3537 and 3538, respectively, for use by the stage 3550 during clock cycle sixteen.

The fourth stage 3540 receives two inputs 3542 and 3544 from adders 3535 and 3536 respectively. According to one embodiment, the adder pipeline 2840 includes two fourth stages 3540A-B (e.g., for calculating subpartitions MM and NN). Since subpartitions II and JJ are available after eight clock cycles, the stage 3540A can compute a SAD value for subpartition MM using adder 3546.

After twelve clock cycles, subpartitions I, J, K, and L are available. Thus, the stage 3510C (e.g., a stage similar or identical to the stage 3510A that operates in parallel with stage 3510A) can compute EE and FF from subpartitions I. J. K, and L using the adders 3512 and 3514.

The SAD values for subpartitions I, J, K, and L may be stored in registers 3515, 3516, 3517, and 3518, respectively, for use by the second stage 3520B (e.g., another instance of the second stage 3520A) during clock cycle sixteen.

After sixteen clock cycles, subpartitions M, N. P, and Q are available. Thus, the stage 3510D (e.g., a stage similar or identical to the stage 3510A that operates in parallel with stage 3510A) can compute subpartitions GG and HH from subpartitions M, N, P, and Q using the adders 3512 and 3514. With SAD values for subpartitions I-N, P, and Q, the stage 3520B (e.g., a stage similar or identical to the stage 3520A that operates in parallel with stage 3520A) can compute a SAD value for subpartition W from subpartitions I and M (via inputs 3521 and 3502, respectively) using the adder 3522, subpartition X from subpartitions J and N (via inputs 3523 and 3504, respectively) using the adder 3524, subpartition Y from subpartitions K and P (via inputs 3525 and 3506, respectively) using the adder 3526, and subpartition Z from subpartitions L and Q (via inputs 3527 and 3508, respectively) using the adder 3528.

With SAD values for subpartitions W, X, Y, and Z available, the stage 3530B (e.g., a stage similar or identical to the stage 3530A that operates in parallel with stage 3530A) can compute SAD values for subpartitions KK and LL using the adders 3535 and 3536, respectively, and store the SAD values for subpartitions KK and LL in registers 3537 and 3538 for use by stage 3550. With SAD values for subpartitions KK and LL available, the stage 3540B (e.g., a stage similar or identical to the stage 3540A that operates in parallel with stage 3540A) can compute a SAD value for subpartition NN using the adder 3546.

As shown in FIG. 35C, the fifth stage 3550 has four inputs 3551, 3552, 3553, and 3554. The inputs 3552 and 3553 receive SAD values from the adders 3535 and 3536, respectively. The inputs 3551 and 3554 receive SAD values from the registers 3537 and 3538, respectively. After computing the SAD values for subpartitions KK and LL at the stage 3530B, stage 3550 can pull the SAD values for subpartitions II and JJ from registers 3537 and 3538 (of the stage 3530A), respectively, and calculate SAD values for subpartitions PP and QQ using the adders 3555 and 3556, respectively. The sixth stage 3560 receives two inputs 3562 and 3564 from the adders 3555 and 3556, respectively, and can compute a SAD value for subpartition RR using an adder 3566.

Thus, SAD values for all of the subpartitions (i.e., subpartitions A-N, P-U, W-Z. AA-NN, and PP-RR) are available every clock cycle after an initial startup latency (e.g., sixteen clock cycles). While only clocks 4, 8, 12, and 16 are shown in Table 5, the stages 3510-3560 can perform computations every clock cycle. In other words, Table 5 summarizes the calculation of the twenty-five subpartitions from the sixteen four-by-four pixel subpartitions with the macroblock at row 0 of the macroblock column. At clocks 5, 9, 13, and 17, the stages 3510-3560 can compute the same twenty-five subpartitions as if macroblock were located at row 1 of the macroblock column. In a similar vein, at clocks 6, 10, 14, and 18, the stages 3510-3560 can compute the same twenty-five subpartitions as if macroblock were located at row 2 of the macroblock column, and so forth. The SAD values may be truncated to sixteen-bits or any other suitable size.

TABLE 5

| Clock Cycle | Subpartition | | | | | | |
|---|---|---|---|---|---|---|---|
| | 4 × 4 | 8 × 4 | 4 × 8 | 8 × 8 | 16 × 8 | 8 × 16 | 16 × 16 |
| 4 | A, B, C, D | AA, BB | — | — | — | — | — |
| 8 | E, F, G, H | CC, DD | R, S, T, U | II, JJ | MM | — | — |
| 12 | I, J, K, L | EE, FF | — | — | — | — | — |
| 16 | M, N, P, Q | GG, HH | W, X, Y, Z | KK, LL | NN | PP, QQ | RR |

Figure 36:
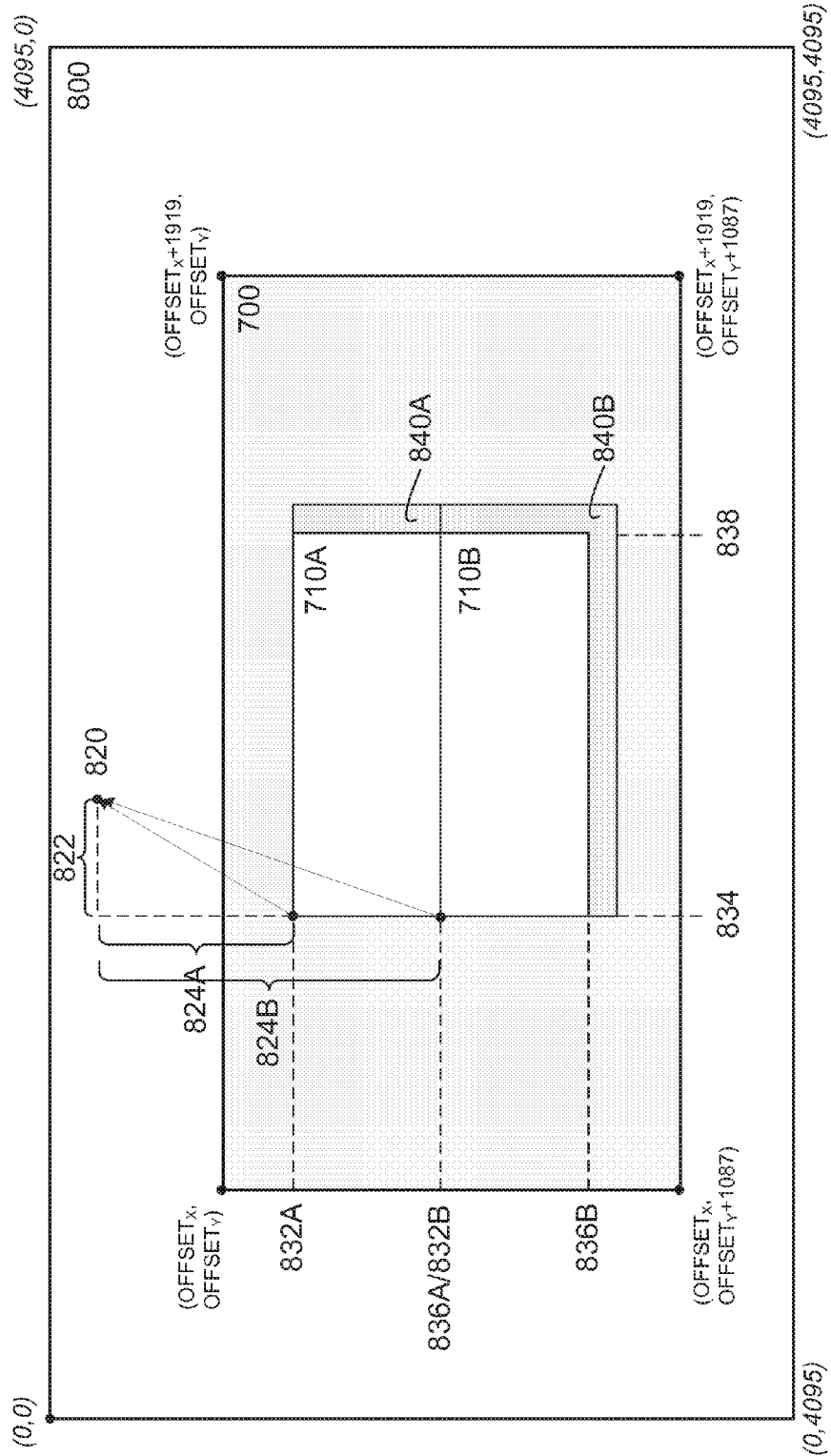
FIG. 36 is a diagram illustrating one example of creating a larger search window by combining multiple integer search results.

FIG. 36 is a diagram illustrating one example of creating a larger search window by combining multiple integer search results. For example, as shown in FIG. 36, after searching search window 710A, the best SAD values (along with the corresponding locations and distances from the EMV) can be retained. Then, while searching search window 710B, the best SAD values (along with the corresponding locations and distances from the EMV) reflect the best results within the combination of search windows 710A and 710B provided the same estimated motion vector 820 is used. Thus, concatenating the search results effectively increases the size of the search window.

Figure 37:
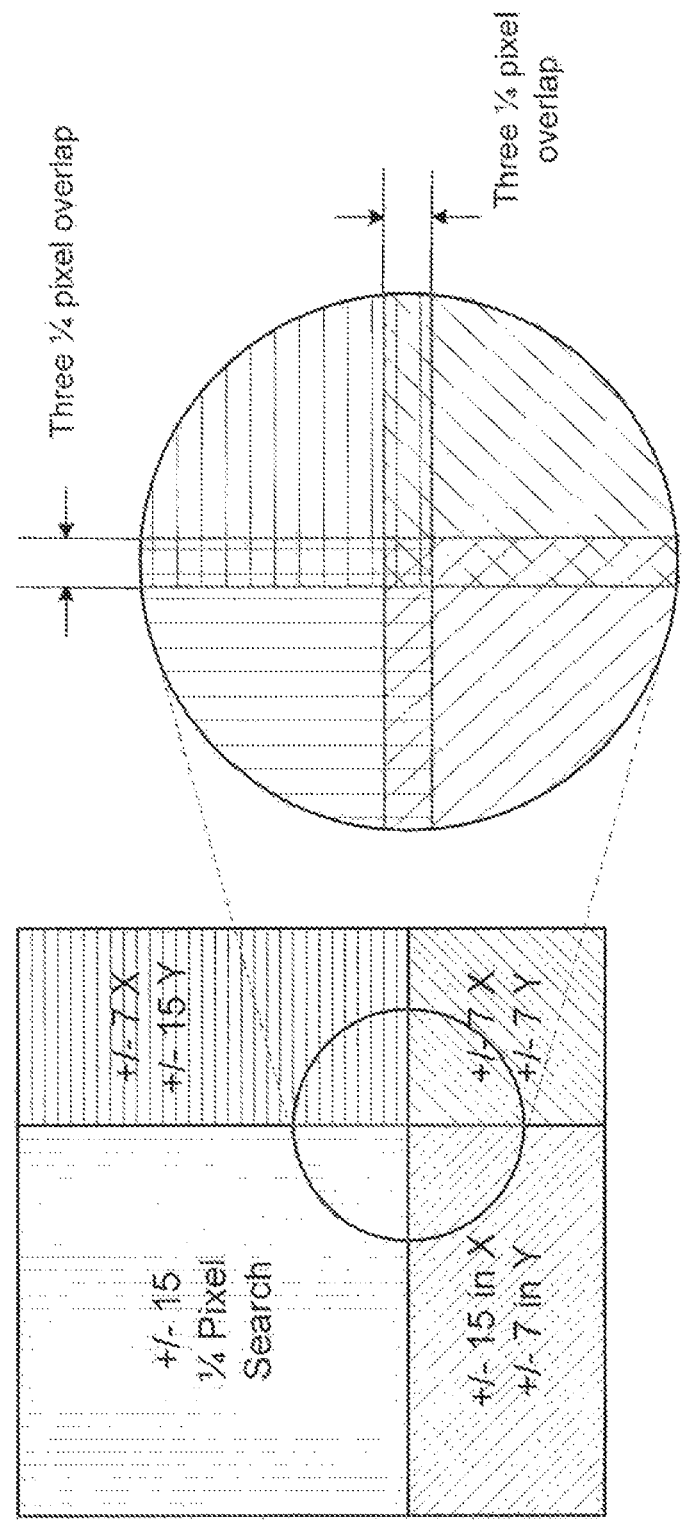
FIG. 37 is a diagram illustrating one example of creating a larger search window by combining multiple subpixel search results.

Similarly, multiple subpixel searches may be combined, as illustrated in FIG. 37. When concatenating subpixel searches, a small overlap exists because, as will be described in more detail later, subpixel searches can extend to the left of the leftmost integer pixel, above the upper most integer pixel, to the right of the rightmost integer pixel, and below the bottom pixel. Thus, at each border of concatenation, three of the ¼ pixels (or one of the ½ pixels) are redundant to prevent gaps in the subpixel search.

Subpixel Processing

Various video coding standards, such as MPEG-2 and MPEG-4, specify determining motion vectors with subpixel granularity. For example, MPEG-2 specifies motion vectors on ½ pixel boundaries and MPEG-4 specifies luma (e.g., brightness) motion vectors on ¼ pixel boundaries and chroma (e.g., the deviation from gray toward blue and red) motion vectors on ⅛ pixel boundaries.

Figure 38:
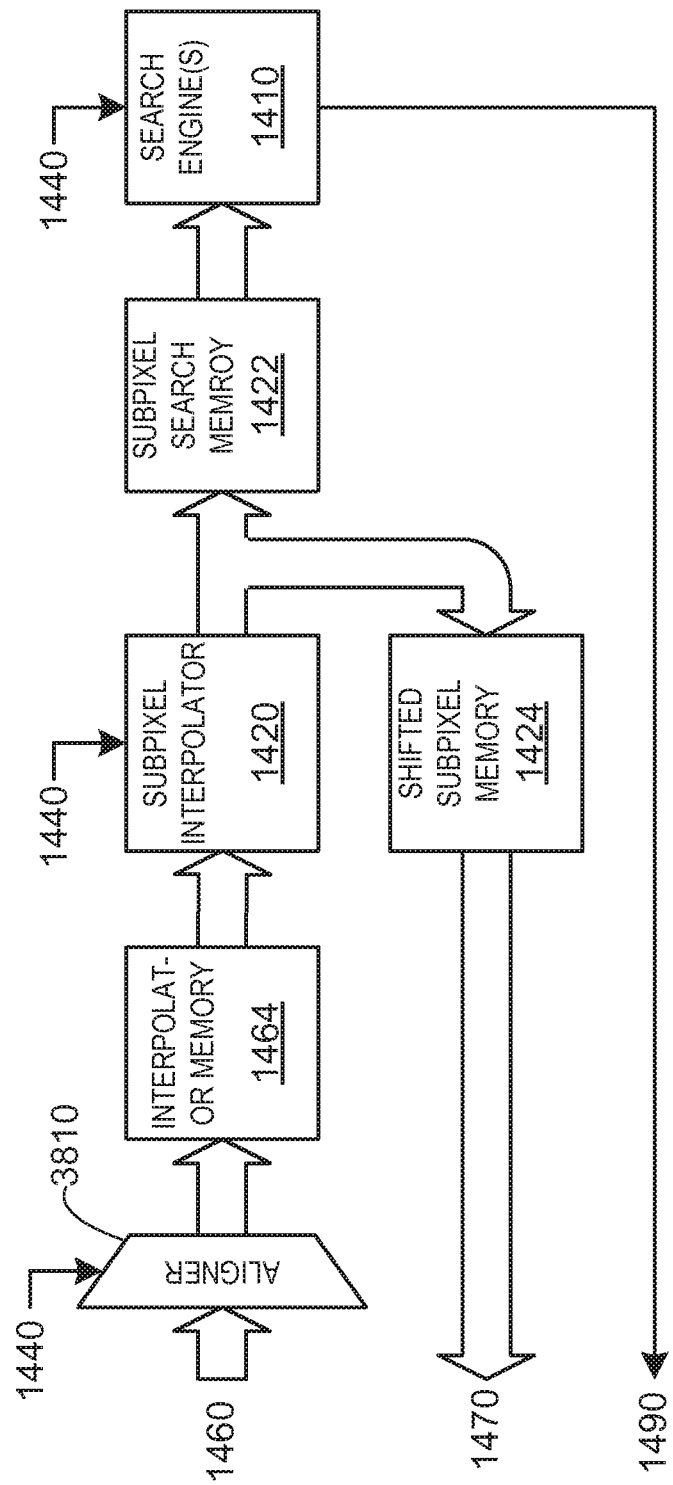
FIG. 38 is a high-level block diagram illustrating a subpixel engine within a video compression co-processor, according to one embodiment.

FIG. 38 is a high-level block diagram illustrating one example of the subpixel interpolator 1420 and associated memories within a video compression co-processor 170. As previously described with reference to FIG. 14, the subpixel interpolator 1420 interpolates subpixels from integer pixels. The interpolated subpixels may then be (1) used to shift a set of integer pixels by a specified number of subpixels and/or (2) searched to identify a location within the interpolated subpixels that best matches a subpixel macroblock. Search window pixel data 1460 can be transferred to the interpolator memory 1464 (e.g., a memory sized to hold a 28-by-28 array of integer pixels) using (1) the DMA engine 180 or (2) party line communication channels within a set of objects 115 in the array 105. According to one embodiment, one or more multiplexers 3810 may be provided to align pixel information (see below). The multiplexers 3810 can receive configuration data 1440 specifying how the integer pixels should be aligned.

As will be described in more detail below, after the integer pixel data is loaded into the interpolator memory 1464 and the subpixel interpolator 1420 receives its configuration data 1440, the subpixel interpolator 1420 can interpolate subpixels, such as quarter-sampled subpixels, one-eight sampled subpixels, and half-sampled subpixels. The interpolated subpixels can then be used to shift a set of integer pixels by a specified number of subpixels. The shifted integer pixels 1470 can be returned to the application running on the object array 105 via the application interface 1430 (not shown in FIG. 38). In addition, the interpolated subpixels may also be stored along with the integer pixels in the subpixel search memory 1422 (e.g., a memory sized to hold a 91-by-91 array of subpixels) so that one or more search engines 1410 may perform a search and return subpixel search results 1490 to the application running on the object array 105 via the application interface 1430.

Several techniques may be used to maximize subpixel interpolation throughput. For example, a memory buffer similar (or identical) to the memory buffer 2300 may be used for the interpolator memory 1464 to allow an application running on the object array 105 to begin supplying additional pixel data for a subsequent interpolation while a current interpolation is in progress. In addition, two memories may be used to store the interpolated subpixels depending how the subpixels will be used. For example, if a subpixel search will be performed, the interpolated subpixels may be stored along with the integer pixels in the subpixel search memory 1422. However, if a shift function is being performed, only the shifted integer pixels 1470 need be stored in the shifted subpixel memory 1424 (which will ultimately be returned to the application running on the object array 105). Thus, if a search is being performed using the interpolated subpixel data stored in the subpixel search memory 1422, another interpolation may be performed and the shifted integer pixels 1470 can be stored in the shifted subpixel memory 1424. Further, if a memory buffer similar (or identical) to the memory buffer 2300 is used for the subpixel search memory 1422, another interpolation may be performed and the results stored in the subpixel search memory 1422.

FIG. 39 is a diagram illustrating one example of interpolating half-sampled and quarter-sampled subpixels from integer pixels. According to one embodiment, half-sampled subpixels (e.g., those located halfway between two integer pixels within a row or column) are interpolated using a six-tap finite impulse response (FIR) filter. For example, subpixels b and h (see FIG. 39) can be calculated according to the following equations: b=(E−5F+20G+20H−5I+J); and h=(A−5C+20G+20M−5R+T). The other half-sampled subpixels (e.g., subpixels s, m, aa, bb, gg, and hh) can be calculated in a similar manner using the appropriate integer pixels. According to one embodiment, the interpolated subpixel values are rounded up and normalized by adding a constant 16 and dividing the results by 32.

The half-sampled subpixels that are not in line with integer pixels (e.g., subpixel j) can be calculated in a similar manner except that the inputs to the FIR filter are themselves half-sampled subpixels. According to one embodiment, the half-sampled subpixels used as inputs to the FIR filter are not rounded or normalized before being used. Thus, subpixel j can be calculated according to the following equation: j=(aa−5bb+20b+20s−5gg+hh+512)/1024. According to one embodiment, subpixel j is rounded up and normalized. If the calculated value of any of the half-sampled subpixels is greater than the pixel resolution, the calculated value can be reduced (or clipped) to $2^{PixelResolution}-1$. The FIR filter and/or clipping function may be designed to use twelve-bit pixels. If eight-bit or ten-bit pixels are being processed, the upper bits may be zero-filled to twelve-bits (which may result in erroneous results from the FIR filter and/or clipping function). Thus, the subpixel interpolator 1420 may receive as part of its configuration data 1440 an indication of the number of bits used to encode each pixel so that the FIR filter and/or clipping function can perform calculations using the significant bits.

The quarter-sampled subpixels (e.g., subpixels a, c, d, e, f, g, i, k, n, p, q, and r shown in FIG. 39) can be interpolated by averaging an adjacent integer pixel with an adjacent half-sampled subpixel and rounding up. For example, the quarter-sampled subpixels can be calculated according to the following equations: a=(G+b+1)/2; c=(H+b+1)/2; d=(G+h+1)/2; e=(b+h+1)/2; f=(j+b+1)/2; g=(b+m+1)/2; i=(j+h+1)/2; k=(j+m+1)/2; n=(M+h+1)/2; p=(h+s+1)/2; q=(j+s+1)/2; and r=(m+s+1)/2. The adjacent half-sampled subpixel values may be rounded up before interpolating the quarter-sampled subpixels.

FIG. 40 is a diagram illustrating one example of interpolating one-eight-sampled subpixels from integer pixels by using a weighted average of four adjacent integer pixels based on a distance from each adjacent integer pixel. For example, any of the one-eighth-sampled subpixels in FIG. 40 can be calculated from integer pixels A, B, C, and D according to Equation 3.

$$\text{Subpixel}_{1/8}[X_{diff}, Y_{diff}] = [((8-X_{diff})*(8-Y_{diff})*A + X_{diff}*(8-Y_{diff})*B + (8-X_{diff})*Y_{diff}*C + X_{diff}*Y_{diff}*D + 32)]/64$$

Equation 3

FIG. 41 is a diagram illustrating another example of interpolating half-sampled subpixels from integer pixels by averaging adjacent integer pixels. For example, any of the half-sampled subpixels (e.g., subpixels aa, bb, dd, and ee) in FIG. 41 can be calculated from integer pixels A, B, C, and D according to the following equations: aa=(A+B+1)/2; bb=(A+C+1)/2; dd=(B+D+1)/2; and ee=(C+D+1)/2. Any of the half-sampled subpixels that reside outside of the integer pixel rows and columns (e.g., subpixel cc) can be derived by averaging the four closest integer pixels. For example, subpixel cc can be calculated from the following equation: cc=(A+B+C+D+2)/4. Of course, subpixels of the same or different granularity can be interpolated in other ways, such as using different weights in the FIR filters or using other equations or filters (e.g., linear filters).

Figure 42:
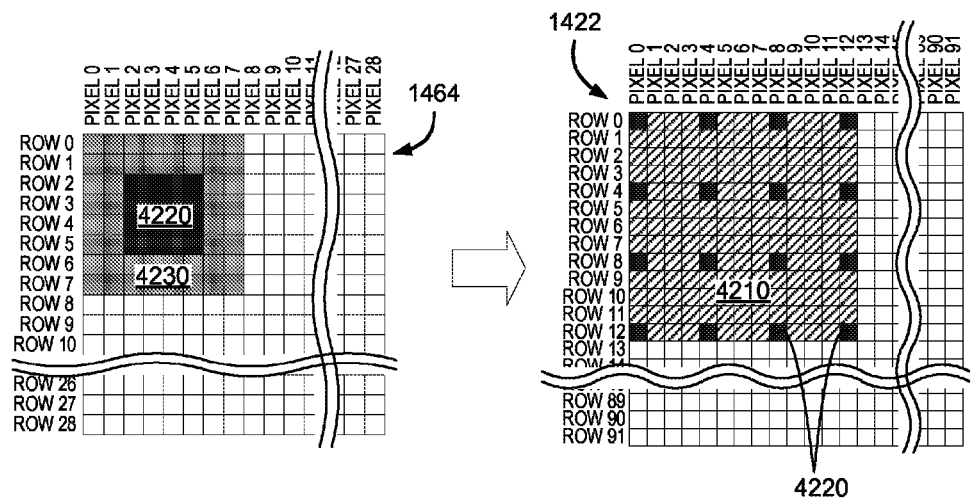
FIG. 42 is a diagram illustrating an example of interpolating subpixels from a four-by-four array of integer pixels.

FIG. 42 illustrates an example of interpolating subpixels 4210 from a four-by-four array of integer pixels 4220 using the equations described with reference to FIG. 39. A two-pixel-wide skirt 4230 is provided around the array of integer pixels 4220 so that the FIR filter described with reference to FIG. 39 can interpolate the subpixels 4210. Thus, if the subpixels 4210 were interpolated in a different manner, a larger or smaller skirt may be needed (e.g., no skirt is needed for the one-eight-sampled subpixels described with reference to FIG. 40 or the half-sampled subpixels described with reference to FIG. 41). The four-by-four array of integer pixels 4220 and the two-pixel-wide skirt 4230 can be loaded into the interpolator memory 1464 as shown in FIG. 42. Thus, only rows 0-7 and pixel columns 0-7 need be loaded with integer pixel data. After the subpixel interpolator 1420 interpolates subpixels 4210, the integer pixels 4220 can be stored along with the subpixels 4210 in the subpixel search memory 1422 and a search may be performed.

Figure 43:
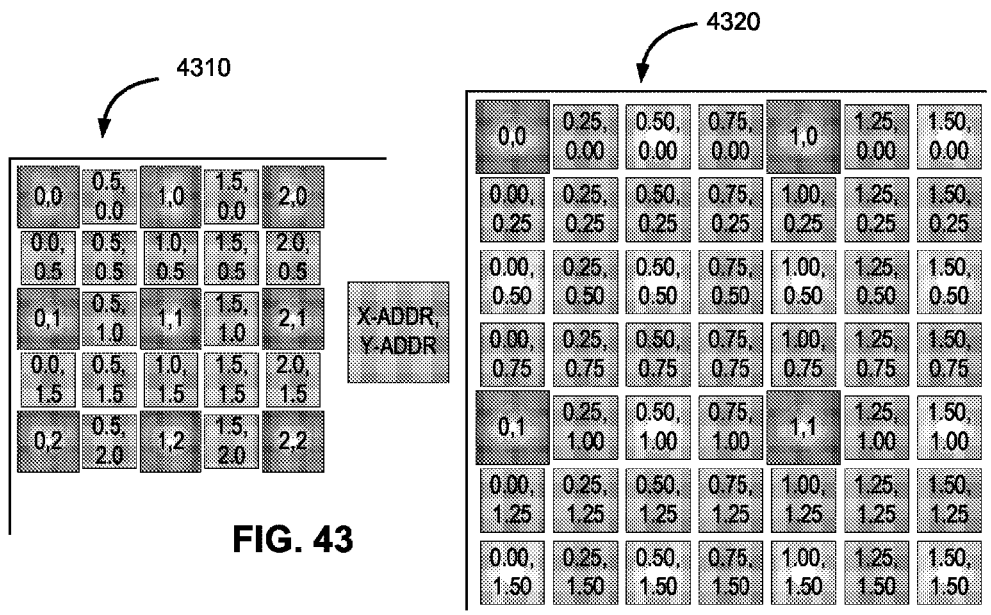
FIG. 43 is a diagram illustrating one example of a half and quarter subpixel coordinate system.

FIG. 43 illustrates two example subpixel coordinate systems 4310 and 4320. As shown, both coordinate systems 4310 and 4320 assign the first integer pixel on the upper left hand corner of the array of interpolated subpixels. Coordinate system 4310 shows half-sampled subpixels between integer pixels (e.g., integer pixels (0,1), (1,0), (0,1), (1,1), and so forth) while coordinate system 4320 shows quarter-sampled and half-sampled subpixels between integer pixels. According to one embodiment, subpixel calculations begin at pixel (0,0). Thus, any negative motion vectors with respect to pixel (0,0) reside outside of the array of interpolated subpixels.

Figure 44:
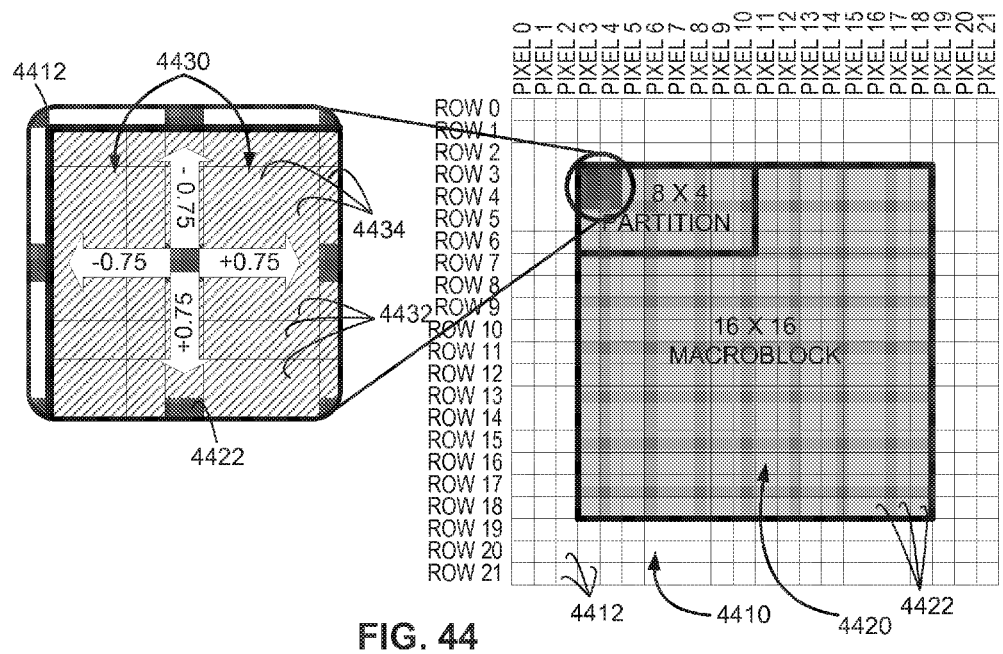
FIG. 44 is a diagram illustrating additional integer pixels used in performing quarter pixel interpolation for subpixel shifts, according to one embodiment.

FIG. 44 illustrates that additional integer pixels may be needed to perform quarter subpixel shifts. The number of additional integer pixels needed depends on how the subpixels are interpolated. For example, the FIR filter for interpolating half-sampled subpixels between two integer pixels (and hence the quarter-sampled subpixels) described with reference to FIG. 39 uses two integer pixels immediately adjacent each of the two integer pixels. Thus, providing a two-pixel skirt around an array of integer pixels 4420 being shifted allows subpixels 4432 to be interpolated between the integer pixels 4422 in the array 4420, but not subpixels 4434 outside of the array 4420. An additional one pixel skirt is needed in the direction of the shift to allow subpixels 4434 to be interpolated outside of the array 4420. A three-pixel skirt of integer pixels is really only needed on the side(s) of the array 4420 located in the direction of the shift. The other side(s) only need a two pixel skirt. For simplicity, a three-pixel skirt may provided around the entire M×N integer pixel array 4420 when performing quarter subpixel shifts (as shown in FIG. 44). After subpixels 4430 (e.g., half-sampled subpixels and quarter-sampled subpixels) are interpolated from the integer pixels in the array 4420 and the skirt 4410, the integer pixels 4422 in the array 4420 can be shifted vertically and/or horizontally by +/−¾ subpixels (e.g., three subpixels). The integer pixels in the array 4420 and the skirt 4410 can be loaded into the interpolator memory 1464 (e.g., in raster scan order) such that the upper left hand pixel of the integer pixel array 4420 resides in row 3, pixel column 3.

Figure 45:
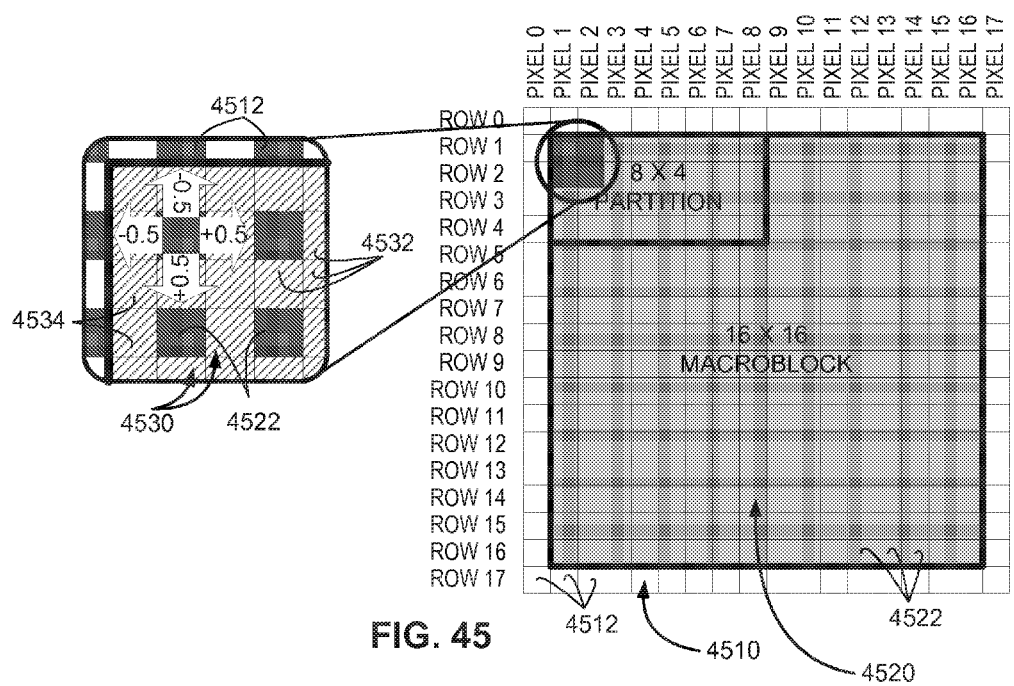
FIG. 45 is a diagram illustrating additional integer pixels used in performing half pixel interpolation for subpixel shifts, according to one embodiment.
Figure 46:
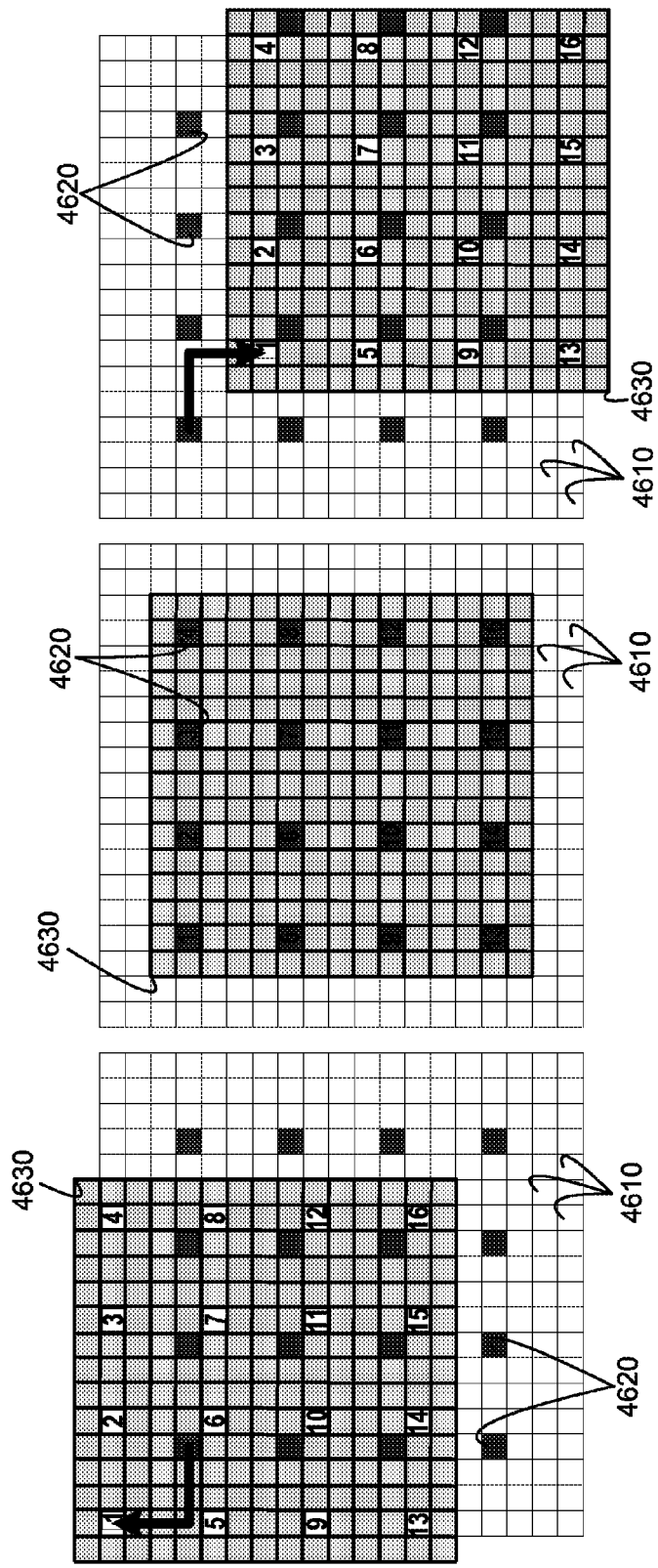
FIGS. 46A, 46B, and 46C are diagrams illustrating various examples of quarter subpixel shifts generated by extracting certain interpolated subpixels from a subpixel array.

As shown in FIG. 45, a one-integer-pixel skirt 4510 may be provided around a M×N integer pixel array 4520 when performing half and one-eighth subpixel shifts. The one-integer-pixel skirt 4510 allows subpixels 4534 to be interpolated between integer pixels 4512 and 4522 (if no skirt were provided, only subpixels 4532 could be interpolated between integer pixels 4522 in the array 4520). As with the quarter subpixel shifts, the skirt 4510 is really only needed in the direction of the shift. After subpixels 4530 (e.g., half-sampled subpixels) are interpolated from the integer pixels in the array 4520 and the skirt 4510, the integer pixels 4522 in the array 4520 can be shifted vertically and/or horizontally by +/−⅞ subpixels (e.g., one subpixel). The integer pixel array 4520 and the one integer pixel skirt 4510 can be loaded into the interpolator memory 1464 (e.g., in raster scan order) such that the upper left hand pixel of the integer pixel array 4520 resides in row 1, pixel column 1. FIG. 45 only shows half-sampled subpixels. If one-eight-sampled subpixels were interpolated, FIG. 45 would show seven subpixels between each integer pixel and the integer pixels could be shifted vertically and/or horizontally by +/−⅞ subpixels (e.g., seven subpixels). While FIGS. 44 and 45 show the integer pixel array 4420 and 4520 as a sixteen-by-sixteen array, a larger or smaller array may be used.

FIGS. 46A, 46B, and 46C are diagrams illustrating various examples of quarter subpixel shifts by extracting certain interpolated subpixels from an interpolated subpixel array. For example, after subpixels 4610 (e.g., half-sampled subpixels and quarter-sampled subpixels) are interpolated from the Integer pixels 4620, a template 4630 can extract the appropriate pixels from the array of interpolated subpixels 4610. The template 4630 may be implemented in any number of ways, such as code that extracts the appropriate pixels from the array of interpolated subpixels 4610. FIG. 46A illustrates a four-by-four integer pixel array shifted up and to the left by three subpixels. Thus, a four-by-four pixel array comprising the subpixels 4610 numbered 1-16 can be returned to the application (e.g., in raster scan order or macroblock subpartition order). FIG. 46B illustrates a four-by-four integer pixel array that has not been shifted. Thus, a four-by-four pixel array comprising the integer pixels numbered 1-16 can be returned to the application. FIG. 46C illustrates a four-by-four integer pixel array shifted down and to the right by three subpixels. Thus, a four-by-four pixel array comprising the subpixels 4610 numbered 1-16 can be returned to the application. In all three examples shown in FIGS. 46A-C, the array of pixels returned to the application running on the object array 105 via the application interface 1430 matches the dimensions of the original array (e.g., in these examples, a four-by-four pixel array).

In performing subpixel searches, one or more search engines 1410 (see FIG. 14) and the subpixel interpolator 1420 receive configuration data 1440. The search engines 1410 also receive appropriate subpixel macroblocks from the subpixel macroblock memory 1454. According to one embodiment, the configuration data 1440 will indicate the size of the subpixel macroblock (e.g., four-by-four, four-by-eight, eight-by-four, eight-by-eight, eight-by-sixteen, and sixteen-by-sixteen). After the appropriate integer pixels are loaded into the interpolator memory 1464, the subpixel interpolator 1420 can interpolate subpixels which are stored along with the integer pixels in the subpixel search memory 1422. The one or more search engines 1410 can then search for the location within the array of interpolated subpixels that best matches the subpixel macroblock.

Figure 47:
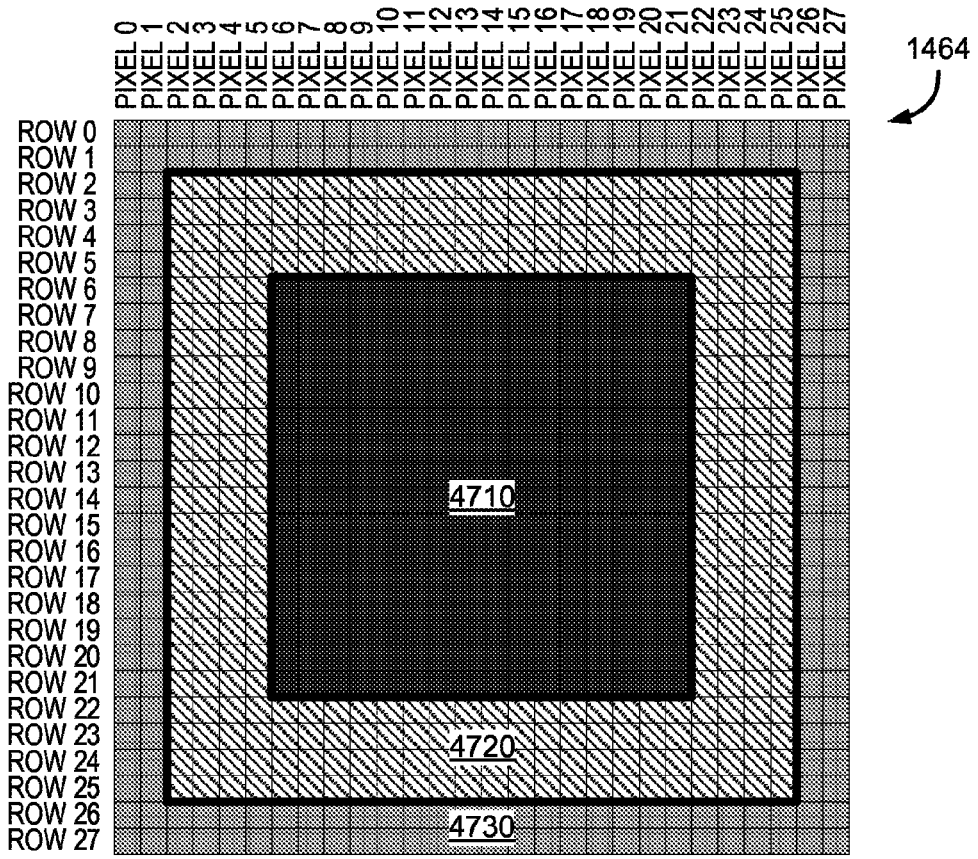
FIG. 47 is a diagram illustrating one example of various integer pixels used in performing a quarter subpixel search.
Figure 48:
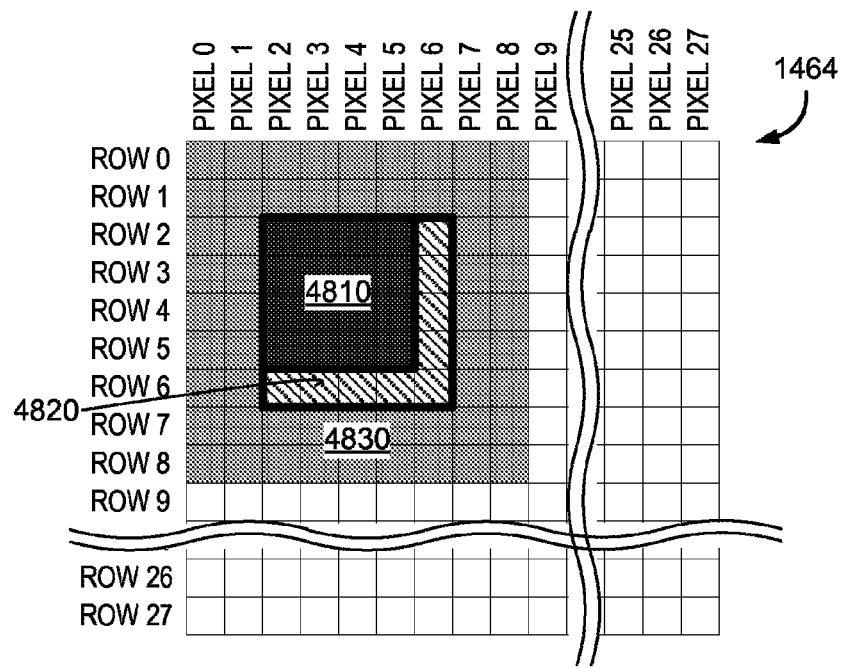
FIG. 48 is a diagram illustrating another example of various integer pixels used in performing a quarter subpixel search.

FIGS. 47 and 48 illustrate various integer pixels that may be used in performing subpixel searches. The number of integer pixels needed to perform a subpixel search depends on several factors, such as the subpixel resolution (e.g., quarter-sampled, one-eighth-sampled, or half-sampled subpixels), the size of the integer macroblock, and any additional pixels that should be searched. For example, after performing an integer search, more than one candidate for the best match may be identified. One candidate may be located closer to the estimated motion vector, but have a larger calculated SAD value (e.g., after comparing a sixteen-by-sixteen array of search window pixels to sixteen-by-sixteen array of macroblock block pixels). Another candidate may be located farther from the estimated motion vector, but have a smaller calculated SAD value. Performing a subpixel search within and around the sixteen-by-sixteen array of search window pixels may help refine the answer found using the integer search.

The example shown in FIG. 47 illustrates a sixteen-by-sixteen array of integer pixels 4710 along with a four pixel search window skirt 4720. If a search is being performed with a quarter subpixel resolution (e.g., using the equations described with reference to FIG. 39), an additional two pixel interpolation skirt 4730 is provided around the four pixel search window skirt 4720 (e.g., for use by the FIR filter). The size of the array of integer pixels 4710 selected to reconstruct a macroblock relates to the subpartition size of the subpixel macroblock that requires more searching. For example, a subpixel search may be performed using integer pixels in the search window corresponding to the sixteenby-sixteen macroblock (FIG. 47), one of the four-by-four subpartitions (FIG. 48), or one of the other subpartitions.

According to one embodiment, the search window skirt 4720 is four pixels. However, the search window skirt 4720 can be larger or smaller than four pixels. In addition, the search window skirt 4720 may not completely surround the array of integer pixels 4710 (e.g., the skirt 4720 may just be on one side of the array 4710). According to one embodiment, the search window skirt 4720 may be between one pixel wide (e.g., on one side of the array 4710) and eight pixels wide (e.g., a four pixel skirt surrounding the array 4710). Thus, when performing a search with a quarter subpixel resolution and an M×N array of integer pixels 4710, the number of integer pixels can be between M+1+4 and M+8+4 pixels in the horizontal direction and between N+1+4 and N+8+4 pixels in the vertical direction.

The size of the search window skirt 4720 may be bound by the size of the interpolator memory 1464, the size of the array 4710, and the subpixel resolution. For example, if the interpolator memory 1464 is sized to hold an array of twenty-eight pixels by twenty-eight pixels and a search is performed using a sixteen-by-sixteen array 4710 at a quarter subpixel resolution, only a four pixel search window skirt 4720 will fit in the interpolator memory 1464. Thus, the search window skirt 4720 may be larger if the array of integer pixels 4710 is smaller (e.g., a four-by-four macroblock partition), the interpolation skirt 4730 is not needed (e.g., if performing a search with a one-eight pixel resolution), or the interpolator memory 1464 is sized to store more pixels. In addition, the array 4710 can be larger if the search window skirt 4720 is smaller, the Interpolation skirt 4730 is not needed, or the interpolator memory 1464 is larger. While the array 4710 may be centered in the interpolator memory 1464 (as shown in FIG. 47), the array 1710 may also be off center. For example, as shown in FIG. 48, a four-by-four array of integer pixels 4810 is loaded in the upper-left portion of the interpolator memory 1464 along with a one pixel skirt 4820 and a two pixel interpolation skirt 4830. In the example shown in FIG. 48, the search window skirt 4820 only surrounds half of the array 4810.

Figure 53:
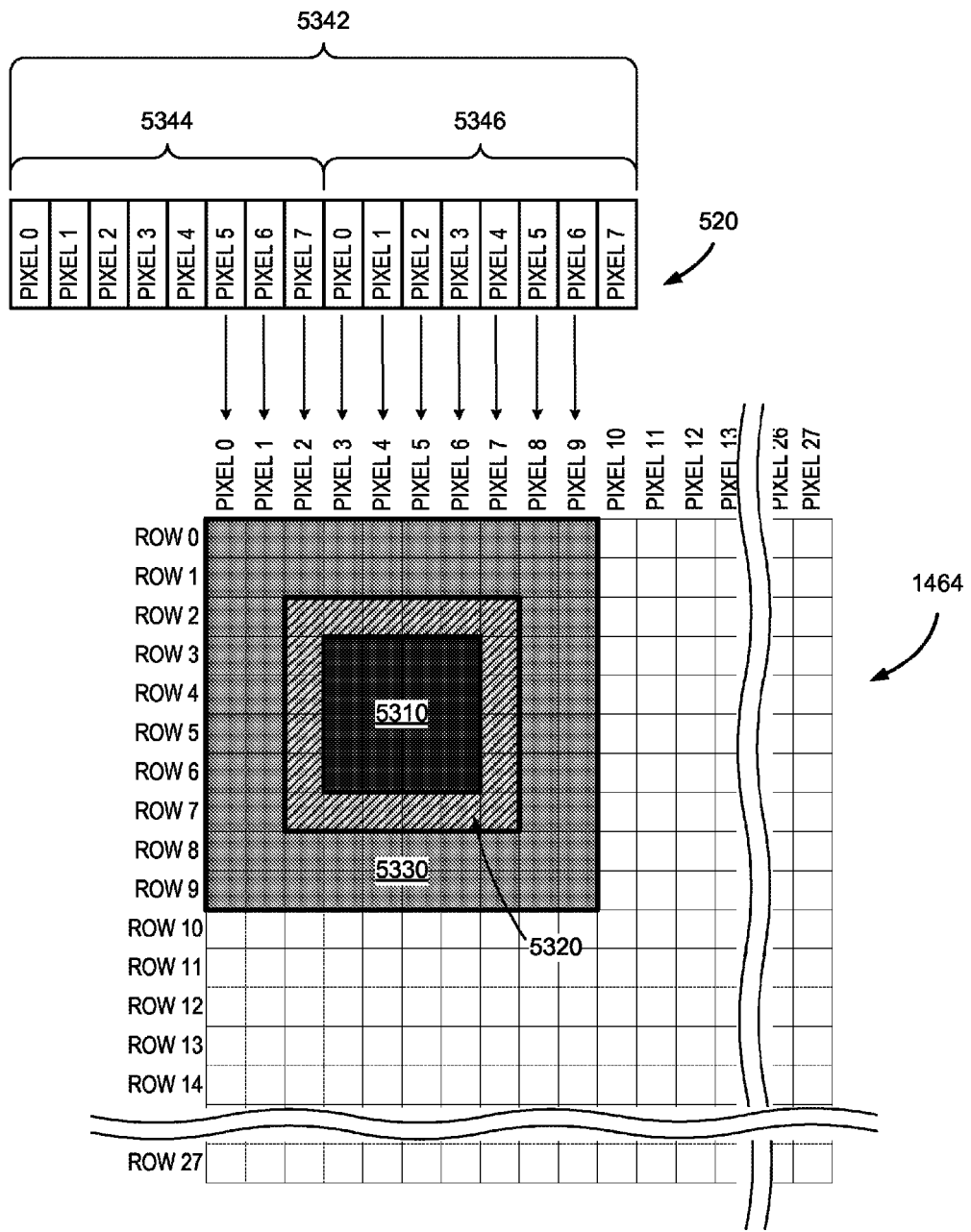
FIG. 53 is a diagram illustrating yet another example of aligning a quarter subpixel search area to integer pixels transferred to memory within a subpixel engine.
Figure 54:
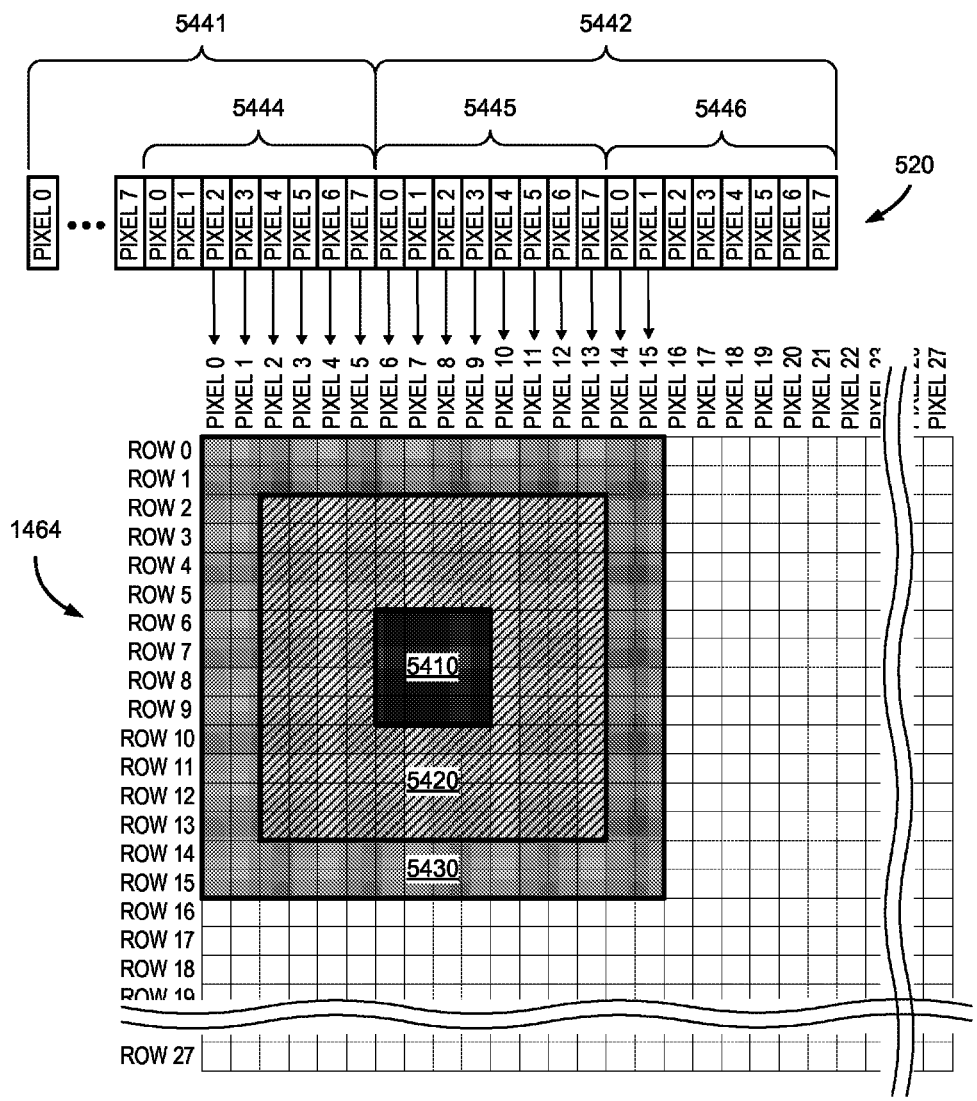
FIG. 54 is a diagram illustrating still another example of aligning a quarter subpixel search area to integer pixels transferred to memory within a subpixel engine.

As will be described in more detail below, integer pixels can be stored in the interpolator memory 1464 in raster scan order starting at the upper left pixel, proceeding across a row, and then proceeding at the left hand side of the next lower row, and so forth. Only pixels required to perform the interpolation need to be stored in the interpolator memory 1464. For example, FIG. 53 illustrates one example that loads a four-by-four pixel array 5310 along with a seven quarter pixel search window skirt 5320, and a two pixel interpolation skirt 5330 while FIG. 54 illustrates another example that loads a four-by-four pixel array 5410 along with a thirty-one quarter pixel search window skirt 5420, and a two pixel interpolation skirt 5430.

Figure 49:
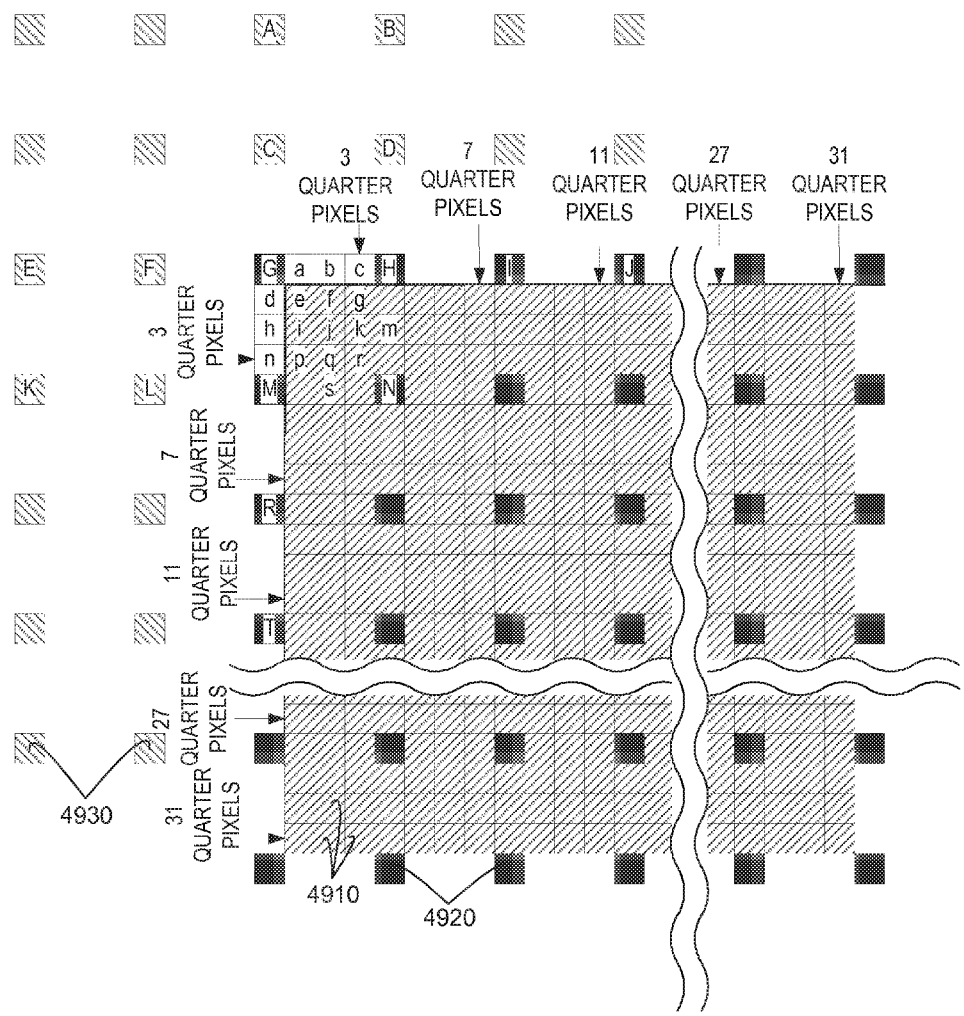
FIG. 49 is a diagram illustrating one example of interpolating quarter subpixels from integer pixels.

After the integer pixels are loaded into the interpolator memory 1464, the subpixel interpolator 1420 can interpolate the subpixels (and store the subpixels and integer pixels in the subpixel search memory 1422). For example, FIG. 49 illustrates interpolating subpixels 4910 (e.g., subpixels a-k, m-n, and p-s) from integer pixels 4920 (e.g., integer pixels G, H, I, J, M, N. R, and T) and interpolation skirt pixels 4930 (e.g., skirt pixels A-F and K-L) using the equations described with reference to FIG. 39. The ending locations of various quarter pixel searches are also illustrated in FIG. 49. For example, starting with the subpixel 4910 labeled 'e', a three quarter pixel search ends at subpixel 'g' in the horizontal direction and 'p' in the vertical direction. The ending locations of seven, eleven, twenty-seven, and thirty-one quarter pixels searches are also shown in FIG. 49.

Figure 50:
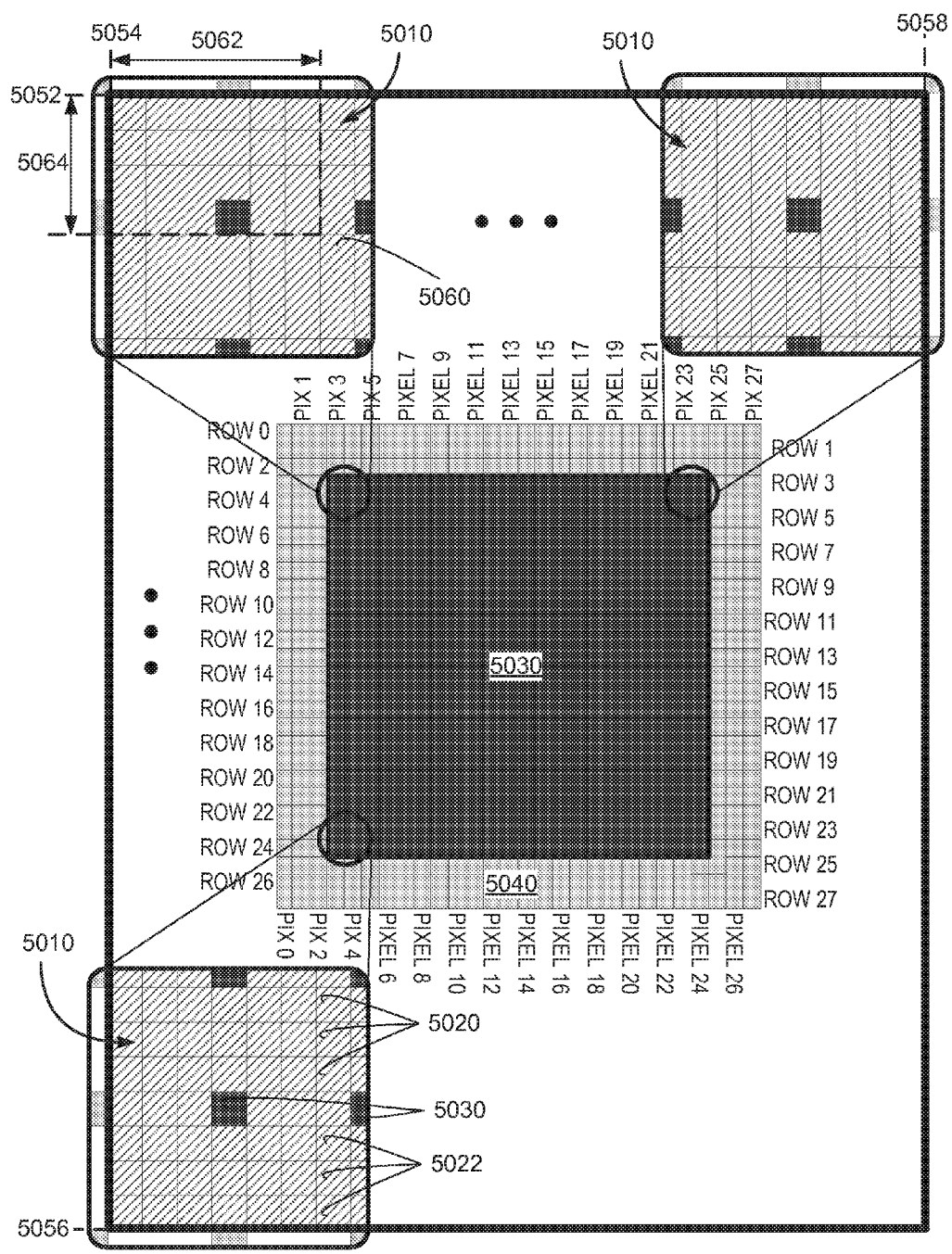
FIG. 50 is a diagram illustrating one example of the size of a search window comprising interpolated subpixels and integer pixels.

After receiving configuration data 1440, one or more search engines 1410 can perform a search using the subpixel macroblock stored in the subpixel macroblock memory 1454 and subpixel data stored in the subpixel search memory 1422. FIG. 50 illustrates the size of a search window 5010 comprising interpolated subpixels 5020 (e.g., half-sampled and quarter-sampled subpixels) and integer pixels 5030. The subpixels 5020 shown in FIG. 50 have been interpolated from the integer pixels 5030 and interpolation skirt 5040 using the equations described with reference to FIG. 39. The integer pixels 5030 may include a sixteen-by-sixteen array of integer pixels 4710 along with a three pixel search window skirt 4720 similar to that described with reference to FIG. 47. The interpolation skirt 5040 is three pixels wide (instead of just two pixels needed for the FIR filter) to allow three additional subpixels 5022 to be calculated outside of the integer pixels 5030 (e.g., a three pixel wide skirt surrounding the integer pixels 5030). Thus, a search can be performed vertically and/or horizontally by an additional ±3 subpixels (e.g., three subpixels 5022).

The search window 5010 is bounded by a starting search window row 5052, starting search window column 5054, ending search window row 5056, and ending search window column 5058. Thus, the upper left corner of the search window 5010 has coordinates (starting search window row 5052, starting search window column 5054) and the lower right corner of the search window 5010 has coordinates (ending search window row 5056, ending search window column 5058). FIG. 50 also illustrates an estimated motion vector 5060. Using the coordinate system 4320 described with reference to FIG. 43, the estimated motion vector 5060 would have coordinates of 1.75, 1.25 (X-Addr., Y-Addr.). The search engines 1410 may receive a ΔX value 5062 and a ΔY value 5064 (or the ΔX value 5062 and the ΔY value 5064 multiplied by λ) in the configuration data 1440 for distance calculation purposes.

The search proceeds in an identical or similar manner to the integer search previously described. Thus, the subpixel macroblock can start in the upper left hand corner of the search window 5010, perform a SAD computation, and iteratively move down by one row. After reaching the bottom of the search window (or some other stopping point), the subpixel macroblock can move right by a certain number of columns and start perform SAD computations on another macroblock column. The subpixel macroblock continues the process of iteratively moving down by one row until the stopping point is reached and moving to the right by another macroblock column until the search window 5010 has been searched. Of course, the subpixel macroblock column may snake its way through the search window 5010 in other ways, such as left to right, bottom to top, and diagonally.

According to one embodiment, the subpixel macroblock comprises a sixteen-by-sixteen array of pixels that may be divided into multiple subpartitions (e.g., eight-by-sixteen, sixteen-by-eight, eight-by-eight, eight-by four, four-by-eight, and four-by-four) so that a N-stage pipeline, multiplexers, compressor tree, and adder pipeline similar or identical to that described with reference to FIG. 28 may be used. However, the subpixel macroblock may be larger or smaller. For example, the subpixel macroblock may comprise a four-by-four array of pixels. The search engine(s) 1410 can receive the size of the subpixel macroblock as part of the configuration information 1440 so that search engine(s) 1410 can accommodate for the smaller macroblock size (e.g., utilize all or portion of the compressor tree and bypass all or part of the adder tree).

After processing the search window 5010, the search engine(s) 1410 return the subpixel search results 1490 (e.g., one subpixel SAD value, corresponding horizontal and vertical coordinates, and/or corresponding relative distances to the EMV) to the application running on the object array 105 via the application interface 1430.

Regardless of whether a subpixel shift function or a subpixel search function is being performed, integer pixels are stored in the interpolator memory 1464. According to one embodiment, pixel data is transferred from the external memory 520 (via the XRAM interface 155) to the object array 105 (e.g., eight twelve-bit pixels per read or sixteen eight-bit pixels per read). One or more objects 115 may process and/or format the data and store the data within one or more IRAMs 160. The application running on the object array 105 can then instruct the DMA engine 180 to transfer the data from one or more IRAMs 160 to the interpolator memory 1464 (e.g., the data can be moved in raster scan order with 16, 32, 48, 64, 80, 96, or 128 bytes moved per row). Of course, the data can also be transferred to the interpolator memory 1464 via the party line communication channels within a set of objects 115 in the array 105.

The integer pixel data may be transferred from the external memory 520 to one or more IRAMs 160 in multiples of 16 pixels for each row. For example, if the XRAM interface 155 moves data in 32-byte segments, 32 one-byte pixels or 16 two-byte pixels can be moved in one transfer. Because the XRAM interface 155 may transfer data in 32-byte segments, the subpixel interpolator 1420 may not need all of the pixel data transferred (e.g., only a few pixels at the beginning or end of transfer may be needed).

Figure 51:
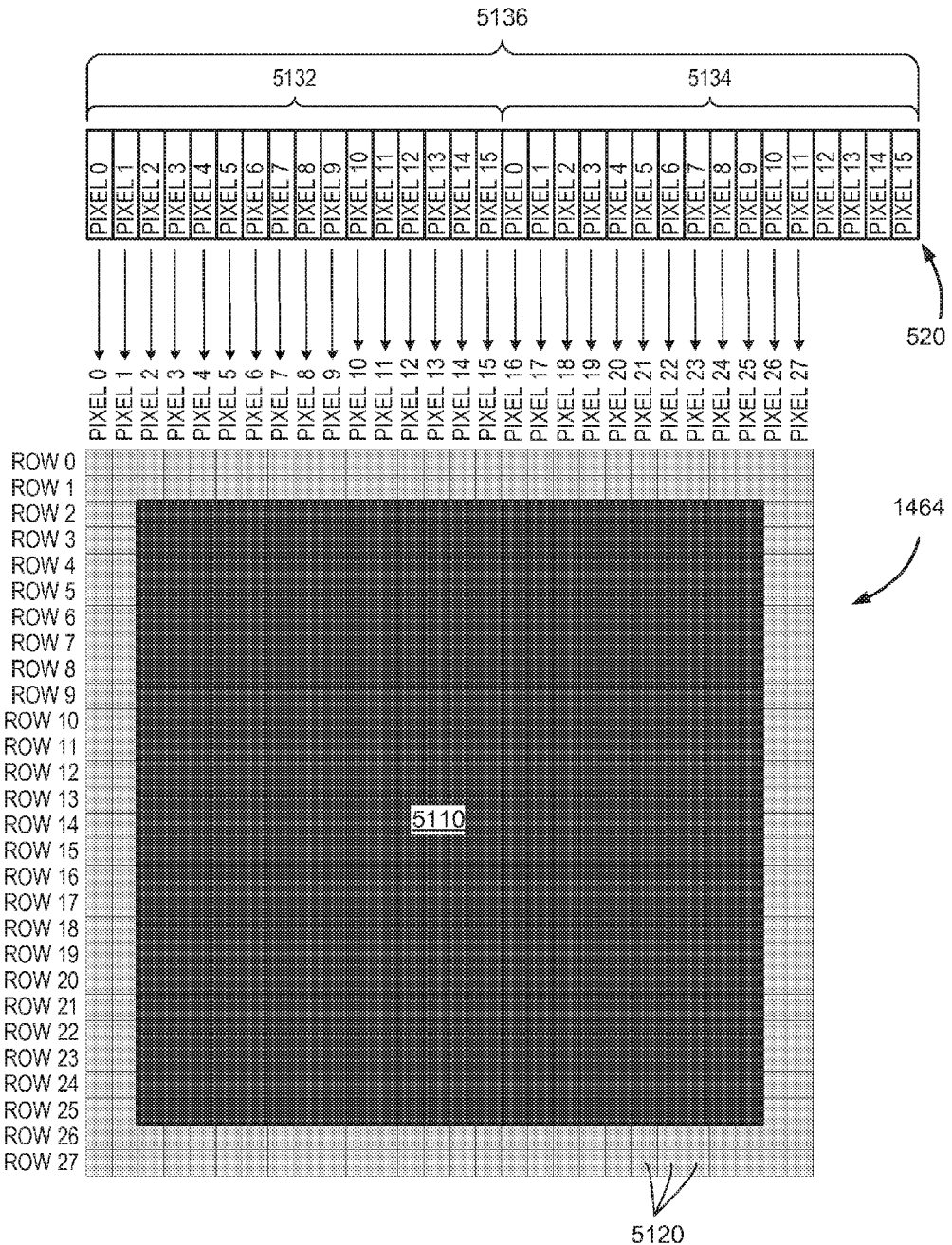
FIG. 51 is a diagram illustrating one example of aligning a quarter subpixel search area to integer pixels transferred to memory within a subpixel engine.

FIG. 51 illustrates one example of how integer pixels 5110 and interpolation skirt pixels 5120 that will be transferred to the interpolator memory 1464 (e.g., a 28-by-28 integer pixel memory) might align with integer pixel data in the external memory 520. The integer pixels 5110 may include the sixteen-by-sixteen array of integer pixels 4710 along with the four pixel search window skirt 4720 described with reference to FIG. 47. The interpolation skirt pixels 5120 may be two pixels wide to allow the FIR filter described with reference to FIG. 39 to interpolate half-sampled subpixels. The XRAM interface 155 transfers thirty-two two-byte pixels in two transfers 5132 and 5134 or thirty-two one-byte pixels in one transfer 5136. As shown in FIG. 51, the left most column of the integer pixels 5110 is aligned with pixel 2 of the transfers 5132 and 5136. Because the interpolation skirt pixels 5120 (e.g., two-pixels wide) are used to interpolate subpixels, all the pixels at the beginning of the transfers 5132 and 5136 are used. However, pixels 12-15 from the transfers 5134 and 5136 can be discarded because only twenty-eight integer pixels need to be transferred to the interpolator memory 1464. The one or more multiplexers 3810 (FIG. 38) may be used to discard the unused pixels.

Figure 52:
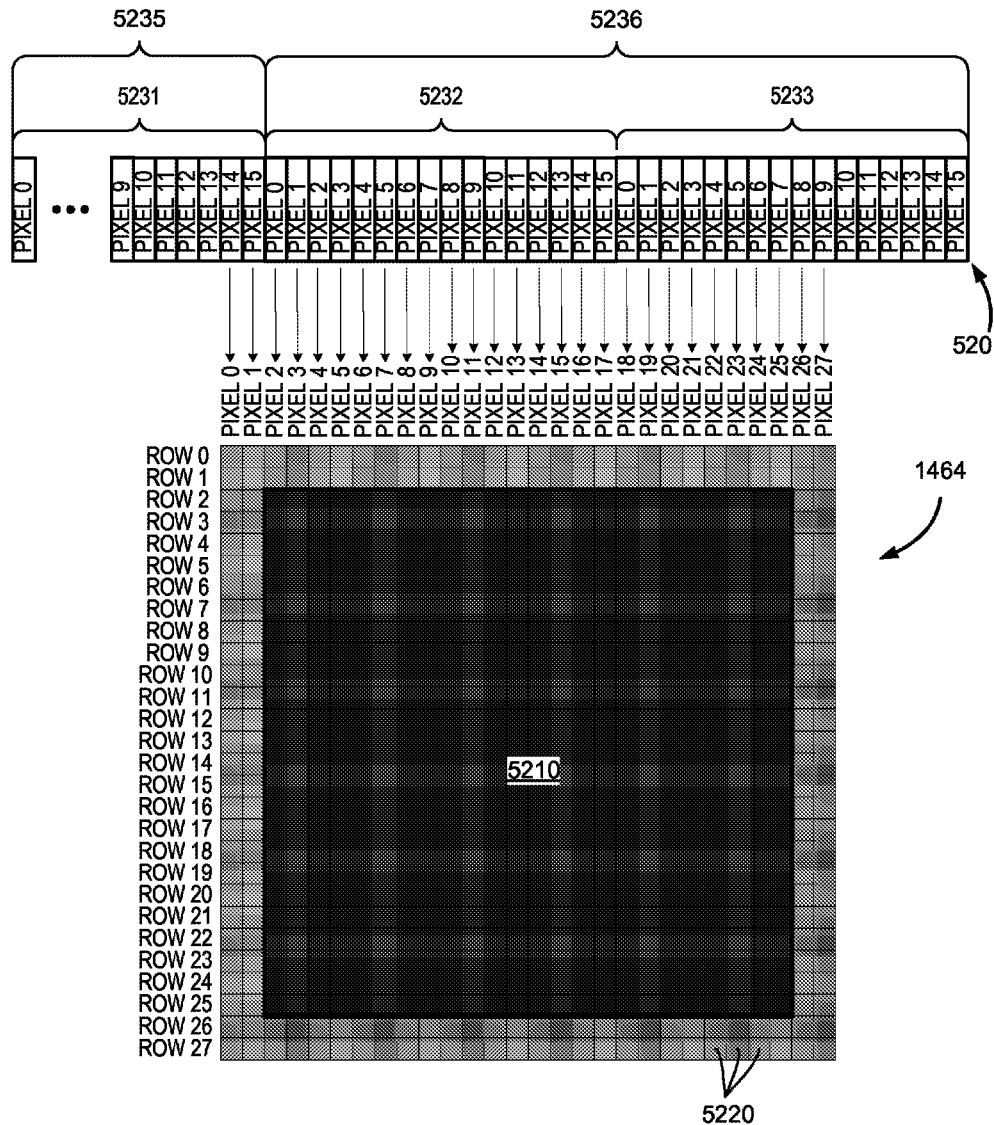
FIG. 52 is a diagram illustrating another example of aligning a quarter subpixel search area to integer pixels transferred to memory within a subpixel engine.

In the example illustrated in FIG. 52, two one-byte pixel transfers 5235 and 5236 or three two-byte pixel transfers 5231, 5232, and 5233 are used to transfer twenty-eight integer pixels 5210 to the interpolator memory 1464. The left most column of the integer pixels 5210 is aligned with pixel 0 of the transfers 5232 and 5236. However, because interpolation skirt pixels 5220 (e.g., two-pixels wide) are needed to interpolate subpixels, two additional pixels are needed per row before transfer 5232 and 5236. Thus, pixels 14-15 of transfers 5231 and 5235 will be used for interpolation and pixels 0-13 of transfer 5231 and 5235 can be discarded. All of the pixels in transfer 5232 are used. However, pixels 10-15 in the transfer 5233 and pixels 26-31 in the transfer 5236 can be discarded because only twenty-eight integer pixels need to be transferred to the Interpolator memory 1464. The one or more multiplexers 3810 may be used to discard the unused pixels.

The array of integer pixels may be larger or smaller than sixteen-by-sixteen. For example, FIG. 53 illustrates a four-by-four pixel array 5310 surrounded by a one-pixel wide search window skirt 5320 (e.g., for a seven quarter pixel search). A two-pixel wide interpolation skirt 5330 is provided around the array 5310 and skirt 5320 for interpolation purposes. By way of another example, FIG. 54 illustrates a four-by-four pixel array 5410 surrounded by a four-pixel wide search window skirt 5420 (e.g., for a thirty-one quarter pixel search). A two-pixel wide interpolation skirt 5430 is provided around the array 5410 and skirt 5420 for interpolation purposes. When processing a smaller pixel array, the entire interpolator memory 1464 does not need to be fully populated. To reduce the number of bits transferred (and thereby increasing subpixel throughput), integer pixel data can be segmented into 16-byte transfers. Thus, two-byte pixels can be transferred in multiples of eight pixels and one-byte pixels can be transferred in multiples of sixteen pixels.

In the example illustrated in FIG. 53, one one-byte pixel transfer 5342 or two two-byte pixel transfers 5344 and 5346 are used to transfer integer pixels 5310, 5320, and 5330 to the interpolator memory 1464. The left most column of the integer pixels 5310 is aligned with pixel 0 of the transfer 5346 and pixel 0 of the second set of eight pixels in the transfer 5342. Thus, pixels 0-4 of transfer 5344 and pixels 0-4 of the first set of eight pixels in the transfer 5342 can be discarded. In addition, pixel 7 of the transfer 5346 and pixel 7 of the second set of eight pixels in the transfer 5342 can be discarded. The one or more multiplexers 3810 may be used to discard the unused pixels.

In the example illustrated in FIG. 54, two one-byte pixel transfers 5441 and 5442 or three two-byte pixel transfers 5444, 5445, and 5446 are used to transfer integer pixels 5410, 5420, and 5430 to the interpolator memory 1464. The left most column of the integer pixels 5410 is aligned with pixel 0 of the transfer 5445 and pixel 0 of the first set of eight pixels in the transfer 5442. Because additional search window skirt pixels 5420 and interpolation skirt pixels 5430 are needed, six additional pixels are needed per row before transfer 5442 and 5445. Pixels 2-7 of the transfer 5444 will be used while pixels 0-1 of the transfer 5444 can be discarded. In addition, pixels 2-7 in the second set of eight pixels in the transfer 5441 will be used while pixels 0-7 in the first set of eight pixels in the transfer 5441 and pixels 0-1 in the second set of eight pixels in the transfer 5441 can be discarded. Further, pixels 2-7 of the transfer 5446 and pixels 2-7 of the second set of eight pixels in the transfer 5442 can be discarded. The one or more multiplexers 3810 may be used to discard the unused pixels.

While the examples described with FIGS. 53 and 54 illustrate transfers segmented into 16-byte transfers (e.g., moving eight two-byte pixels per transfer or sixteen one-byte pixels per transfer), the XRAM interface 155 reads data from the external memory 520 in 32-byte sets. Thus, it is possible that the entire first 16-bytes of second 16-bytes of data transferred using the XRAM interface 155 may be discarded. The application running on the object array 105 can purge 16-byte sets that will be unused itself or can pass the unused 16-byte sets to the interpolator memory 1464 and allow the one or more multiplexers 3810 to discard the unused 16-byte sets.

Figure 55:
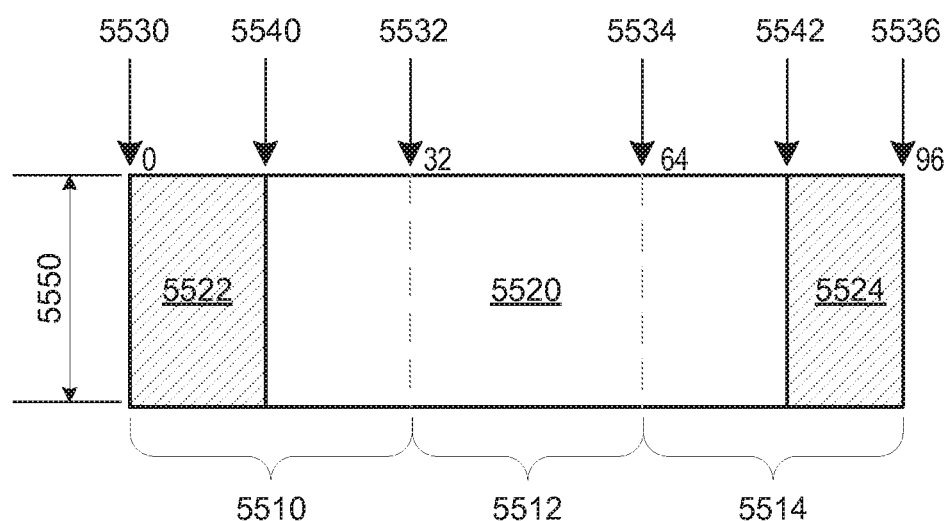
FIG. 55 is a diagram illustrating one example of extracting integer pixels from data transfers from external memory.

FIG. 55 illustrates one example of the one or more multiplexers 3810 extracting integer pixels from the 32-byte data transfers from the external memory 520 (via the XRAM interface 155). Three 32-byte data transfers 5510, 5512, and 5514 are shown transferring a row of a N×M pixel array 5520 (which may include appropriate skirt pixels) and two 16-byte sets of unused data 5522 and 5524 to the interpolator memory 1464. While three 32-byte data transfers 5510, 5512, and 5514 are shown, additional or fewer 32-byte data transfers may be needed to transfer the entire N×M pixel array 5520. For example, the N×M pixel array 5520 (and any unused 16-byte data sets) may be transferred in one, two, or four 32-byte transfers. The first 32-byte data transfers 5510, 5512, and 5514 begin and end on naturally aligned boundary 5530, 5532, 5534, and 5536. While it is possible for the N×M pixel array 5520 to begin or end on any of the naturally aligned boundaries 5530, 5532, 5534, and 5536, FIG. 55 shows the array 5520 starting at pixel column 5540 and ending at pixel column 5542. The data to the left of pixel column 5540 and to the right of pixel column 5542 can be discarded. For example, the array 5520 may start at pixel column 16, so pixel columns 0-15 may be discarded. Likewise, the array 5520 may end at pixel column 79, so pixel columns 80-96 can be discarded. Since the array 5520 has a height 5550 of M rows, M data transfers 5510, 5512, and 5514 are used to transfer the entire array 5520.

Although FIGS. 51-55 showed data being transferred from the external memory 520 to the interpolator memory 1464, the intermediate step of storing the data in one or more IRAMs 160 was not shown. The DMA engine 180 can be used to transfer data from one or more IRAMs 160 to the interpolator memory 1464. According to one embodiment, the data stored in the interpolator memory 1464 starts on 16-byte boundaries and multiples of 16-bytes are written for each row (see FIGS. 53 and 54). Each set of 16-bytes can be spread across any number of IRAMs 160, such as 1, 2, or 4 IRAMs 160. The organization of pixel data in the IRAMs 160 may vary based upon the size of each pixel. For example, for one-byte pixels, 16, 32, 48, or 64 pixels may be stored per integer pixel row and for two-byte pixels, 16, 32, or 48 pixels may be stored per integer pixel row.

The data format within the IRAMs 160 may depend on how many IRAMs 160 are used to store the pixel data. For example, if pixel rows are spread across one IRAM 160, only a portion of each row fits across the IRAM (e.g., pixel columns 0-3, 1-7, 8-11, etc.). The other portions of the rows (i.e., pixel columns 4-7, 8-11, etc.) are stored in the next address location. For example, address 0 could contain pixel columns 0-3, address 1 could contain pixel columns 4-7, address 2 could contain pixel columns 8-11, address 3 could contain pixel columns 12-15, and so forth. Thus, a 16-pixel-wide row could occupy addresses 0-3, a 32-pixel-wide row could occupy addresses 0-7, and a 64-pixel-wide row could occupy addresses 0-15.

If the pixel rows are spread across two IRAMs 160, address 0 of IRAM A could contain pixel columns 0-3 and address 0 of IRAM B could contain pixel columns 4-7, address 1 of IRAM A could contain pixel columns 8-11 and address 1 of IRAM B could contain pixel columns 12-15, and so forth. Thus, a 16-pixel-wide row could occupy addresses 0-1 of IRAMs A and B, a 32-pixel-wide row could occupy addresses 0-3 of IRAMs A and B, and a 64-pixel-wide row could occupy addresses 0-7 of IRAMs A and B.

If the pixel rows are spread across four IRAMs 160, address 0 of IRAM A could contain pixel columns 0-3, address 0 of IRAM B could contain pixel columns 4-7, address 0 of IRAM C could contain pixel columns 8-11, address 0 of IRAM D could contain pixel columns 12-15, address 1 of IRAM A could contain pixel columns 16-19, address 1 of IRAM B could contain pixel columns 20-23, address 1 of IRAM C could contain pixel columns 24-27, address 1 of IRAM D could contain pixel columns 28-31, and so forth. Thus, a 32-pixel-wide row could occupy addresses 0-1 of IRAMs A-D and a 64-pixel-wide row could occupy addresses 0-3 of IRAMs A-D. A 16-pixel-wide row could be spread across a single address row of IRAMs A-D. However, if the entire row of the 16-pixel-wide row is spread across four IRAMs, data may be lost when the DMA engine 180 moves multiple pixels from the same row at the same time because the interpolator memory 1464 may not be able to write the data to two locations at the same time. To avoid data loss (and to more closely match the data transfer rate from external memory to the four IRAMs), data may be stored within the four IRAMs in a particular format and order, such as spreading a single row across only two of the IRAMs.

The data format within the IRAMs 160 for two-byte pixels may be similar to that described for one-byte pixels. For example, if pixel rows are spread across one IRAM 160, address 0 could contain pixel columns 0-1, address 1 could contain pixel columns 2-3, address 2 could contain pixel columns 4-5, address 3 could contain pixel columns 6-7, and so forth. Thus, a 16-pixel-wide row could occupy addresses 0-7 and a 32-pixel-wide row could occupy addresses 0-15.

If the pixel rows are spread across two IRAMs 160, address 0 of IRAM A could contain pixel columns 0-1 and address 0 of IRAM B could contain pixel columns 2-3, address 1 of IRAM A could contain pixel columns 4-5 and address 1 of IRAM B could contain pixel columns 6-7, and so forth. Thus, a 16-pixel-wide row could occupy addresses 0-3 of IRAMs A and B and a 32-pixel-wide row could occupy addresses 0-7 of IRAMs A and B.

If the pixel rows are spread across four IRAMs 160, address 0 of IRAM A could contain pixel columns 0-1, address 0 of IRAM B could contain pixel columns 2-3, address 0 of IRAM C could contain pixel columns 4-5, address 0 of IRAM D could contain pixel columns 6-7, address 1 of IRAM A could contain pixel columns 8-9, address 1 of IRAM B could contain pixel columns 10-11, address 1 of IRAM C could contain pixel columns 12-13, address 1 of IRAM D could contain pixel columns 14-15, and so forth. Thus, a 16-pixel-wide row could occupy addresses 0-1 of IRAMs A-D and a 32-pixel-wide row could occupy addresses 0-3 of IRAMs A-D.

Of course, other data formats and orders are possible and more than two-byte pixels may be used. In addition, the data format may be changed on pixel boundaries. According to one embodiment, information identifying the data format, such as tag bits, may be sent along with the pixel data. For example, a tag bit may indicate whether one-byte or two-byte pixels are used, two tag bits may indicate how many IRAMs are used (e.g., one, two or four IRAMs), and another two tag bits may indicate the source of the data (e.g., IRAM A, B, C, or D). The tag bits may be spread across the IRAM address (e.g., half or the tag bits may be stored in even IRAM address while the other half of the tag bits may be stored in odd IRAM addresses). The tag bits may change on pixel boundaries.

Performing Integer Searches

According to one embodiment, performing an integer search using the video compression co-processor 170 involves initiating the integer search, sustaining the search, and delivering search results to the application running on the object array 105. Before initiating the search, the application may wait for an active level on a ready-to-configure-integer-search signal indicating that the video compression co-processor 170 is ready to load a first set (or subsequent set) of integer search configuration data 1440 and a first (or subsequent) integer macroblock.

After the application detects the active level on the ready-to-configure-integer-search signal, the application can transfer the integer macroblock to the integer macroblock memory 1452. Assuming a sixteen-by-sixteen pixel macroblock will be used for the search, 256 pixels will be transferred to the integer macroblock memory 1452. The pixels may be written sequentially to a macroblock-pixel input. The application may also monitor a macroblock-valid signal. An active-high on the macroblock-valid signal indicates that the video compression co-processor 170 has received valid pixel information and allows the video compression co-processor 170 to strobe the pixel data. The macroblock pixel data may start loading the upper-left pixel first. Subsequent pixels arrive in raster-scan order (e.g., transfer the pixels at row 0 from left to right, then transfer pixels at row 1 from left to right, and so forth). Pixels can arrive every clock and no flow-control mechanism is required. Two-byte pixel data may be right justified. One-byte pixels can be transferred in one clock cycle. In addition, two naturally aligned horizontally adjacent one-byte pixels can be transferred every clock cycle with the left pixel occurring on a least significant party line byte.

The integer search configuration data 1440 can be passed to the video compression co-processor 170 using a configuration input. A configuration-valid signal that acknowledges the validity of each parameter may be provided by the application and monitored by the video compression co-processor 170. The configuration data 1440 may include the following parameters (which can be right justified): (1) an initialize filter parameter (e.g., a one-bit active-high may indicate to reset the integer filters, such as the integer filters in the results block 1416); (2) a SAD value scaling enable weight parameter (e.g., a one-bit active-high may indicate to scale SAD values based on the partition size); (3) A (e.g., an eight-bit value); (4) a starting search window row; (5) an ending search window row; (6) a starting search window column; (7) an ending search window column; (8) an absolute value of the estimated motion vector row difference times λ (e.g., the most significant sixteen-bits of an eighteen-bit number); (9) a sign of the estimated row difference (e.g., a one-bit active-low may indicate that the estimated motion vector is located below the starting search window row); (10) an absolute value of the estimated motion vector column difference times λ (e.g., the most significant sixteen-bits of an eighteen-bit number); and (11) a sign of the estimated column difference (a one-bit active-tow may indicate that the estimated motion vector is located to the right of the starting search window column). The starting search window row, ending search window row, starting search window column, and ending search window column may comprise fourteen-bit absolute ¼ pixel addresses, the least significant two bits of which may be ignored.

The first two macroblock columns within the search window can be transferred to the integer search memory 1462 using the party line communication channels or the DMA engine 180 (when using the DMA engine 180 to transfer data, a destination completion bit may be set in each descriptor). The first macroblock column can be written from left to right and then top to bottom before proceeding to the next macroblock column. A RAM-height party line input may be provided to dictate how much data is needed to fill a macroblock column. Once a macroblock column has been transferred, subsequent macroblock columns can be written to the next memory. According to one embodiment, at least two macroblock columns are written even if only one macroblock column will be used.

The integer search may be started by creating a rising edge on a integer-search-start signal. It should be noted that the macroblock data and configuration data may be received in any order. In addition, a search may be started before the two macroblock columns are transferred to the integer macroblock memory 1452. The search can start but may stall gracefully until the second macroblock column is received.

Sustaining the search while the video compression co-processor 170 processes the search window looking for the best motion vector may require additional macroblock columns to be transferred. Before sending additional macroblock columns, the application may wait for an active level on an ready-to-send signal that provides permission to load the next macroblock column within the search window. After detecting the ready-to-send signal, the application can copy the next macroblock column to the video compression co-processor 170 (e.g., via the party line communication channels or the DMA engine 180). If the macroblock column data is not provided in time, the video compression co-processor 170 stalls and automatically restarts when the macroblock column data becomes available. According to one embodiment, to prevent a stall, the application must transfer the next macroblock column data before four times the search window height (in SAD clock cycles). The process of waiting for an active level on the ready-to-send signal and sending the next macroblock column can be repeated until the search is completed. The video compression co-processor 170 may indicate that the search is complete by asserting an integer-search-done signal.

After the video compression co-processor 170 activates the integer-search-done signal, the application may request that the results of the search be returned. The application may apply a rising edge to a read-integer-search-results input to initiate a state machine which returns the SAD value and locations associated with the 41 sets of information including SAD values (e.g., sixteen bits) and X-offset values and Y-offset values (e.g., twelve bits). One party line communication channel may be provided to return the SAD values, X-offset values, and Y-offset values. After activating the read-integer-search-results input, the entire set of search results registers can be transferred into a shadow register to allow a subsequent search to begin and additional results to be stored while the results from the current search are shifted to the application. If concatenating search results, a read may not be initiated.

The results for each subpartition may be returned in a particular order (e.g., the sixteen-by-sixteen partition, the sixteen-by-eight subpartitions, the eight-by-sixteen subpartitions, the eight-by-eight subpartitions, the four-by-four subpartitions, the four-by-eight subpartitions, and the eight-by-four subpartitions). The data can return on the three party line communication channels simultaneously and each party line communication channel can return a valid pulse on a integer-data-valid signal during the transfer. Once started, data can return every clock cycle. However, clock cycle delays may be provided to pace the delivery of the search results. When pacing the returning data, the old results data remains stable until new data accompanied with a valid pulse overwrites it. The video compression co-processor 170 may be configured (at the time of initialization) to not return results for unsupported partition sizes.

Performing Subpixel Operations

The application may configure a subpixel operation anytime that a ready-to-configure-subpixel signal is active. Configuring a subpixel operation involves transferring configuration data 1440, integer pixel data, and a subpixel macroblock (if a search is to be performed). After the necessary data has been transferred, the application may wait to start a subpixel operation until an active level is detected on a ready-to-start-subpixel-operation signal. When the ready-to-start-subpixel-operation signal is active, the application can pulse a start-subpixel-operation signal for at least one clock to start the operation. The start-subpixel-operation signal may be transitioned as early as the clock cycle after the last data was written assuming that ready-to-start-subpixel-operation signal is also active. The ready-to-configure-subpixel signal can deactivate shortly after resources needed to perform the subpixel operations are unavailable (e.g., the interpolator memory 1464 is full and the subpixel interpolator 1420 is processing subpixels) and can activate after sufficient resources become available.

After the subpixels have been interpolated, (1) the interpolate and shift subpixel operation can return results in raster scan order (e.g., a last-shifted-subpixel signal can occur coincident with the last of the M×N results) and (2) the interpolate and search operation activates a subpixel-data-valid signal to indicate that search results are available.

The interpolate and shift subpixel operation can be configured after an active level on the ready-to-configure-subpixel signal provides permission to load the next subpixel operation. Various configuration data 1440 may be passed to the subpixel interpolator 1420 using a subpixel-shift-configuration input. Each parameter can be strobed using a valid input signal. The configuration data 1440 can include (1) a four-bit partition size (e.g., 16×16, 16×8, 8×16, 8×8, 8×4, 4×8, 4×4, 4×2, 2×4, and 2×2), (2) a two-bit subpixel resolution value (e.g., quarter pixel, eight pixel, or half pixel), (3), a four-bit horizontal shift value (e.g., shift right or left 1, 3, 5, or 7 one-eighth subpixels, shift right or left ¼, ½, or ¾ subpixels, or no shift) (4) a four-bit vertical shift value (e.g., shift up or down 1, 3, 5, or 7 one-eighth subpixels, shift up or down ¼, ½, or ¾ subpixels, or no shift), (5) a five-bit alignment value (e.g., the number of integer pixels to ignore at the beginning of each integer pixel row), (6) a two-bit indication of the number of pixels to be transferred per row (e.g., 16 pixels, 32 pixels, or 64 pixels), (7) a two-bit indication of the number of IRAMs containing integer pixels (e.g., one, two, or four IRAMs), and (8) a three-bit indication of the number of bits per pixel (e.g., 8-12 bits per pixel).

Before, at the same time, or after the subpixel configuration data is transferred, the appropriate integer pixels may be transferred to the interpolator memory 1464. This can be done by initiating one, two, or four DMA transactions to the video compression co-processor 170 (or one or more of the party line communication channels). A combination of destination address and tag bits can provide the necessary decode information.

After both the subpixel configuration data and the appropriate integer pixels have been transferred, the subpixel interpolation and shift can be commenced by creating a rising edge on the start-subpixel-operation signal.

The video compression co-processor 170 can return the shifted pixel results as they become available. The number of pixels returned depends on the partition size (e.g., a 2×2 partition will return four pixels while a 16×16 partition will return 256 pixels). The first two shifted pixels returned may be row 0, column 0 and row 0, column 1. After the first two shifted pixels are returned, the pixels can be returned depending on the shape of the partition. Within a rectangular M×N shape, pixels can be returned in raster scan order (e.g., from left to right on each row, starting on the top row and descending down until the bottom row of the selected shape). In addition, pixels can be returned in macroblock subpartition order. A hold-state signal may be activated to stall returning shift results. A last-shifted-subpixel signal can activate when the last pixel has been returned from a shifted M×N array. One pixel can be returned per clock cycle when operating when using two-byte pixels, and two pixels can be returned per clock cycle when using one-byte pixels.

The interpolate and search subpixel configuration can be initiated after an active level on the ready-to-configure-subpixel signal provides permission to load the next subpixel operation. Various configuration data 1440 may be passed to the subpixel interpolator 1420 using a subpixel-search-configuration input. Each parameter can be strobed using a valid input signal. The configuration data 1440 can include (1) an initialize filter parameter (e.g., a one-bit active-high may indicate to reset the subpixel filters, such as the subpixel filters in the results block 1416), (2) a SAD value scaling enable weight parameter (e.g., a one-bit active-high may indicate to scale SAD values based on the partition size), (3) $\lambda$ (e.g., an eight-bit value), (4) a starting search window row (e.g., a fourteen-bit absolute ¼ pixel address), (5) an ending search window row (e.g., a fourteen-bit absolute ¼ pixel address), (6) a starting search window column (e.g., a fourteen-bit absolute ¼ pixel address), (7) an ending search window column (e.g., a fourteen-bit absolute ¼ pixel address), (8) an absolute value of the estimated motion vector row difference times $\lambda$ (e.g., the most significant sixteen-bits of an eighteen-bit number), (9) a sign of the estimated row difference (e.g., a one-bit active-low may indicate that the estimated motion vector is located below the starting search window row), (10) an absolute value of the estimated motion vector column difference times $\lambda$ (e.g., the most significant sixteen-bits of an eighteen-bit number), (11) a sign of the estimated column difference (a one-bit active-low may indicate that the estimated motion vector is located to the right of the starting search window column), (12) a four-bit partition size (e.g., 18×16, 16×8, 8×16, 8×8, 8×4, 4×8, and 4×4), (13) a two-bit subpixel resolution value (e.g., quarter pixel, eight pixel, or half pixel), (14) a five-bit alignment value (e.g., the number of integer pixels to ignore at the beginning of each integer pixel row), (15) a two-bit indication of the number of pixels to be transferred per row (e.g., 16 pixels, 32 pixels, or 64 pixels), (16) a two-bit indication of the number of IRAMs containing integer pixels (e.g., one, two, or four IRAMs), and (17) a three-bit indication of the number of bits per pixel (e.g., 8-12 bits per pixel).

Before, at the same time, or after the subpixel configuration data 1440 is transferred, the appropriate integer pixels from the search window can be transferred to the interpolator memory 1464 (e.g., using one, two, or four DMA transactions one or more IRAMs or using the party line communication channels). If using the DMA engine 180 to transfer the data, a destination completion bit may be set in each descriptor.

Before, at the same time, or after the subpixel configuration data 1440 and the integer pixels have been transferred, the appropriate pixels (e.g., up to 256 pixels for a 16-by-16 array) from the subpixel macroblock are transferred to the subpixel macroblock memory 1454 by writing each of the subpixel macroblock pixels sequentially to a subpixel-macroblock-pixel input. A subpixel-macroblock-valid input may be provided to indicate whether valid macroblock pixel has been received. The upper-left pixel can be written first and subsequent pixels can be written in raster-scan order. Pixels can be accepted up to every clock cycle and no flow control mechanism is required. However, the partition size input should specify the appropriate size before starting the write, and the upper-left pixel of the partition should be located in row 0, column 0. Pixels outside of the partition may not be written (e.g., only pixels within a 4-by-4 partition or other partition size are written).

A subpixel search may be commenced by creating a rising edge on a start-subpixel-search signal.

The video compression co-processor 170 can activate a subpixel-data-valid signal once the entire subpixel search window has been searched. Then the subpixel SAD value (e.g., sixteen bit value) can be returned on a subpixel SAD value party line communication channel and the absolute X location and Y locations (e.g., fourteen bit values) can be returned on X location and Y location party line communication channels.

The methods and systems for performing video data compression may be implemented in and/or by any suitable hardware, software, firmware, or combination thereof. Accordingly, as used herein, a component or module may comprise hardware, software, and/or firmware (e.g., self-contained hardware or software components that interact with a larger system). Embodiments may include various steps, which may be embodied in machine-executable instructions to be executed by an FPOA or other processor. Alternatively, the steps may be performed by hardware components that include specific logic for performing the steps or by a combination of hardware, software, and/or firmware. A result or output from any step, such as a confirmation that the step has or has not been completed or an output value from the step, may be stored, displayed, printed, and/or transmitted over a wired or wireless network. For example, the search results may be stored, displayed, or transmitted over a network.

Embodiments may also be provided as a computer program product embodied on a machine-readable storage medium having stored thereon instructions (in compressed or uncompressed form) that may be used to program a computer (or other electronic device) to perform processes or methods described herein. The machine-readable storage medium may include, but is not limited to, hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of media/machine-readable medium suitable for storing electronic instructions. Further, embodiments may also be provided as a computer program product embodied on a machine-readable signal (in compressed or uncompressed form). Examples of machine-readable signals, whether modulated using a carrier or not, include, but are not limited to, signals that a computer system or machine hosting or running a computer program can be configured to access, including signals downloaded through the Internet or other networks. For example, distribution of software may be via CD-ROM or via Internet download.

Although various embodiments described herein have been discussed with reference to a field programmable object array (FPOA), the systems and methods disclosed herein are equally applicable to other programmable circuitry, such as field programmable gate arrays (FPGA).

The terms and descriptions used herein are set forth by way of illustration only and are not meant as limitations. Those skilled in the art will recognize that many variations can be made to the details of the above-described embodiments without departing from the underlying principles of the invention. The scope of the invention should therefore be determined only by the following claims (and their equivalents).

What is claimed is:

1. A device, comprising:
a direct memory access engine configured to route first search window pixel data from a memory to a video compression processor via a first bus of two multi-bit periphery buses supporting data flow in a first direction and a second bus of the two multi-bit periphery buses supporting data flow in a second direction; and
party line communication circuitry configured to route second search window pixel data from the memory to the video compression processor via multiple channels of an array of programmable objects at a higher transfer rate relative to the direct memory access engine, wherein the party line communication circuitry is further configured to transfer at least a portion of the search widow pixel data via the multiple channels during a single clock cycle.

2. The device of claim 1, wherein the direct memory access engine is configured to route the first search window pixel data via the first bus in response to initiation of a subpixel interpolation operation of an application process executed by the array of programmable objects.

3. The device of claim 1, wherein the party line communication circuitry is configured to route the second search window pixel data via the multiple channels of the array of programmable objects at the higher transfer rate relative to the direct memory access engine in response to initiation of an integer search operation of an application process executed by the array of programmable objects.

4. The device of claim 1, wherein the video compression processor comprises a search engine configured to search window pixels within a defined portion of a video frame, and the first search window pixel data and the second search window pixel data correspond to the search window pixels.

5. The device of claim 4, wherein
the video compression processor comprises a subpixel engine configured to interpolate subpixels from integer pixels, and is configured to shift the integer pixels by a predetermined number of subpixels; and
the search engine is further configured to select at least some of the search window pixels from the integer pixels or the subpixels and to select baseline pixels from integer baseline pixels or subpixel baseline pixels.

6. The device of claim 5, wherein the subpixels comprise at least two of half-sampled subpixels, quarter-sampled subpixels, or one-eighth sampled subpixels.

7. The device of claim 5, wherein the search engine is configured to determine a sum of absolute differences between corresponding pairs of the baseline pixels and the search window pixels, to determine distances between the search window pixels and a reference point, and to determine a coordinate location of the sum of absolute differences.

8. The device of claim 7, wherein the search engine is further configured to send, to the array of programmable objects, information specifying the sum of absolute differences, the distances, and the coordinate location.

9. The device of claim 4, wherein the video compression processor comprises a group of search engines, comprising the search engine, that are configured to perform subpixel searching with respective different pixel strides.

10. The device of claim 1, wherein at least one of the first search window pixel data or the second search window pixel data represents pixel information from search window pixels being searched within a defined portion of a video frame,
the video compression processor comprises at least two logical memories, and
the video compression processor is configured to store the at least one of the first search window pixel data or the second search window pixel data in the at least two logical memories, to determine a sum of absolute differences between corresponding pairs of baseline pixels and the search window pixels based on the at least one of the first search window pixel data or the second search window pixel data stored in one of the at least two logical memories, and to store additional search window pixel data other than the first search window pixel data and the second search window pixel data in at least one other logical memory of the at least two logical memories.

11. The device of claim 1, wherein the party line communication circuitry comprises a bus interface to a unidirectional segmented bus.

12. A circuit, comprising:
a memory communicatively coupled to an array of programmable objects via party line communication circuitry; and
a video compression processor is configured to:
collect search window pixel data from the memory via the party line communication circuitry and at least one of the programmable objects in response to initiation of a first type operation of an application process; and
collect the search window pixel data from the memory via a data transfer engine in response to initiation of a second type of operation of the application process;
wherein at least a portion of the search window pixel data is configured to be transferred via multiple channels of the party line communication circuitry during a given clock cycle, and
wherein the data transfer engine is configured to transfer the search window pixel data at a lower transfer rate than the party line communication circuitry via two multi-bit periphery buses that bypass the array of programmable objects and respectively facilitate two different data flow directions.

13. The circuit of claim 12, wherein the first type of operation is an integer search operation of the application process.

14. The circuit of claim 12, wherein the second type of operation is a subpixel interpolation operation of the application process.

15. The circuit of claim 12, wherein the party line communication circuitry comprises a bus interface to a unidirectional segmented bus.

16. The circuit of claim 12, wherein the video compression processor is further configured to identify search window pixels from the search window pixel data based, at least in part, on a determined degree of similarity between the search window pixels and baseline pixels as a function of a comparison of pixel values of the search window pixels and corresponding pixel values of the baseline pixels.

17. The circuit of claim 12, wherein the video compression processor is further configured to identify search window pixels from the search window pixel data based on a minimization of a distance between the search window pixels and a reference position.

18. A method, comprising:
in response to determining that an application process is performing a first type of operation, transferring, by a system comprising a processor, search window pixel data, from a memory of an array of programmable objects to a video compression processor via multiple channels, per clock cycle, of a party line circuit that connects the memory to the video compression processor via the array of programmable objects; and
in response to determining that the application process is performing a second type of operation, transferring the search window pixel data from the array of programmable objects to the video compression processor via two multi-bit periphery buses associated with a direct memory access engine without routing the search window pixel data via the array of programmable objects, wherein the two multi-bit periphery buses support clockwise data flow around the array of programmable objects and counterclockwise data flow around the array of programmable objects, respectively.

19. The method of claim 18, wherein the first type of operation is an integer search operation, and the second type of operation is a subpixel interpolation operation.

20. The method of claim 18, wherein the search window pixel data represents pixel data of pixels being searched within a defined portion of a video frame.

* * * * *